US 9,459,312 B2

(12) United States Patent
Arena et al.

(10) Patent No.: US 9,459,312 B2
(45) Date of Patent: Oct. 4, 2016

(54) ELECTRONIC ASSEMBLY TEST SYSTEM

(71) Applicant: Teradyne, Inc., North Reading, MA (US)

(72) Inventors: John Joseph Arena, Reading, MA (US); Anthony J. Suto, Sterling, MA (US)

(73) Assignee: Teradyne, Inc., North Reading, MA (US)

( * ) Notice: Subject to any disclaimer, the term of this patent is extended or adjusted under 35 U.S.C. 154(b) by 359 days.

(21) Appl. No.: 13/860,423

(22) Filed: Apr. 10, 2013

(65) Prior Publication Data

US 2014/0306728 A1    Oct. 16, 2014

(51) Int. Cl.
*G01R 31/28* (2006.01)
*G01R 1/18* (2006.01)

(52) U.S. Cl.
CPC ............ *G01R 31/2808* (2013.01); *G01R 1/18* (2013.01)

(58) Field of Classification Search
None
See application file for complete search history.

(56) References Cited

U.S. PATENT DOCUMENTS

| | | |
|---|---|---|
| 557,186 A | 3/1896 | Cahill |
| 2,224,407 A | 12/1940 | Passur |
| 2,380,026 A | 7/1945 | Clarke |
| 2,631,775 A | 3/1953 | Gordon |
| 2,635,524 A | 4/1953 | Jenkins |
| 3,120,166 A | 2/1964 | Lyman .............................. 98/39 |
| 3,360,032 A | 12/1967 | Sherwood |
| 3,364,838 A | 1/1968 | Bradley |
| 3,517,601 A | 6/1970 | Courchesne |
| 3,845,286 A | 10/1974 | Aronstein et al. |
| 4,147,299 A | 4/1979 | Freeman |
| 4,233,644 A | 11/1980 | Hwang et al. ................. 361/384 |
| 4,336,748 A | 6/1982 | Martin et al. ...................... 98/33 |
| 4,379,259 A | 4/1983 | Varadi et al. .................... 324/73 |
| 4,477,127 A | 10/1984 | Kume ................................. 312/8 |
| 4,495,545 A | 1/1985 | Dufresne et al. ............. 361/384 |
| 4,526,318 A | 7/1985 | Fleming et al. ................ 236/49 |
| 4,554,505 A * | 11/1985 | Zachry ................. G01R 1/0433 324/750.25 |
| 4,620,248 A | 10/1986 | Gitzendanner .................. 360/97 |
| 4,648,007 A | 3/1987 | Garner .......................... 361/384 |
| 4,654,727 A | 3/1987 | Blum et al. |
| 4,654,732 A | 3/1987 | Mesher |
| 4,665,455 A | 5/1987 | Mesher |

(Continued)

FOREIGN PATENT DOCUMENTS

| | | |
|---|---|---|
| AU | 583716 | 5/1989 |
| CN | 1177187 | 3/1998 |

(Continued)

OTHER PUBLICATIONS

U.S. Appl. No. 13/633,741, filed Oct. 2, 2012.

(Continued)

*Primary Examiner* — Jermele M Hollington
*Assistant Examiner* — Suresh K Rajaputra
(74) *Attorney, Agent, or Firm* — Choate, Hall & Stewart LLP

(57) ABSTRACT

An example system for testing electronic assemblies (EAs) may include carriers for holding EAs and slots for testing at least some of the EAs in parallel. Each slot may be configured to receive a corresponding carrier containing an EA and to test the EA. An example carrier in the system may include a first part and a second part. At least one of the first part and the second part include a first structure, and the first structure is movable to enable electrical connection between an EA and an electrical connector.

21 Claims, 32 Drawing Sheets

(56) References Cited

U.S. PATENT DOCUMENTS

| | | | |
|---|---|---|---|
| 4,683,424 A | 7/1987 | Cutright et al. | |
| 4,685,303 A | 8/1987 | Branc et al. | 62/3 |
| 4,688,124 A | 8/1987 | Scribner et al. | |
| 4,713,714 A | 12/1987 | Gatti et al. | 360/137 |
| 4,739,444 A | 4/1988 | Zushi et al. | 361/383 |
| 4,754,397 A | 6/1988 | Varaiya et al. | 364/200 |
| 4,758,176 A * | 7/1988 | Abe | H05K 7/1023 439/331 |
| 4,768,285 A | 9/1988 | Woodman, Jr. | |
| 4,778,063 A | 10/1988 | Ueberreiter | |
| 4,801,234 A | 1/1989 | Cedrone | |
| 4,809,881 A | 3/1989 | Becker | |
| 4,817,273 A | 4/1989 | Lape et al. | |
| 4,817,934 A | 4/1989 | McCormick et al. | |
| 4,851,965 A | 7/1989 | Gabuzda et al. | 361/383 |
| 4,881,591 A | 11/1989 | Rignall | 165/26 |
| 4,888,549 A | 12/1989 | Wilson et al. | 324/73 R |
| 4,911,281 A | 3/1990 | Jenkner | |
| 4,967,155 A | 10/1990 | Magnuson | 324/212 |
| 4,969,828 A * | 11/1990 | Bright | G01R 1/0475 439/248 |
| 5,012,187 A | 4/1991 | Littlebury | 324/158 |
| 5,045,960 A | 9/1991 | Eding | |
| 5,061,630 A | 10/1991 | Knopf et al. | 435/290 |
| 5,119,270 A | 6/1992 | Bolton et al. | 361/384 |
| 5,122,914 A | 6/1992 | Hanson | 360/98.01 |
| 5,127,684 A | 7/1992 | Klotz et al. | 292/113 |
| 5,128,813 A | 7/1992 | Lee | |
| 5,136,395 A | 8/1992 | Ishii et al. | |
| 5,143,193 A | 9/1992 | Geraci | |
| 5,158,132 A | 10/1992 | Guillemot | 165/30 |
| 5,168,424 A | 12/1992 | Bolton et al. | 361/384 |
| 5,171,183 A | 12/1992 | Pollard et al. | 454/184 |
| 5,173,819 A | 12/1992 | Takahashi et al. | 360/97.03 |
| 5,176,202 A | 1/1993 | Richard | 165/48.1 |
| 5,205,132 A | 4/1993 | Fu | |
| 5,205,742 A * | 4/1993 | Goff | G01R 1/0483 439/331 |
| 5,206,772 A | 4/1993 | Hirano et al. | |
| 5,207,613 A | 5/1993 | Ferchau et al. | 454/184 |
| 5,210,680 A | 5/1993 | Scheibler | 361/384 |
| 5,237,484 A | 8/1993 | Ferchau et al. | 361/689 |
| 5,263,537 A | 11/1993 | Plucinski et al. | 165/97 |
| 5,268,637 A | 12/1993 | Liken et al. | |
| 5,269,698 A | 12/1993 | Singer | 439/157 |
| 5,290,193 A * | 3/1994 | Goff | G01R 1/0483 439/331 |
| 5,295,392 A | 3/1994 | Hensel et al. | |
| 5,309,323 A | 5/1994 | Gray et al. | 361/726 |
| 5,325,263 A | 6/1994 | Singer et al. | 361/683 |
| 5,343,403 A | 8/1994 | Beidle et al. | |
| 5,349,486 A | 9/1994 | Sugimoto et al. | 360/97.01 |
| 5,367,253 A * | 11/1994 | Wood | G01R 1/0466 257/E21.509 |
| 5,368,072 A | 11/1994 | Cote | 137/872 |
| 5,374,395 A | 12/1994 | Robinson et al. | |
| 5,379,229 A | 1/1995 | Parsons et al. | |
| 5,398,058 A | 3/1995 | Hattori | |
| 5,412,534 A | 5/1995 | Cutts et al. | 361/695 |
| 5,414,591 A | 5/1995 | Kimura et al. | 361/695 |
| 5,426,581 A | 6/1995 | Kishi et al. | 364/167.01 |
| 5,469,037 A | 11/1995 | McMurtrey, Sr. et al. | 318/626 |
| 5,477,416 A | 12/1995 | Schkrohowsky et al. | 361/695 |
| 5,484,012 A | 1/1996 | Hiratsuka | 165/40 |
| 5,486,681 A | 1/1996 | Dagnac et al. | |
| 5,491,610 A | 2/1996 | Mok et al. | 361/685 |
| 5,543,727 A | 8/1996 | Bushard et al. | |
| 5,546,250 A | 8/1996 | Diel | 360/97.02 |
| 5,557,186 A | 9/1996 | McMurtrey, Sr. et al. | 318/626 |
| 5,563,768 A | 10/1996 | Perdue | 361/695 |
| 5,570,740 A | 11/1996 | Flores et al. | |
| 5,586,891 A * | 12/1996 | Kelly | G01R 1/045 439/70 |
| 5,593,380 A | 1/1997 | Bittikofer | |
| 5,596,229 A * | 1/1997 | Simon | G01R 1/0433 257/727 |
| 5,601,141 A | 2/1997 | Gordon et al. | 165/263 |
| 5,604,662 A | 2/1997 | Anderson et al. | 361/685 |
| 5,610,893 A | 3/1997 | Soga et al. | 369/84 |
| 5,617,430 A | 4/1997 | Angelotti et al. | |
| 5,644,705 A | 7/1997 | Stanley | 395/183.18 |
| 5,646,918 A | 7/1997 | Dimitri et al. | |
| 5,654,846 A | 8/1997 | Wicks et al. | 360/97.01 |
| 5,673,029 A | 9/1997 | Behl et al. | 340/635 |
| 5,694,290 A | 12/1997 | Chang | 361/685 |
| 5,703,843 A | 12/1997 | Katsuyama et al. | |
| 5,718,627 A | 2/1998 | Wicks | 454/68 |
| 5,718,628 A | 2/1998 | Nakazato et al. | 454/184 |
| 5,731,928 A | 3/1998 | Jabbari et al. | |
| 5,751,549 A | 5/1998 | Eberhardt et al. | 361/687 |
| 5,754,365 A | 5/1998 | Beck et al. | |
| 5,761,032 A | 6/1998 | Jones | 361/685 |
| 5,793,610 A | 8/1998 | Schmitt et al. | 361/695 |
| 5,807,104 A * | 9/1998 | Ikeya | G01R 1/0483 324/756.02 |
| 5,811,678 A | 9/1998 | Hirano | 73/461 |
| 5,812,761 A | 9/1998 | Seki et al. | 395/185.07 |
| 5,819,842 A | 10/1998 | Potter et al. | 165/206 |
| 5,831,525 A | 11/1998 | Harvey | 340/507 |
| 5,844,418 A * | 12/1998 | Wood | B25G 3/28 257/E21.509 |
| 5,851,143 A | 12/1998 | Hamid | 454/57 |
| 5,859,409 A | 1/1999 | Kim et al. | 219/400 |
| 5,859,540 A | 1/1999 | Fukumoto | 324/760 |
| 5,862,037 A | 1/1999 | Behl | 361/687 |
| 5,870,630 A | 2/1999 | Reasoner et al. | 395/894 |
| 5,886,639 A | 3/1999 | Behl et al. | 340/635 |
| 5,890,959 A | 4/1999 | Pettit et al. | 454/184 |
| 5,892,367 A | 4/1999 | Magee et al. | |
| 5,912,799 A | 6/1999 | Grouell et al. | 361/685 |
| 5,913,926 A | 6/1999 | Anderson et al. | 714/6 |
| 5,914,856 A | 6/1999 | Morton et al. | 361/690 |
| 5,927,386 A | 7/1999 | Lin | 165/80.3 |
| 5,956,301 A | 9/1999 | Dimitri et al. | |
| 5,959,834 A | 9/1999 | Chang | 361/685 |
| 5,999,356 A | 12/1999 | Dimitri et al. | 360/71 |
| 5,999,365 A | 12/1999 | Hasegawa et al. | 360/97.02 |
| 6,000,623 A | 12/1999 | Blatti et al. | 236/49.3 |
| 6,005,404 A | 12/1999 | Cochran et al. | 324/760 |
| 6,005,770 A | 12/1999 | Schmitt | 361/695 |
| 6,008,636 A | 12/1999 | Miller et al. | |
| 6,008,984 A | 12/1999 | Cunningham et al. | 361/685 |
| 6,011,689 A | 1/2000 | Wrycraft | 361/695 |
| 6,031,717 A | 2/2000 | Baddour et al. | 361/687 |
| 6,034,870 A | 3/2000 | Osborn et al. | 361/690 |
| 6,042,348 A | 3/2000 | Aakalu et al. | 417/423.5 |
| 6,045,113 A | 4/2000 | Itakura | |
| 6,055,814 A | 5/2000 | Song | |
| 6,066,822 A | 5/2000 | Nemoto et al. | |
| 6,067,225 A | 5/2000 | Reznikov et al. | 361/685 |
| 6,069,792 A | 5/2000 | Nelik | 361/687 |
| 6,084,768 A | 7/2000 | Bolognia | 361/685 |
| 6,094,342 A | 7/2000 | Dague et al. | 361/685 |
| 6,104,607 A | 8/2000 | Behl | 361/687 |
| 6,107,813 A | 8/2000 | Sinshelmer et al. | |
| 6,115,250 A | 9/2000 | Schmitt | 361/695 |
| 6,122,131 A | 9/2000 | Jeppson | |
| 6,122,232 A | 9/2000 | Schell et al. | |
| 6,124,707 A | 9/2000 | Kim et al. | 324/158.1 |
| 6,129,428 A | 10/2000 | Helwig et al. | |
| 6,130,817 A | 10/2000 | Flotho et al. | 361/685 |
| 6,144,553 A | 11/2000 | Hileman et al. | 361/687 |
| 6,161,205 A * | 12/2000 | Tuttle | G01R 31/01 714/30 |
| 6,166,901 A | 12/2000 | Gamble et al. | 361/685 |
| 6,169,413 B1 | 1/2001 | Pack et al. | 324/760 |
| 6,169,930 B1 | 1/2001 | Blachek et al. | |
| 6,177,805 B1 | 1/2001 | Pih | 324/754 |
| 6,178,835 B1 | 1/2001 | Orriss et al. | 73/865.9 |
| 6,181,557 B1 | 1/2001 | Gatti | 361/695 |
| 6,185,065 B1 | 2/2001 | Hasegawa et al. | 360/97.02 |
| 6,185,097 B1 | 2/2001 | Behl | 361/695 |

(56) References Cited

U.S. PATENT DOCUMENTS

| | | | |
|---|---|---|---|
| 6,188,191 B1 | 2/2001 | Frees et al. | |
| 6,192,282 B1 | 2/2001 | Smith et al. | |
| 6,193,339 B1 | 2/2001 | Behl et al. | 312/223.2 |
| 6,209,842 B1 | 4/2001 | Anderson et al. | 248/560 |
| 6,227,516 B1 | 5/2001 | Webster, Jr. et al. | 248/694 |
| 6,229,275 B1 | 5/2001 | Yamamoto | |
| 6,231,145 B1 | 5/2001 | Liu | 312/332.1 |
| 6,233,148 B1 | 5/2001 | Shen | |
| 6,236,563 B1 | 5/2001 | Buican et al. | 361/685 |
| 6,247,944 B1 | 6/2001 | Bolognia et al. | 439/157 |
| 6,249,824 B1 | 6/2001 | Henrichs | |
| 6,252,769 B1 | 6/2001 | Tullstedt et al. | 361/694 |
| 6,258,609 B1 * | 7/2001 | Farnworth | H01L 22/22 257/E21.526 |
| 6,262,863 B1 | 7/2001 | Ostwald et al. | |
| 6,272,007 B1 | 8/2001 | Kitlas et al. | |
| 6,272,767 B1 | 8/2001 | Botruff et al. | |
| 6,281,677 B1 | 8/2001 | Cosci et al. | 324/212 |
| 6,282,501 B1 | 8/2001 | Assouad | 702/117 |
| 6,285,524 B1 | 9/2001 | Boigenzahn et al. | |
| 6,289,678 B1 | 9/2001 | Pandolfi | 62/3.2 |
| 6,297,950 B1 | 10/2001 | Erwin | 361/685 |
| 6,298,672 B1 | 10/2001 | Valicoff, Jr. | |
| 6,302,714 B1 | 10/2001 | Bolognia et al. | 439/157 |
| 6,304,839 B1 | 10/2001 | Ho et al. | 703/18 |
| 6,307,386 B1 | 10/2001 | Fowler et al. | |
| 6,327,150 B1 | 12/2001 | Levy et al. | 361/724 |
| 6,330,154 B1 | 12/2001 | Fryers et al. | 361/695 |
| 6,351,379 B1 | 2/2002 | Cheng | 361/685 |
| 6,354,792 B1 | 3/2002 | Kobayashi et al. | |
| 6,356,409 B1 | 3/2002 | Price et al. | 360/98.07 |
| 6,356,415 B1 | 3/2002 | Kabasawa | 360/256.3 |
| 6,383,825 B1 * | 5/2002 | Farnworth | H01L 22/22 257/E21.526 |
| 6,384,995 B1 | 5/2002 | Smith | 360/31 |
| 6,388,437 B1 | 5/2002 | Wolski et al. | |
| 6,388,875 B1 | 5/2002 | Chen | 361/685 |
| 6,388,878 B1 | 5/2002 | Chang | 361/687 |
| 6,389,225 B1 | 5/2002 | Malinoski et al. | 392/479 |
| 6,396,290 B1 * | 5/2002 | Kimura | G01R 1/0735 324/756.02 |
| 6,411,584 B2 | 6/2002 | Davis et al. | |
| 6,421,236 B1 | 7/2002 | Montoya et al. | 361/685 |
| 6,434,000 B1 | 8/2002 | Pandolfi | 361/685 |
| 6,434,498 B1 | 8/2002 | Ulrich et al. | 702/115 |
| 6,434,499 B1 | 8/2002 | Ulrich et al. | 702/115 |
| 6,464,080 B1 | 10/2002 | Morris et al. | 306/591 |
| 6,467,153 B2 | 10/2002 | Butts et al. | 29/603.03 |
| 6,473,297 B1 | 10/2002 | Behl et al. | 361/685 |
| 6,473,301 B1 | 10/2002 | Levy et al. | 361/685 |
| 6,476,627 B1 | 11/2002 | Pelissier et al. | 324/760 |
| 6,477,044 B2 | 11/2002 | Foley et al. | |
| 6,477,442 B1 | 11/2002 | Valerino, Sr. | |
| 6,480,380 B1 | 11/2002 | French et al. | 361/690 |
| 6,480,382 B2 | 11/2002 | Cheng | 361/695 |
| 6,487,071 B1 | 11/2002 | Tata et al. | 361/685 |
| 6,489,793 B2 | 12/2002 | Jones et al. | 324/760 |
| 6,494,663 B2 | 12/2002 | Ostwald et al. | |
| 6,525,933 B2 | 2/2003 | Eland | 361/686 |
| 6,526,841 B1 | 3/2003 | Wanek et al. | 73/865.6 |
| 6,535,384 B2 | 3/2003 | Huang | 361/695 |
| 6,537,013 B2 | 3/2003 | Emberty et al. | |
| 6,544,309 B1 | 4/2003 | Hoefer et al. | 55/283 |
| 6,546,445 B1 | 4/2003 | Hayes | 710/305 |
| 6,553,532 B1 | 4/2003 | Aoki | |
| 6,560,107 B1 | 5/2003 | Beck et al. | |
| 6,565,163 B2 | 5/2003 | Behl et al. | 312/223.1 |
| 6,566,859 B2 | 5/2003 | Wolski et al. | 324/158.1 |
| 6,567,266 B2 | 5/2003 | Ives et al. | |
| 6,568,770 B2 | 5/2003 | Gonska et al. | |
| 6,570,734 B2 | 5/2003 | Ostwald et al. | |
| 6,577,586 B1 | 6/2003 | Yang et al. | |
| 6,577,687 B2 | 6/2003 | Hall et al. | |
| 6,618,254 B2 | 9/2003 | Ives | |
| 6,626,846 B2 | 9/2003 | Spencer | |
| 6,628,518 B2 | 9/2003 | Behl et al. | 361/687 |
| 6,635,115 B1 | 10/2003 | Fairbairn et al. | |
| 6,640,235 B1 | 10/2003 | Anderson | 708/100 |
| 6,644,982 B1 | 11/2003 | Ondricek et al. | |
| 6,651,192 B1 | 11/2003 | Viglione et al. | 714/47 |
| 6,654,240 B1 | 11/2003 | Tseng et al. | 361/685 |
| 6,679,128 B2 | 1/2004 | Wanek et al. | 73/865.6 |
| 6,693,757 B2 | 2/2004 | Hayakawa et al. | 360/69 |
| 6,736,583 B2 | 5/2004 | Ostwald et al. | |
| 6,741,529 B1 | 5/2004 | Getreuer | |
| 6,746,648 B1 | 6/2004 | Mattila et al. | |
| 6,751,093 B1 | 6/2004 | Hsu et al. | 361/685 |
| 6,791,785 B1 | 9/2004 | Messenger et al. | |
| 6,791,799 B2 | 9/2004 | Fletcher | 360/255 |
| 6,798,651 B2 | 9/2004 | Syring et al. | 361/685 |
| 6,798,972 B1 | 9/2004 | Ito et al. | |
| 6,801,834 B1 | 10/2004 | Konshak et al. | |
| 6,806,700 B2 | 10/2004 | Wanek et al. | 324/158.1 |
| 6,808,353 B2 | 10/2004 | Ostwald | |
| 6,811,427 B2 | 11/2004 | Garrett et al. | 439/378 |
| 6,826,046 B1 | 11/2004 | Muncaster et al. | 361/687 |
| 6,830,372 B2 | 12/2004 | Liu et al. | 374/57 |
| 6,832,929 B2 | 12/2004 | Garrett et al. | 439/378 |
| 6,861,861 B2 | 3/2005 | Song et al. | |
| 6,862,173 B1 | 3/2005 | Konshak et al. | |
| 6,867,939 B2 | 3/2005 | Katahara et al. | 360/53 |
| 6,892,328 B2 | 5/2005 | Klein et al. | 714/42 |
| 6,904,479 B2 | 6/2005 | Hall et al. | |
| 6,908,330 B2 | 6/2005 | Garrett et al. | 439/378 |
| 6,914,424 B2 * | 7/2005 | Chi | G01R 31/2868 324/73.1 |
| 6,928,336 B2 | 8/2005 | Peshkin et al. | |
| 6,937,432 B2 | 8/2005 | Sri-Jayantha et al. | 360/97.01 |
| 6,957,291 B2 | 10/2005 | Moon et al. | |
| 6,965,811 B2 | 11/2005 | Dickey et al. | |
| 6,974,017 B2 | 12/2005 | Oseguera | |
| 6,976,190 B1 | 12/2005 | Goldstone | 714/42 |
| 6,980,381 B2 | 12/2005 | Gray et al. | 360/31 |
| 6,982,872 B2 | 1/2006 | Behl et al. | 361/687 |
| 7,006,325 B2 | 2/2006 | Emberty et al. | |
| 7,013,198 B2 | 3/2006 | Haas | |
| 7,021,883 B1 | 4/2006 | Plutt et al. | |
| 7,039,924 B2 | 5/2006 | Goodman et al. | |
| 7,042,238 B2 * | 5/2006 | Tani | G01R 1/0433 324/756.02 |
| 7,054,150 B2 | 5/2006 | Orriss et al. | 361/685 |
| 7,070,323 B2 | 7/2006 | Wanek et al. | 374/45 |
| 7,076,391 B1 | 7/2006 | Pakzad et al. | 702/118 |
| 7,077,614 B1 | 7/2006 | Hasper et al. | |
| 7,077,665 B2 * | 7/2006 | Kanesashi | H05K 7/1061 439/289 |
| 7,088,541 B2 | 8/2006 | Orriss et al. | 360/71 |
| 7,092,251 B1 | 8/2006 | Henry | 361/685 |
| 7,106,582 B2 | 9/2006 | Albrecht et al. | 361/685 |
| 7,123,477 B2 | 10/2006 | Coglitore et al. | |
| 7,126,777 B2 | 10/2006 | Flechsig et al. | 360/59 |
| 7,130,138 B2 | 10/2006 | Lum et al. | 360/31 |
| 7,134,553 B2 | 11/2006 | Stephens | |
| 7,139,145 B1 | 11/2006 | Archibald et al. | 360/53 |
| 7,164,579 B2 | 1/2007 | Muncaster et al. | 361/685 |
| 7,167,360 B2 | 1/2007 | Inoue et al. | |
| 7,181,458 B1 | 2/2007 | Higashi | |
| 7,203,021 B1 | 4/2007 | Ryan et al. | |
| 7,203,060 B2 | 4/2007 | Kay et al. | 361/685 |
| 7,206,201 B2 | 4/2007 | Behl et al. | |
| 7,214,077 B2 * | 5/2007 | Lu | H05K 5/0013 439/157 |
| 7,216,968 B2 | 5/2007 | Smith et al. | |
| 7,217,580 B2 * | 5/2007 | Ondricek | G01R 1/0408 257/E23.004 |
| 7,219,028 B2 | 5/2007 | Bae et al. | |
| 7,219,273 B2 | 5/2007 | Fisher et al. | |
| 7,227,746 B2 | 6/2007 | Tanaka et al. | 361/685 |
| 7,232,101 B2 | 6/2007 | Wanek et al. | 248/346.06 |
| 7,243,043 B2 | 7/2007 | Shin | |
| 7,248,467 B2 | 7/2007 | Sri-Jayantha et al. | 361/685 |
| 7,254,889 B1 * | 8/2007 | Cherian | G01R 1/0466 257/E23.048 |
| 7,259,966 B2 | 8/2007 | Connelly, Jr. et al. | 361/727 |

(56) References Cited

U.S. PATENT DOCUMENTS

| | | | |
|---|---|---|---|
| 7,273,344 B2 | 9/2007 | Ostwald et al. | |
| 7,273,386 B2* | 9/2007 | Olson | H01R 13/5213 |
| | | | 439/367 |
| 7,280,353 B2 | 10/2007 | Wendel et al. | |
| 7,289,885 B2 | 10/2007 | Basham et al. | |
| 7,296,430 B2* | 11/2007 | Hamilton | G01R 31/2862 |
| | | | 165/104.33 |
| 7,297,011 B2* | 11/2007 | Lai | H01R 13/2428 |
| | | | 439/331 |
| 7,304,855 B1 | 12/2007 | Milligan et al. | 361/724 |
| 7,315,447 B2 | 1/2008 | Inoue et al. | |
| 7,335,030 B2* | 2/2008 | Kunioka | G01R 1/0433 |
| | | | 324/754.08 |
| 7,349,205 B2 | 3/2008 | Hall et al. | |
| 7,349,217 B2* | 3/2008 | Hashimoto | H01L 23/4093 |
| | | | 165/80.1 |
| 7,353,524 B1 | 4/2008 | Lin et al. | |
| 7,385,385 B2 | 6/2008 | Magliocco et al. | |
| 7,395,133 B2 | 7/2008 | Lowe | |
| 7,403,451 B2 | 7/2008 | Goodman et al. | |
| 7,421,623 B2 | 9/2008 | Haugh | |
| 7,437,212 B2 | 10/2008 | Farchmin et al. | |
| 7,447,011 B2 | 11/2008 | Wade et al. | |
| 7,457,112 B2 | 11/2008 | Fukuda et al. | |
| 7,462,057 B2* | 12/2008 | Hsu | H05K 7/1061 |
| | | | 439/331 |
| 7,467,024 B2 | 12/2008 | Flitsch | |
| 7,476,362 B2 | 1/2009 | Angros | 422/100 |
| 7,479,795 B2* | 1/2009 | Hayashi | G01R 31/2874 |
| | | | 324/750.09 |
| 7,483,269 B1* | 1/2009 | Marvin, Jr. | G01F 1/187 |
| | | | 361/679.31 |
| 7,503,772 B2* | 3/2009 | Kobori | H01R 13/6275 |
| | | | 439/73 |
| 7,505,264 B2 | 3/2009 | Hall et al. | |
| 7,540,745 B2* | 6/2009 | Lin | G01R 31/2863 |
| | | | 324/750.05 |
| 7,554,811 B2 | 6/2009 | Scicluna et al. | |
| 7,559,784 B2* | 7/2009 | Hsiao | H05K 7/1053 |
| | | | 439/331 |
| 7,568,122 B2 | 7/2009 | Mechalke et al. | |
| 7,570,455 B2 | 8/2009 | Deguchi et al. | |
| 7,573,715 B2 | 8/2009 | Mojaver et al. | |
| 7,584,851 B2 | 9/2009 | Hong et al. | |
| 7,612,996 B2 | 11/2009 | Atkins et al. | |
| 7,625,027 B2 | 12/2009 | Kiaie et al. | |
| 7,630,196 B2 | 12/2009 | Hall et al. | |
| 7,643,289 B2 | 1/2010 | Ye et al. | |
| 7,646,596 B2 | 1/2010 | Ng | |
| 7,650,762 B2* | 1/2010 | Hamilton | G01R 31/2862 |
| | | | 165/104.33 |
| 7,654,830 B2* | 2/2010 | Lin | H05K 7/1084 |
| | | | 439/71 |
| 7,656,179 B2* | 2/2010 | Suzuki | G01R 31/046 |
| | | | 324/538 |
| 7,729,107 B2 | 6/2010 | Atkins et al. | |
| 7,735,216 B2* | 6/2010 | Schnabel | B81C 3/002 |
| | | | 29/740 |
| 7,771,210 B2* | 8/2010 | Cherian | G01R 1/0466 |
| | | | 439/66 |
| 7,778,031 B1 | 8/2010 | Merrow et al. | |
| 7,789,267 B2 | 9/2010 | Hutchinson et al. | |
| 7,848,106 B2 | 12/2010 | Merrow | |
| 7,890,207 B2 | 2/2011 | Toscano et al. | |
| 7,904,211 B2 | 3/2011 | Merrow et al. | |
| 7,908,029 B2 | 3/2011 | Slocum | |
| 7,911,778 B2 | 3/2011 | Merrow | |
| 7,920,380 B2 | 4/2011 | Merrow et al. | |
| 7,929,303 B1* | 4/2011 | Merrow | G11B 33/128 |
| | | | 324/73.1 |
| 7,932,734 B2 | 4/2011 | Merrow et al. | |
| 7,940,529 B2 | 5/2011 | Merrow et al. | |
| 7,945,424 B2 | 5/2011 | Garcia et al. | |
| 7,985,090 B2* | 7/2011 | Hsu | H01L 23/4093 |
| | | | 220/326 |
| 7,987,018 B2 | 7/2011 | Polyakov et al. | |
| 7,995,349 B2 | 8/2011 | Merrow et al. | |
| 7,996,174 B2 | 8/2011 | Garcia et al. | |
| 8,041,449 B2* | 10/2011 | Noble | G11B 17/225 |
| | | | 360/71 |
| 8,086,343 B2 | 12/2011 | Slocum | |
| 8,095,234 B2 | 1/2012 | Polyakov et al. | |
| 8,096,812 B2* | 1/2012 | Perino | H05K 7/1431 |
| | | | 439/331 |
| 8,102,173 B2 | 1/2012 | Merrow | |
| 8,116,079 B2 | 2/2012 | Merrow | |
| 8,117,480 B2 | 2/2012 | Merrow et al. | |
| 8,140,182 B2 | 3/2012 | Noble et al. | |
| 8,160,739 B2 | 4/2012 | Toscano et al. | |
| 8,167,626 B2* | 5/2012 | Cherian | G01R 1/0466 |
| | | | 439/66 |
| 8,233,280 B2* | 7/2012 | Koprivnak | H05K 5/0217 |
| | | | 165/104.33 |
| 8,238,099 B2 | 8/2012 | Merrow | |
| 8,279,603 B2 | 10/2012 | Merrow et al. | |
| 8,305,751 B2 | 11/2012 | Merrow | |
| 8,363,410 B2* | 1/2013 | Kobori | G01R 1/0458 |
| | | | 165/104.33 |
| 8,405,971 B2 | 3/2013 | Merrow et al. | |
| 8,466,699 B2 | 6/2013 | Merrow et al. | |
| 8,467,180 B2 | 6/2013 | Merrow et al. | |
| 8,482,915 B2 | 7/2013 | Merrow | |
| 8,499,611 B2 | 8/2013 | Merrow et al. | |
| 8,513,963 B2* | 8/2013 | Chen | H04B 17/16 |
| | | | 324/627 |
| 8,537,480 B1* | 9/2013 | Haw | G11B 27/36 |
| | | | 360/31 |
| 8,547,123 B2 | 10/2013 | Merrow et al. | |
| 8,549,912 B2 | 10/2013 | Merrow et al. | |
| 8,628,239 B2 | 1/2014 | Merrow et al. | |
| 8,631,698 B2 | 1/2014 | Merrow et al. | |
| 8,655,482 B2 | 2/2014 | Merrow | |
| 8,678,365 B2* | 3/2014 | Hofmann | G01R 1/0425 |
| | | | 269/287 |
| 8,687,349 B2 | 4/2014 | Truebenbach | |
| 8,687,356 B2 | 4/2014 | Merrow | |
| 8,717,048 B2* | 5/2014 | Richter | G01R 1/0425 |
| | | | 324/750.05 |
| 2001/0006453 A1 | 7/2001 | Glorioso et al. | 361/685 |
| 2001/0044023 A1 | 11/2001 | Johnson et al. | |
| 2001/0046118 A1 | 11/2001 | Yamanashi et al. | 361/687 |
| 2001/0048590 A1 | 12/2001 | Behl et al. | |
| 2002/0024104 A1* | 2/2002 | Earl | G01R 1/0483 |
| | | | 257/378 |
| 2002/0030981 A1 | 3/2002 | Sullivan et al. | |
| 2002/0044416 A1 | 4/2002 | Harmon, III et al. | 361/685 |
| 2002/0051338 A1 | 5/2002 | Jiang et al. | |
| 2002/0071248 A1 | 6/2002 | Huang et al. | 361/685 |
| 2002/0079422 A1 | 6/2002 | Jiang | |
| 2002/0090320 A1 | 7/2002 | Burow et al. | |
| 2002/0116087 A1 | 8/2002 | Brown | |
| 2002/0161971 A1 | 10/2002 | Dimitri et al. | 711/114 |
| 2002/0172004 A1 | 11/2002 | Ives et al. | 361/685 |
| 2003/0035271 A1 | 2/2003 | Lelong et al. | 361/724 |
| 2003/0043550 A1 | 3/2003 | Ives | 361/726 |
| 2003/0206397 A1 | 11/2003 | Allgeyer et al. | 361/685 |
| 2004/0165489 A1 | 8/2004 | Goodman et al. | |
| 2004/0230399 A1 | 11/2004 | Shin | 702/182 |
| 2004/0236465 A1 | 11/2004 | Butka et al. | 700/245 |
| 2004/0264121 A1 | 12/2004 | Orriss et al. | 361/685 |
| 2005/0004703 A1 | 1/2005 | Christie | |
| 2005/0010836 A1 | 1/2005 | Bae et al. | 714/25 |
| 2005/0018397 A1 | 1/2005 | Kay et al. | 361/685 |
| 2005/0055601 A1 | 3/2005 | Wilson et al. | |
| 2005/0057849 A1 | 3/2005 | Twogood et al. | |
| 2005/0069400 A1 | 3/2005 | Dickey et al. | |
| 2005/0109131 A1 | 5/2005 | Wanek et al. | 73/865.9 |
| 2005/0116702 A1 | 6/2005 | Wanek et al. | 324/158.1 |
| 2005/0131578 A1 | 6/2005 | Weaver | |
| 2005/0179457 A1 | 8/2005 | Min et al. | |
| 2005/0207059 A1 | 9/2005 | Cochrane | |
| 2005/0219809 A1 | 10/2005 | Muncaster et al. | 361/685 |
| 2005/0225338 A1 | 10/2005 | Sands et al. | 324/754 |
| 2005/0270737 A1 | 12/2005 | Wilson et al. | 361/685 |

(56) References Cited

U.S. PATENT DOCUMENTS

| | | |
|---|---|---|
| 2006/0010353 A1 | 1/2006 | Haugh |
| 2006/0023331 A1 | 2/2006 | Flechsig et al. |
| 2006/0028802 A1 | 2/2006 | Shaw et al. ............... 361/728 |
| 2006/0066974 A1 | 3/2006 | Akamatsu et al. |
| 2006/0130316 A1 | 6/2006 | Takase et al. ............ 29/603.09 |
| 2006/0190205 A1 | 8/2006 | Klein et al. |
| 2006/0227517 A1 | 10/2006 | Zayas et al. ............... 361/748 |
| 2006/0250766 A1 | 11/2006 | Blaalid et al. ............. 361/685 |
| 2007/0034368 A1 | 2/2007 | Atkins et al. .............. 165/247 |
| 2007/0035874 A1 | 2/2007 | Wendel et al. |
| 2007/0035875 A1 | 2/2007 | Hall et al. |
| 2007/0053154 A1 | 3/2007 | Fukuda et al. |
| 2007/0082907 A1 | 4/2007 | Canada et al. |
| 2007/0127202 A1 | 6/2007 | Scicluna et al. ........... 361/685 |
| 2007/0127206 A1 | 6/2007 | Wade et al. ............... 361/687 |
| 2007/0195497 A1 | 8/2007 | Atkins ...................... 361/685 |
| 2007/0248142 A1 | 10/2007 | Rountree et al. |
| 2007/0253157 A1 | 11/2007 | Atkins et al. .............. 361/685 |
| 2007/0286045 A1 | 12/2007 | Onagi et al. |
| 2008/0007865 A1 | 1/2008 | Orriss et al. .............. 360/97.01 |
| 2008/0030945 A1 | 2/2008 | Mojaver et al. |
| 2008/0112075 A1 | 5/2008 | Farquhar et al. .......... 360/97.02 |
| 2008/0239564 A1 | 10/2008 | Farquhar et al. .......... 360/97.02 |
| 2008/0282275 A1 | 11/2008 | Zaczek et al. |
| 2008/0282278 A1 | 11/2008 | Barkley |
| 2009/0028669 A1 | 1/2009 | Rebstock |
| 2009/0082907 A1 | 3/2009 | Stuvel et al. |
| 2009/0122443 A1 | 5/2009 | Farquhar et al. |
| 2009/0142169 A1 | 6/2009 | Garcia et al. |
| 2009/0153992 A1 | 6/2009 | Garcia et al. |
| 2009/0153993 A1 | 6/2009 | Garcia et al. |
| 2009/0153994 A1 | 6/2009 | Merrow |
| 2009/0175705 A1 | 7/2009 | Nakao et al. |
| 2009/0261047 A1* | 10/2009 | Merrow ............... G11B 17/225 211/41.12 |
| 2009/0261228 A1 | 10/2009 | Merrow |
| 2009/0261229 A1 | 10/2009 | Merrow |
| 2009/0262444 A1 | 10/2009 | Polyakov et al. |
| 2009/0262445 A1 | 10/2009 | Noble et al. |
| 2009/0262454 A1 | 10/2009 | Merrow |
| 2009/0262455 A1 | 10/2009 | Merrow |
| 2009/0265032 A1 | 10/2009 | Toscano et al. |
| 2009/0265043 A1 | 10/2009 | Merrow |
| 2009/0265136 A1 | 10/2009 | Garcia et al. |
| 2009/0297328 A1 | 12/2009 | Slocum, III |
| 2010/0083732 A1 | 4/2010 | Merrow et al. |
| 2010/0165498 A1 | 7/2010 | Merrow et al. |
| 2010/0165501 A1 | 7/2010 | Polyakov et al. |
| 2010/0168906 A1 | 7/2010 | Toscano et al. |
| 2010/0172722 A1 | 7/2010 | Noble et al. |
| 2010/0174404 A1 | 7/2010 | Slocum |
| 2010/0193661 A1 | 8/2010 | Merrow |
| 2010/0194253 A1 | 8/2010 | Merrow et al. |
| 2010/0195236 A1 | 8/2010 | Merrow et al. |
| 2010/0265609 A1 | 10/2010 | Merrow et al. |
| 2010/0265610 A1 | 10/2010 | Merrow et al. |
| 2010/0302678 A1* | 12/2010 | Merrow ............... G11B 33/128 360/97.13 |
| 2011/0011844 A1 | 1/2011 | Merrow et al. |
| 2011/0012631 A1 | 1/2011 | Merrow et al. |
| 2011/0012632 A1 | 1/2011 | Merrow |
| 2011/0013362 A1 | 1/2011 | Merrow et al. |
| 2011/0013665 A1 | 1/2011 | Merrow et al. |
| 2011/0013666 A1 | 1/2011 | Merrow et al. |
| 2011/0013667 A1 | 1/2011 | Merrow et al. |
| 2011/0064546 A1 | 3/2011 | Merrow |
| 2011/0157825 A1 | 6/2011 | Merrow et al. |
| 2011/0172807 A1 | 7/2011 | Merrow |
| 2011/0185811 A1* | 8/2011 | Merrow ............... G11B 33/128 73/431 |
| 2011/0189934 A1 | 8/2011 | Merrow |
| 2011/0236163 A1 | 9/2011 | Smith et al. |
| 2011/0261483 A1 | 10/2011 | Campbell et al. |
| 2011/0305132 A1 | 12/2011 | Merrow et al. |
| 2011/0310724 A1 | 12/2011 | Martino |
| 2012/0023370 A1 | 1/2012 | Truebenbach |
| 2012/0034054 A1 | 2/2012 | Polyakov et al. |
| 2012/0050903 A1 | 3/2012 | Campbell et al. |
| 2012/0106351 A1 | 5/2012 | Gohel et al. |
| 2012/0274345 A1 | 11/2012 | Chen et al. |
| 2012/0286799 A1* | 11/2012 | Partee ............... G01R 29/0821 324/602 |
| 2012/0321435 A1 | 12/2012 | Truebenbach |
| 2013/0071224 A1 | 3/2013 | Merrow et al. |
| 2013/0108253 A1* | 5/2013 | Akers ............... H05K 7/20563 392/485 |
| 2013/0256967 A1 | 10/2013 | Carvalho |
| 2014/0262149 A1* | 9/2014 | Merrow ............... G11B 33/128 165/80.2 |
| 2014/0271064 A1* | 9/2014 | Merrow ............... G11B 33/128 414/280 |

FOREIGN PATENT DOCUMENTS

| | | | |
|---|---|---|---|
| CN | 2341188 | 9/1999 | |
| CN | 1114109 | 7/2003 | |
| CN | 1192544 | 3/2005 | |
| DE | 3786944 | 11/1993 | |
| DE | 69111634 | 5/1996 | |
| DE | 69400145 | 10/1996 | |
| DE | 19701548 | 8/1997 | |
| DE | 19804813 | 9/1998 | |
| DE | 69614460 | 6/2002 | |
| DE | 69626584 | 12/2003 | |
| DE | 19861388 | 8/2007 | |
| EP | 0210497 | 7/1986 | |
| EP | 0242970 | 10/1987 | |
| EP | 0 277 634 A | 8/1988 | ............ G11B 17/22 |
| EP | 0356977 | 8/1989 | |
| EP | 0442642 | 2/1991 | |
| EP | 0466073 | 7/1991 | |
| EP | 0776009 | 11/1991 | |
| EP | 0582017 | 2/1994 | |
| EP | 0617570 | 9/1994 | |
| EP | 0635836 | 1/1995 | |
| EP | 741508 | 11/1996 | |
| EP | 0757320 | 2/1997 | |
| EP | 0757351 | 2/1997 | |
| EP | 0840476 | 5/1998 | |
| EP | 1 045 301 A | 10/2000 | .......... G05B 19/401 |
| EP | 1209557 | 5/2002 | |
| EP | 1422713 | 5/2004 | |
| EP | 1234308 | 5/2006 | |
| EP | 1760722 | 3/2007 | |
| EP | 1612798 | 11/2007 | |
| GB | 2241118 | 8/1991 | |
| GB | 2276275 | 9/1994 | |
| GB | 2299436 | 10/1996 | |
| GB | 2312984 | 11/1997 | |
| GB | 2328782 | 3/1999 | |
| GB | 2439844 | 7/2008 | |
| JP | 61-115279 | 6/1986 | |
| JP | 62-177621 | 8/1987 | |
| JP | 62-239394 | 10/1987 | |
| JP | 62-251915 | 11/1987 | |
| JP | 63-002160 | 1/1988 | |
| JP | 63-004483 | 1/1988 | ............ G11B 33/02 |
| JP | 63-016482 | 1/1988 | |
| JP | 63-062057 | 3/1988 | |
| JP | 63-201946 | 8/1988 | |
| JP | 63-214972 | 9/1988 | |
| JP | 63-269376 | 11/1988 | |
| JP | 63-195697 | 12/1988 | |
| JP | 64-089034 | 4/1989 | |
| JP | 2-091565 | 3/1990 | |
| JP | 2-098197 | 4/1990 | |
| JP | 2-185784 | 7/1990 | |
| JP | 2-199690 | 8/1990 | |
| JP | 2-278375 | 11/1990 | |
| JP | 2-297770 | 12/1990 | |
| JP | 3-008086 | 1/1991 | |
| JP | 3-078160 | 4/1991 | |
| JP | 3-105704 | 5/1991 | |
| JP | 3-207947 | 9/1991 | |

(56) References Cited

FOREIGN PATENT DOCUMENTS

| | | |
|---|---|---|
| JP | 3-210662 | 9/1991 |
| JP | 3-212859 | 9/1991 |
| JP | 3-214490 | 9/1991 |
| JP | 3-240821 | 10/1991 |
| JP | 3-295071 | 12/1991 |
| JP | 4-017134 | 1/1992 |
| JP | 4-143989 | 5/1992 |
| JP | 4-172658 | 6/1992 |
| JP | 4-214288 | 8/1992 |
| JP | 4-247385 | 9/1992 |
| JP | 4-259956 | 9/1992 |
| JP | 4-307440 | 10/1992 |
| JP | 4-325923 | 11/1992 |
| JP | 5-035053 | 2/1993 |
| JP | 5-035415 | 2/1993 |
| JP | 5-066896 | 3/1993 |
| JP | 5-068257 | 3/1993 |
| JP | 5-073566 | 3/1993 |
| JP | 5-073803 | 3/1993 |
| JP | 5-101603 | 4/1993 |
| JP | 5-173718 | 7/1993 |
| JP | 5-189163 | 7/1993 |
| JP | 5-204725 | 8/1993 |
| JP | 5-223551 | 8/1993 |
| JP | 6-004220 | 1/1994 |
| JP | 6-004981 | 1/1994 |
| JP | 6-162645 | 6/1994 |
| JP | 6-181561 | 6/1994 |
| JP | 6-215515 | 8/1994 |
| JP | 6-274943 | 9/1994 |
| JP | 6-314173 | 11/1994 |
| JP | 7-007321 | 1/1995 |
| JP | 7-029364 | 1/1995 |
| JP | 7-037376 | 2/1995 |
| JP | 7-056654 | 3/1995 |
| JP | 7-111078 | 4/1995 |
| JP | 7-115497 | 5/1995 |
| JP | 7-201082 | 8/1995 |
| JP | 7-226023 | 8/1995 |
| JP | 7-230669 | 8/1995 |
| JP | 7-257525 | 10/1995 |
| JP | 1982246 | 10/1995 |
| JP | 7-307059 | 11/1995 |
| JP | 8007994 | 1/1996 |
| JP | 8-030398 | 2/1996 |
| JP | 8-030407 | 2/1996 |
| JP | 8-079672 | 3/1996 |
| JP | 8-106776 | 4/1996 |
| JP | 8-110821 | 4/1996 |
| JP | 8-167231 | 6/1996 |
| JP | 8-212015 | 8/1996 |
| JP | 8-244313 | 9/1996 |
| JP | 8-263525 | 10/1996 |
| JP | 8-263909 | 10/1996 |
| JP | 8-297957 | 11/1996 |
| JP | 2553315 | 11/1996 |
| JP | 9-044445 | 2/1997 |
| JP | 9-064571 | 3/1997 |
| JP | 9-082081 | 3/1997 |
| JP | 2635127 | 7/1997 |
| JP | 9-306094 | 11/1997 |
| JP | 9-319466 | 12/1997 |
| JP | 10-040021 | 2/1998 |
| JP | 10-049365 | 2/1998 |
| JP | 10-064173 | 3/1998 |
| JP | 10-098521 | 4/1998 |
| JP | 2771297 | 7/1998 |
| JP | 10-275137 | 10/1998 |
| JP | 10-281799 | 10/1998 |
| JP | 10-320128 | 12/1998 |
| JP | 10-340139 | 12/1998 |
| JP | 2862679 | 3/1999 |
| JP | 11-134852 | 5/1999 |
| JP | 11-139839 | 5/1999 |
| JP | 2906930 | 6/1999 |
| JP | 11-203201 | 7/1999 |
| JP | 11-213182 | 8/1999 |
| JP | 11-327800 | 11/1999 |
| JP | 11-353128 | 12/1999 |
| JP | 11-353129 | 12/1999 |
| JP | 2000-056935 | 2/2000 |
| JP | 2000-066845 | 3/2000 |
| JP | 2000-112831 | 4/2000 |
| JP | 2000-113563 | 4/2000 |
| JP | 2000-114759 | 4/2000 |
| JP | 2000-125290 | 4/2000 |
| JP | 3052183 | 4/2000 |
| JP | 2000-132704 | 5/2000 |
| JP | 2000-149431 | 5/2000 |
| JP | 2000-228686 | 8/2000 |
| JP | 2000-235762 | 8/2000 |
| JP | 2000-236188 | 8/2000 |
| JP | 2000-242598 | 9/2000 |
| JP | 2000-278647 | 10/2000 |
| JP | 3097994 | 10/2000 |
| JP | 2000-305860 | 11/2000 |
| JP | 2001-005501 | 1/2001 |
| JP | 2001-023270 | 1/2001 |
| JP | 2001-100925 | 4/2001 |
| JP | 2002-42446 | 2/2002 | ............ G11B 25/04 |
| JP | 2007-87498 | 4/2007 |
| JP | 2007-188615 | 7/2007 |
| JP | 2007-220184 | 8/2007 |
| JP | 2007-293936 | 11/2007 |
| JP | 2007-305206 | 11/2007 |
| JP | 2007-305290 | 11/2007 |
| JP | 2007-328761 | 12/2007 | ............... G06F 1/20 |
| JP | 2008-503824 | 2/2008 | ............ G05D 23/19 |
| KR | 10-1998-0035445 | 8/1998 | ............ G11B 19/02 |
| KR | 10-0176527 | 11/1998 |
| KR | 10-0214308 | 8/1999 |
| KR | 10-0403039 | 10/2003 |
| SG | 45223 | 1/1998 |
| TW | 387574 | 4/2000 |
| WO | WO 89/01682 | 2/1989 |
| WO | WO 97/06532 | 2/1997 |
| WO | WO 00/49487 | 2/2000 |
| WO | 00-67540 | 11/2000 |
| WO | WO 00/67253 | 11/2000 |
| WO | WO 01/09627 | 2/2001 |
| WO | WO 01/41148 | 6/2001 |
| WO | WO 03/013783 | 2/2003 |
| WO | WO 03/021597 | 3/2003 |
| WO | WO 03/021598 | 3/2003 |
| WO | WO 03/067385 | 8/2003 |
| WO | WO 2004/006260 | 1/2004 |
| WO | WO 2004/114286 | 12/2004 |
| WO | WO 2005/024830 | 3/2005 |
| WO | WO 2005/024831 | 3/2005 |
| WO | WO 2005/109131 | 11/2005 |
| WO | WO 2006/030185 | 3/2006 |
| WO | WO 2006/048611 | 5/2006 |
| WO | WO 2006/100441 | 9/2006 |
| WO | WO 2006/100445 | 9/2006 |
| WO | WO 2007/031729 | 3/2007 |

OTHER PUBLICATIONS

PCT Application No. PCT/US2012/058454, filed Oct. 2, 2012.
U.S. Appl. No. 61/553,681, filed Oct. 31, 2011.
U.S. Appl. No. 13/834,803, filed Mar. 15, 2013.
U.S. Appl. No. 13/834,880, filed Mar. 15, 2013.
U.S. Appl. No. 13/834,740, filed Mar. 15, 2013.
U.S. Appl. No. 13/835,131, filed Mar. 15, 2013.
U.S. Appl. No. 13/835,356, filed Mar. 15, 2013.
U.S. Appl. No. 13/835,538, filed Mar. 15, 2013.
Bakken et al., "Low Cost, Rack Mounted, Direct Access Disk Storage Device", www.ip.com, 4 pages, Mar. 3, 2005.
Biber et al., "Disk Drive Drawer Thermal Management", Advances in Electronic Packaging vol. 1:43-46, 1995.
Chung et al., "Vibration Absorber for Reduction of the In-plane Vibration in an Optical Disk Drive", IEEE Transactions on Consumer Electronics, Vo. 48, May 2004.

(56) References Cited

OTHER PUBLICATIONS

FlexStar Technology, 30E/Cascade Users Manual, Doc #98-36387-00 Rev. 1.8, pp. 1-33.
FlexStar Technology, "A World of Storage Testing Solutions," http://www.flexstar.com, 1 page (1999).
FlexStar Technology, "Environment Chamber Products," http://www.flexstar.com, 1 page (1999).
FlexStar Technology, "FlexStar's Family of Products," http://www.flexstar.com, 1 page (1999).
Gurumurthi, "The Need for temperature-Aware Storage Systems", The Tenth Intersociety conference on Thermal and Thermomechanical Phenomena in Electronics, ITHERM pp. 387-394, 2006.
Gurumurthi et al., "Thermal Issues in Disk Drive Design: Challenges and Possible Solutions", ACM Transactions on Storage 2:41-73, Feb. 2006.
Henderson, "HAD High Aerial Densities Require Solid Test Fixtures", Flexstar Technology.
Lindner, "Disk drive mounting", IBM Technical Disclosure Brochure, vol. 16, No. 3, pp. 903-904, Aug. 1973.
Morgenstern, Micropolis Drives Target High-end Apps; Technology Provides Higher Uninterrupted Data Transfer. (Applications; Microdisk AV LS 3020 and 1050AV and 1760AV LT Stackable Hard Drive Systems) (Product Announcement) MacWeek, vol. 8, No. 6, p. 8; Feb. 7, 1994.
Morris, "Zero Cost Power and Cooling Monitor System", www.delphion.com/tdbs/tdb?order=94A+61950, 3 pages, Jan. 15, 2008.
Notification of Transmittal of the International Search Report and the Written Opinion of the International Searching Authority, or the Declaration, PCT/US2008/086181, 15 pages, Mar. 16, 2009.
Park, "Vibration and Noise Reduction of an Optical Disk Drive by Using a Vibration Absorber Methods and Apparatus for Securing Disk Drives in a Disk", IEEE Transactions on Consumer Electronics, vol. 48, Nov. 2002.
Ruwart et al., "Performance Impact of External Vibration on Consumer-grade and enterprise-class Disk Drives", Proceedings of the $22^{nd}$ IEEE/$13^{th}$ Goddard Conference on Mass Storage Systems and Technologies, 2005.
Seagate Product Marketing, "Seagate's Advanced Multidrive System (SAMS) Rotational Vibration Feature", Publication TP-229D, Feb. 2000.
Schroeder et al., "Disk Failures in the Real World: What does an MTTP of 1,000,000 hours mean to you?", In FAST'07: $5^{th}$ USENIX Conference on File and Storage Technologies, San Jose, CA, Feb. 14-16, 2007.
Schulze et al., "How Reliable is a Raid?," COMPCON Spring apos; 89. Thirty-Fouth IEEE Computer Society International Conference: Intellectual Leverage, Digest of papers; pp. 118-123, Feb. 27-Mar. 3, 1989.
Winchester, "Automation Specialists Use Machine Vision as a System Development Tool", IEE Computing & Control Engineering, Jun./Jul. 2003.
Xyratex website "Storage Infrastructure" www.xyratex.com/Products/storage-infrastructure/default.aspx 1995-2008.
Xyratex website "Production Test Systems" www.xyratex.com/Products/production-test-systems/default.aspx 1995-2008.
Xyratex website "Single cell—Production Test Systems" www.xyratex.com/products/production-test-systems/single-cell.aspx 1995-2008.
Xyratex website "Continuous Innovation—Production Test Systems" www.xyratex.com/products/production-test-systems/continuous-innovation.aspx 1995-2008.
Xyratex website "Key Advantages—Production Test Systems" www.xyratex.com/products/production-test-systems/advantages.aspx 1995-2008.
Xyratex website "Testing Drives Colder—Production Test Systems" www.xyratex.com/products/productino-test-systems/colder.aspx 1995-2008.
"Xyratex to Debut its New Automated Test Solution for 2.5-Inch Disk Drives at DISKCON USA 2004" 2004 PR Newswire Europe www.prnewswire.co.uk/cgi/news/release?id=130103.
"Automated Production Test Solutions", Xyratex Product Test brochure, 2006.
Xyratex "Process Challenges in the Hard Drive Industry" slide presentation, 2006 Asian Diskcon.
Suwa et al., "Evaluation System for Residual Vibration from HDD Mounting Mechanism" IEEE Transactions on Magnetics, vol. 35, No. 2, pp. 868-873, Mar. 1999.
Suwa et al., "Rotational Vibration Suppressor" IBM Technical Disclosure Bulletin, Oct. 1991.
Abraham et al., "Thermal Proximity Imaging of Hard-Disk Substrates", IEEE Transactions on Mathematics 36:3997-4004, Nov. 2000.
Anderson et al., "High Reliability Variable Load Time Controllable Vibration Free Thermal Processing Environment", Delphion, hhtps://www.delphion.com/tdbs/tdb?order=93A+63418, 3 pages, Mar. 18, 2009.
Asbrand, "Engineers at One Company Share the Pride and the Profits of Successful Product Design", Professional Issues, 4 pages, 1987.
Bair et al., "Measurements of Asperity Temperatures of a Read/Write Head Slider Bearing in Hard Magnetic Recording Disks", Journal of Tribology 113:547-554, Jul. 1991.
Christensen, "How Can Great firms Fail? Insights from the hard Disk Drive Industry", Harvard Business School Press, pp. 1-26, 2006.
Haddad et al., "A new Mounting Adapter for Computer Peripherals with Improved Reliability, Thermal Distribution, Low Noise and Vibration Reduction", ISPS, Advances in Information Storage and Processing Systems, 1:97-108, 1995.
HighBeam Research website "ACT debuts six-zone catalytic gas heater. (American Catalytic Technologies offers new heaters)" www.highbeam.com, 4 pages, 1998.
HighBeam Research website "Asynchronous Testing Increases Throughput." www.highbeam.com, 7 pages, 2000.
HighBeam Research website "Credence announces Production Release of the EPRO AQ Series for Integrated Test and Back-end Processing." www.highbeam.com, 4 pages, 1995.
HighBeam Research website "Test Multiple Parts at Once for Air Leaks. (Brief Article)", www.highbeam.com, 1 page, 1999.
Iwamiya, "Hard Drive Cooling Using a Thermoelectric Cooler", EEP—vol. 19-2, Advances in Electronic Packaging, vol. 2:2203-2208, ASME 1997.
Ku, "Investigation of Hydrodynamic Bearing Friction in Data Storage information System Spindle Motors", ISPSvol. 1, Advances in Information Storage and Processing Systems, pp. 159-165, ASME 1995.
McAuley, "Recursive Time Trapping for Synchronization of Product and CHAMBER Profiles for Stress Test", Delphion, www.delphion.com/tdbs/tdb?order=88A+60957, 3 pages, Mar. 18, 2009.
Prater et al., "Thermal and Heat-Flow Aspects of Actuators for Hard Disk Drives", InterSociety Conference on Thermal Phenomena, pp. 261-268, 1994.
Terwiesch et al., "An Exploratory Study of International Product Transfer and Production Ramp-Up in the Data Storage Industry", The Information Storage Industry Center, University of California, www-irps.ucsd.edu/~sloan/, pp. 1-31, 1999.
Tzeng, "Dynamic Torque Characteriestics of Disk-Drive Spindle Bearings", ISPS—vol. 1, Advances in Information Storage and Processing Systems, pp. 57-63, ASME 1995.
Tzeng, "Measurements of Transient Thermal Strains in a Disk-Drive Actuator", InterSociety conference on Thermal Phenomena, pp. 269-274, 1994.
Wilson-7000 disk Drive Analyzer Product Literature, date accessed Jan. 28, 2009, 2 pages.
Annex to Form PCT/ASA/206 Communication Relating to the Results of the Partial International Search, for International Application No. PCT/US2008/086814, dated Apr. 3, 2009, 1 page.
Annex to Form PCT/ASA/206 Communication Relating to the Results of the Partial International Search, for International Application No. PCT/US2008/086809, dated Apr. 3, 2009, 1 page.

(56) References Cited

OTHER PUBLICATIONS

Notification of Transmittal of the International Search Report and the Written Opinion of the International Searching Authority, or the Declaration, for International Application No. PCT/US2009/039926, Sep. 1, 2009, 13 pages.
Notification of Transmittal of the International Search Report and the Written Opinion of the International Searching Authority, or the Declaration, for International Application No. PCT/US2009/039591, Aug. 31, 2009, 10 pages.
Notification of Transmittal of the International Search Report and the Written Opinion of the International Searching Authority, or the Declaration, for International Application No. PCT/US2008/086814, Sep. 18, 2009, 17 pages.
Notification of Transmittal of the International Search Report and the Written Opinion of the International Searching Authority, or the Declaration, for International Application No. PCT/US2009/039888, Sep. 28, 2009, 13 pages.
Notification of Transmittal of the International Search Report and the Written Opinion of the International Searching Authority, or the Declaration, for International Application No. PCT/US2009/039921, Sep. 25, 2009, 14 pages.
Notification of Transmittal of the International Search Report and the Written Opinion of the International Searching Authority, or the Declaration, for International Application No. PCT/US2009/040058, Sep. 29, 2009, 13 pages.
Notification of Transmittal of the International Search Report and the Written Opinion of the International Searching Authority, or the Declaration, for International Application No. PCT/US2009/040829, Oct. 28, 2009, 13 pages.
Notification of Transmittal of the International Search Report and the Written Opinion of the International Searching Authority, or the Declaration, for International Application No. PCT/US2009/040835, Oct. 30, 2009, 13 pages.
Abramovitch, "Rejecting Rotational Disturbances on Small Disk Drives Using Rotational Accelerometers", Proceedings of the 1996 IFAC World Congress in San Francisco, CA, Jul. 1996 http://dabramovitch.com/pubs/amrfac_matj.pdf.
Ali et al., "Modeling and Simulation of Hard Disk Drive Final Assembly Using a HDD Template" Proceedings of the 2007 Winter Simulation Conference, IEEE pp. 1641-1650, 2007 http://portal.acm.org/citation.cfm?id=1351837.
Anderson et al., "Clinical chemistry: concepts and applications", The McGraw-Hill Companies, Inc., pp. 131-132, 2003.
Curtis et al., "InPhase Professional Archive Drive Architecture" Dec. 17, 2007 http://www.science.edu/TechoftheYear/Nominees/InPhase/Holographic%20Storage.pdf.
Findeis et al., "Vibration Isolation Techniques Sutiable for Portable Electronic Speckle Pattern Interferometry", Proc. SPIE vol. 4704, pp. 159-167, 2002 http://www.ndt.uct.ac.za/Papers/spiendt2002.pdf.
Frankovich, "The Basics of Vibration Isolation Using Elastomeric Materials", EARSC 2005 http://www.isoloss.com/pdfs/engineering/BasicsofVibrationIsolation.pdf.
Grochowski et al., "Future Trends in Hard Disk Drives" IEEE Transactions on Magnetics, vol. 32, No. 3, pp. 1850-1854, May 1996 http://svn.tribler.org/abc/branches/leo/dataset/preferences/johan/johan-68.pdf.
Gurumurthi et al., "Disk Drive Roadmap from the Thermal Perspective: A Case for Dynamic Thermal Management", International Symposium on Computer Architecture Proceedings of the $32^{nd}$ Annual International Symposium on Computer Architecture, pp. 38-49, 2005 http://portal.acm.org/citation.cfm?id=1069807.1069975.
Johnson et al., "Performance Measurements of Tertiary Storage Devices", Proceedings of the $24^{th}$ VLDB Conference, New York, pp. 50-61, 1998.
Nagarajan, "Survey of Cleaning and cleanliness Measurement in Disk Drive Manufacture", North Carolina Department of Environment and Natural Resources, Feb. 1997.

Yee Leong Low et al., "Thermal network model for temperature prediction in hard disk drive" Journal Microsystem Technologies, vol. 15, No. 10-11, pp. 1653-1656, Oct. 2009 http://www.springerlink.com/content/20668jn67pk426r5/.
Notification of Transmittal of the International Search Report and the Written Opinion of the International Searching Authority, or the Declaration, for International Application No. PCT/US2009/039590, Oct. 30, 2009, 10 pages.
Notification of Transmittal of the International Search Report and the Written Opinion of the International Searching Authority, or the Declaration, for International Application No. PCT/US2009/040757, Nov. 23, 2009, 12 pages.
Notification of Transmittal of the International Search Report and the Written Opinion of the International Searching Authority, or the Declaration, for International Application No. PCT/US2009/039898, Nov. 24, 2009, 12 pages.
Notification of Transmittal of the International Search Report and the Written Opinion of the International Searching Authority, or the Declaration, for International Application No. PCT/US2009/040795, Nov. 26, 2009, 13 pages.
Notification of Transmittal of the International Search Report and the Written Opinion of the International Searching Authority, or the Declaration, for International Application No. PCT/US2009/045583, Nov. 27, 2009, 13 pages.
Notification of Transmittal of the International Search Report and the Written Opinion of the International Searching Authority, or the Declaration, for International Application No. PCT/US2009/040888, Dec. 29, 2009, 14 pages.
Notification of Transmittal of the International Search Report and the Written Opinion of the International Searching Authority, or the Declaration, for International Application No. PCT/US2009/040894, Dec. 22, 2009, 12 pages.
Notification of Transmittal of the International Search Report and the Written Opinion of the International Searching Authority, or the Declaration, for International Application No. PCT/US2009/039934, Dec. 23, 2009, 12 pages.
Notification of Transmittal of the International Search Report and the Written Opinion of the International Searching Authority, or the Declaration, for International Application No. PCT/US2009/040965, Dec. 23, 2009, 12 pages.
Notification of Transmittal of the International Search Report and the Written Opinion of the International Searching Authority, or the Declaration, for International Application No. PCT/US2009/040973, Jan. 11, 2010, 13 pages.
Cardinal Intellectual Property's search report completed Dec. 30, 2009, including the results of a search for the features of the claims included in the U.S. patent application entitled "Transferring Disk Drives Within Disk Drive Testing Systems", inventors: Polyakov et al, and having assigned U.S. Appl. No. 12/727,150. The foregoing U.S. patent application is a continuation of U.S. Appl. No. 12/104,536.
Cardinal Intellectual Property's search report completed Jan. 4, 2010, including the results of a search for the features of the claims included in the U.S. patent application entitled "Transferring Storage Devices Within Storage Device Testing Systems", inventors: John P. Toscano et al., and having assigned U.S. Appl. No. 12/727,201. The foregoing U.S. patent application is a continuation of U.S. Appl. No. 12/424,980.
Cardinal Intellectual Property's search report completed Jan. 5, 2009, including the results of a search for the features of the claims included in the U.S. patent application entitled "Processing Storage Devices", inventors: Richard W. Slocum III., and having assigned U.S. Appl. No. 12/727,619. The foregoing U.S. patent application is a continuation of U.S. Appl. No. 12/474,388.
Cardinal Intellectual Property's search report completed Jan. 15, 2010, including the results of a search for the features of the claims included in the U.S. patent application entitled "Bulk Feeding Disk Drives to Disk Drive Testing Systems", inventors: Noble et al., and having assigned U.S. Appl. No. 12/726,856. The foregoing U.S. patent application is a continuation of U.S. Appl. No. 12/104,869.
Cardinal Intellectual Property's search report completed Jan. 13, 2010, including the results of a search for the features of the claims included in the U.S. patent application entitled "Dependent Tem-

(56) References Cited

OTHER PUBLICATIONS perature Control Within Disk Drive Testing Systems", inventors: Merrow et al., and having assigned U.S. Appl. No. 12/727,207. The foregoing U.S. patent application is a continuation of U.S. Appl. No. 12/105,069.

Cardinal Intellectual Property's search report completed Jan. 13, 2010, including the results of a search for the features of the claims included in the U.S. patent application entitled "Test Slot Cooling System for a Storage Device Testing System", inventors: Merrow et al., and having assigned U.S. Appl. No. 12/727,700. The foregoing U.S. patent application is a continuation of U.S. Appl. No. 12/503,567.

Cardinal Intellectual Property's search report completed Feb. 17, 2010, including the results of a search for the features of the claims included in the U.S. patent application entitled "Storage Device Testing System Cooling", inventors: Brian S. Merrow and having assigned U.S. Appl. No. 12/775,560. The foregoing U.S. patent application is a continuation of U.S. Appl. No. 12/698,575.

Cardinal Intellectual Property's search report completed Jan. 6, 2010, including the results of a search for the features of the claims included in the U.S. patent application entitled "Conductive Heating", inventors: Brian S. Merrow et al., and having assigned U.S. Appl. No. 12/836,915. The foregoing U.S. patent application is a continuation of U.S. Appl. No. 12/503,593.

Cardinal Intellectual Property's search report completed Jan. 7, 2010, including the results of a search for the features of the claims included in the U.S. patent application entitled "Conductive Temperature Sensing", inventors: Brian S. Merrow et al., and having assigned U.S. Appl. No. 12/760,305. The foregoing U.S. patent application is a continuation of U.S. Appl. No. 12/503,687.

Cardinal Intellectual Property's search report completed Jan. 14, 2010, including the results of a search for the features of the claims included in the U.S. patent application entitled "Solid State Temperature Control of Hard Drive Tester", inventors: Brian S. Merrow and having assigned U.S. Appl. No. 12/856,056. The foregoing U.S. patent application is a continuation of U.S. Appl. No. 12/105,103.

Cardinal Intellectual Property's search report completed Jan. 12, 2010, including the results of a search for the features of the claims included in the U.S. patent application entitled "Single Test Slot for Dynamic Isolation of Hard Drive", inventors: Brian S. Merrow and having assigned U.S. Appl. No. 12/767,142. The foregoing U.S. patent application is a continuation of U.S. Appl. No. 12/105,105.

Cardinal Intellectual Property's search report completed Jan. 14, 2010, including the results of a search for the features of the claims included in the U.S. patent application entitled "Hard Drive Transport Sled", inventors: Brian S. Merrow et al., and having assigned U.S. Appl. No. 12/766,680. The foregoing U.S. patent application is a continuation of U.S. Appl. No. 12/959,133.

Cardinal Intellectual Property's search report completed Feb. 18, 2010, including the results of a search for the features of the claims included in the U.S. patent application entitled "Chilled Water Temp Control of Disk Drive Tester", inventors: Brian S. Merrow and having assigned U.S. Appl. No. 12/937,918. The foregoing U.S. patent application is a continuation of U.S. Appl. No. 12/105,061.

Cardinal Intellectual Property's search report completed Jan. 12, 2010, including the results of a search for the features of the claims included in the U.S. patent application entitled "Vibration Isolation Within Disk Drive Testing Systems", inventors: Brian S. Merrow and having assigned U.S. Appl. No. 12/767,142. The foregoing U.S. patent application is a continuation of U.S. Appl. No. 12/105,105. Revised as of Mar. 30, 2010.

Cardinal Intellectual Property's search report completed Apr. 4, 2010, including the results of a search for the features of the claims included in the U.S. patent application entitled "Disk Drive Clamping Transport and Testing", inventors: Brian S. Merrow et al., and having assigned U.S. Appl. No. 12/767,113. The foregoing U.S. patent application is a continuation of U.S. Appl. No. 11/959,133. Revised as of Apr. 4, 2010.

Cardinal Intellectual Property's search report completed Apr. 1, 2010, including the results of a search for the features of the claims included in the U.S. patent application entitled "Disk Drive Clamping Transport and Testing", inventors: Brian S. Merrow et al., and having assigned U.S. Appl. No. 12/766,680. The foregoing U.S. patent application is a continuation of U.S. Appl. No. 11/959,133. Revised as of Apr. 1, 2010.

FlexStar Technology, 30E/Cascade Users Manual, Doc #98-36387-00 Rev. 1.8, pp. 1-33, Jun. 1, 2004.

Henderson, "HAD High Aerial Densities Require Solid Test Fixtures", Flexstar Technology, Feb. 26, 2007.

Exhibit 1 in *Xyratex Technology, LTD v. Teradyne, Inc.*; Newspaper picture that displays the CSO tester; 1990.

Exhibit 2 in *Xyratex Technology, LTD v. Teradyne, Inc.*; Photos of the CSO tester obtained from Hitachi; 1990.

Exhibit 1326 in *Xyratex Technology, LTD v. Teradyne, Inc.*; Image of the back of Exhibit 1 and Exhibit 2 photos, which display the photos' dates; 1990.

Exhibit 1314 in *Xyratex Technology, LTD. V. Teradyne, Inc.*; Case, "Last products of Disk-File Development at Hursley and Millbrook," IBM, Oct. 12, 1990.

Exhibit 1315 in *Xyratex Technology, LTD. V. Teradyne, Inc.*; Case, "History of Disk-File Development at Hursley and Millbrook," IBM, Oct. 17, 1990.

*Xyratex Technology, LTD. V. Teradyne, Inc.*, Teradyne, Inc's Prior Art Notice Pursuant to 35 U.S.C. Section 282. Case No. CV 08-04545 SJO (PLAx), Oct. 16, 2009.

*Xyratex Technology, LTD. V. Teradyne, Inc.*, Amended Joint Trial Exhibit List of Xyratex and Teradyne. Case No. CV 08-04545 SJO (PLAx), Nov. 12, 2009.

Notification of Transmittal of the International Search Report and the Written Opinion of the International Searching Authority, or the Declaration, for International Application No. PCT/GB2005/003490, Jan. 26, 2006, 10 pages.

Notification Concerning Transmittal of International Preliminary Report on Patentability (Chapter 1 of the Patent Cooperation Treaty), International Application No. PCT/US2009/040973, Oct. 28, 2010, 7 pages.

International Search Report and Written Opinion mailed Aug. 14, 2014 in international application No. PCT/US2014/019832, 16 pgs.

\* cited by examiner

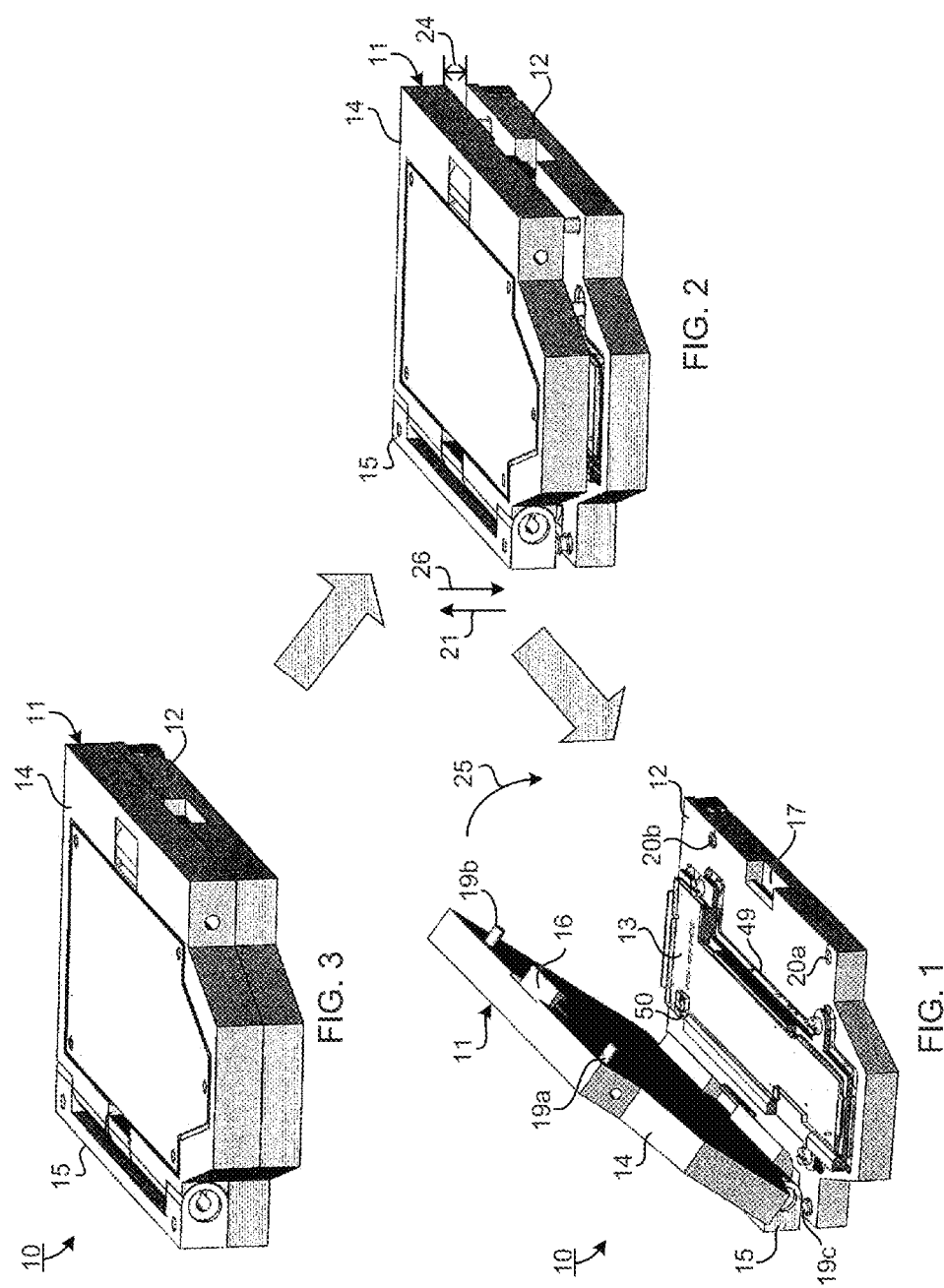

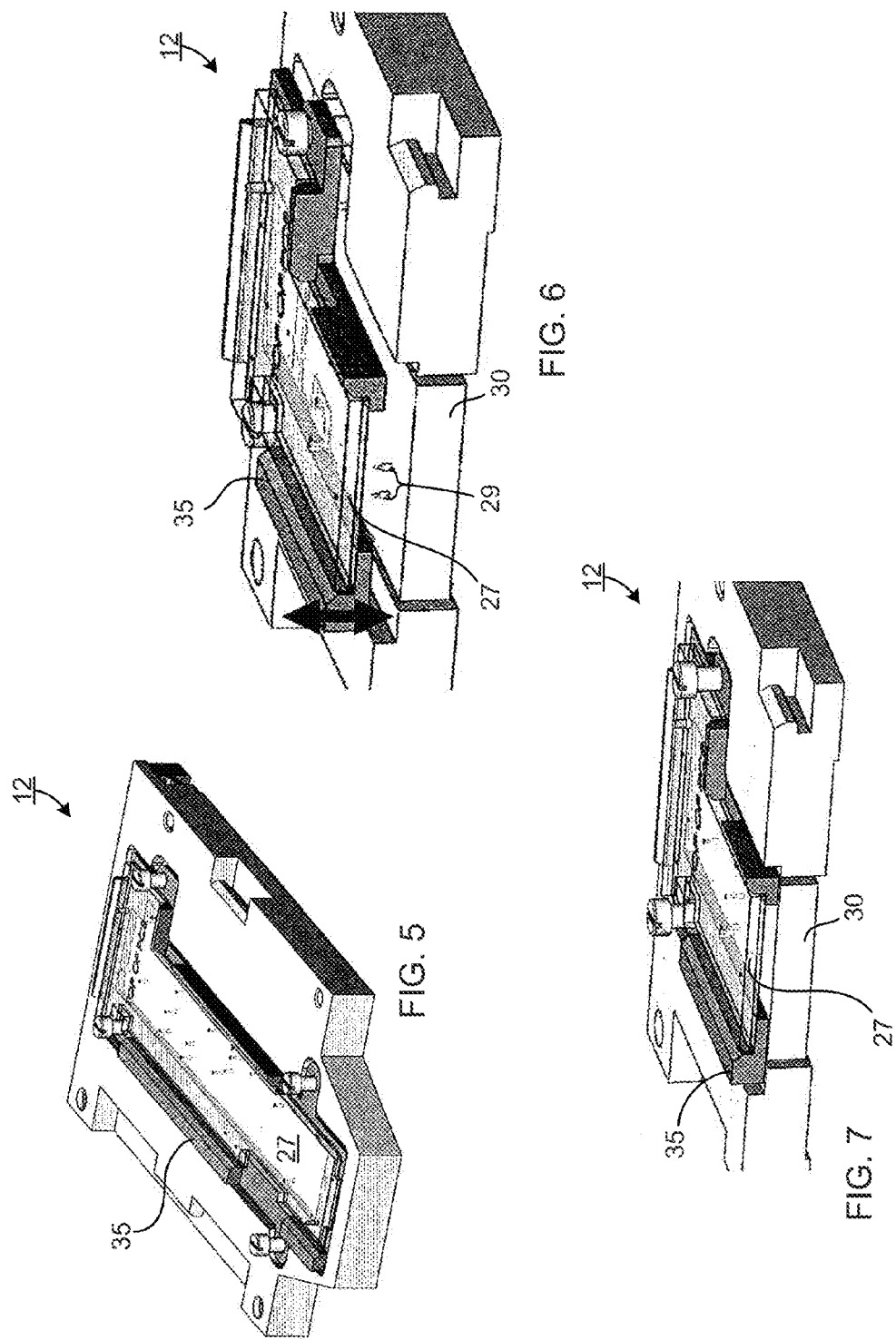

ELECTRONIC ASSEMBLY TEST SYSTEM

TECHNICAL FIELD

This specification relates generally to a system for testing electronic assemblies (EAs), such as printed circuit boards (PCBs), in parallel.

BACKGROUND

Manufacturers typically test devices, including electronic assemblies (EAs) such as printed circuit boards (PCBs), for compliance with various requirements. Typically, PCBs are tested in panels. Generally, a panel includes multiple instances of a PCB in a common matrix. A panel is installed in a test system and, one-by-one, the individual PCBs within the panel are tested. Panel-based testing is primarily an artifact of the sizes of PCBs. For example, traditionally, PCBs were sized for computers, which made panel-based testing an acceptable alternative. However, in recent years, a large portion of PCBs to test, such as those used in smartphones, are considerably smaller than in previous eras. Due to the proliferation of smartphones and other portable electronic devices, the numbers of smaller PCBs that require testing have also increased, while the testing requirements have, in many cases, become more stringent.

SUMMARY

An example system for testing electronic assemblies (EAs) may include: carriers for holding EAs; and slots for testing at least some of the EAs in parallel, with each slot being configured to receive a corresponding carrier containing an EA and to test the EA. An example carrier comprises a first part and a second part, with at least one of the first part and the second part comprising a first structure. The first structure is movable to enable electrical connection between an EA and an electrical interface, where a direction of movement of the first structure is substantially perpendicular to a surface of the EA. The example system may include one or more of the following features, either alone or in combination.

At least one of the first part and the second part may comprise a second structure. The second structure may be moveable to enable electrical connection between the EA and an electrical interface.

At least a portion of the first part may be configured to move relative to the second part to enable insertion of the EA into the carrier and removal of the EA from the carrier. The first part may be configured to move relative to the second part to achieve electrical connection of the EA through the first structure, where a direction of motion of the first structure is substantially perpendicular to a surface of the EA. The at least a portion of the first part may be configured to move non-vertically relative to the second part when there is already separation between the first part and the second part. The first part may comprise a hinge and a frame, with the frame being the portion of the first part that is configured to move angularly.

The example system may comprise guides between the first part and the second part. In a first position, the guides may separate the first part from the second structure so that the first part and the second part are substantially parallel to each other. In a second position, the guides may be moved within at least one of the first structure and the second structure so that the first part and the second part move closer together (touching or not touching).

The EA may have localized heat sources. At least one of the first part and the second part may comprise thermally-conductive objects at locations corresponding to the localized heat sources, where the thermally-conductive objects are used to conduct, convect, or radiate heat from the localized heat sources. The thermally-conductive objects may comprise pins that are thermally conductive and that are arranged at a location of the first structure or the second structure that corresponds to a location of the localized heat sources. The thermally-conductive objects may comprise fins that are thermally conductive and that are arranged at a location of the first structure or the second structure that corresponds to a location of the localized heat sources.

The carrier may comprise circuitry configured to emulate a power source that is usable in a product for which the EA is intended. Each carrier may comprise one or more air pathways, through which air is able to flow through the carrier. Each slot may comprise an air mover for blowing air through the slot and through air pathways in a carrier in the slot. The air may be below 25° C. or above 25° C.

The first structure may comprise first pins that can pass through the first structure; and a third structure comprising circuit traces, with the first pins for effecting electrical connection between the EA and the circuit traces on the third structure. The first part may comprise the first structure and the second part may comprise a second structure. The second structure may be moveable to enable electrical connection with an electrical interface. The second part may comprise second pins that can pass through the second structure; and a fourth structure comprising circuit traces, with the second pins for effecting electrical connection between the EA and the circuit traces on the fourth structure.

The example system may comprise a heat source for providing heat to an interior of the carrier. The example system may comprise radio frequency (RF) shielding for each carrier.

The example system may comprise automation to move carriers into, and out of, the slots during a testing process. The automation may comprise: a device transport mechanism to move carriers between a shuttle mechanism and slots; a feeder to provide carriers containing untested EAs and to receive carriers containing tested EAs; and the shuttle mechanism to receive a carrier containing an untested EA from the feeder and to provide the carrier containing the untested EA to the device transport mechanism, and to receive a carrier containing a tested EA from the device transport mechanism and to provide the carrier containing the tested EA to the feeder.

At least some of the slots in the example system may comprise a pack for receiving corresponding carriers, with a carrier and a pack each having beveled edges that are configured to interact to force motion of the first structure.

A carrier in the example system may comprise a first interior region that includes the EA; a second interior region; RF (Radio Frequency) shielding material between the first interior region and the second interior region; an antenna for communicating with an RF test system; and RF control circuitry communicatively coupled to the EA and the antenna, to enable wireless RF testing of the EA. The example carrier may comprise a cable having RF shielding that is in electrical communication with the EA for wired RF testing of the EA.

An example carrier for holding an electronic assembly (EA) to test may comprise: a first part; and a second part, with at least one of the first part and the second part being movable towards the EA, with a direction of motion of the at least one of the first part and the second part being substantially perpendicular to a surface of the EA, and with motion of the at least one of the first part and the second part resulting in electrical connection between the EA and an electrical interface. The example carrier may include one or more of the following features, either alone or in combination.

At least one of the first part and the second part may comprise: a structure having first holes therethrough at points corresponding to electrical test points of the EA; and a substrate comprising first pins at locations corresponding to the first holes, with the first pins being part of an electrical pathway to a connector. The first part may be movable relative to the second part so that the first pins move through the first holes to connect to/disconnect from the EA. The first part may be movable angularly relative to the second part when there is already separation between the first part and the second part. The first part may comprise a hinge and a frame, with the frame being configured to pivot angularly about the hinge.

The example carrier may comprise guides between the second part and the first part. In a first position, the guides may separate the first part from the second part so that the first part and the second part are substantially parallel to each other. In a second position, the guides may be moved within at least one of the first part and the second part so that the second part and the first part move closer together.

The EA may have localized heat sources. At least one of the first part and the second part may comprise thermally-conductive objects corresponding to the localized heat sources, with the thermally-conductive objects to conduct, convect, or radiate heat from the localized heat sources. The thermally-conductive objects may comprise pins that are thermally conductive and that are arranged at a location of the first part or second part that corresponds to a location of the localized heat sources. The thermally-conductive objects may comprise fins that are thermally conductive and that are arranged at a location of the first part or second part that corresponds to a location of the localized heat sources.

The example carrier may comprise circuitry configured to emulate a power source that is usable in a product for which the EA is intended. The example carrier may comprise one or more air pathways, through which air is able to flow over an EA in the carrier. The air may be below 25° C. or above 25° C.

The example carrier may comprise a heat source for providing heat to an interior of the carrier and/or radio frequency (RF) shielding enclosing at least part of the carrier. At least one of the first part and the second part may have a beveled surface. The example carrier may comprise a first interior region that includes the EA; a second interior region; RF shielding material between the first interior region and the second interior region; an antenna for communicating with an RF test system; and RF control circuitry communicatively coupled to the EA and the antenna, to enable wireless RF testing of the EA. The example carrier may comprise a cable having RF shielding that is in electrical communication with the EA for wired RF testing of the EA.

An example method may be for use in an example system comprising carriers for holding EAs and slots for testing at least some of the EAs in parallel, with each slot being configured to receive a corresponding carrier containing an EA and to test the EA. An example carrier may comprise a first part and a second part; where at least one of the first part and the second part is configured to enable electrical connection between an EA and an electrical interface. The example method may comprise: moving the first part away from the second part; moving the first part to expose an area for receiving an EA; inserting an EA into the area; and moving the first part so as to contact the EA and thereby establish an electrical connection between the EA and the electrical interface, where a direction of motion of the first part is substantially perpendicular to a surface of the EA.

In the example method, moving the first part to expose an area for receiving an EA may comprise moving the first part angularly relative to the second part when there is already separation between the first part and the second part.

Any two or more of the features described in this specification, including in this summary section, can be combined to form implementations not specifically described herein.

The systems and techniques described herein, or portions thereof, can be implemented as/controlled by a computer program product that includes instructions that are stored on one or more non-transitory machine-readable storage media, and that are executable on one or more processing devices to control (e.g., coordinate) the operations described herein. The systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features, objects, and advantages will be apparent from the description and drawings, and from the claims.

DESCRIPTION OF THE DRAWINGS

FIG. 1 is a perspective view of an example carrier in an open position.

FIG. 2 is a perspective view of an example carrier in a position where the first part (e.g., a top) is separated from, and parallel to, the second part (e.g., a base).

FIG. 3 is a perspective view of an example carrier in a closed position.

FIG. 5 is a perspective view of an example second part of the carrier.

FIG. 6 is a perspective cut-away view of an example second part of the carrier, which shows the support plate elevated and floating vertically.

FIG. 7 is a is a perspective cut-away view of an example second part of the carrier, which shows the support plate compressed.

DETAILED DESCRIPTION

Figure 4:
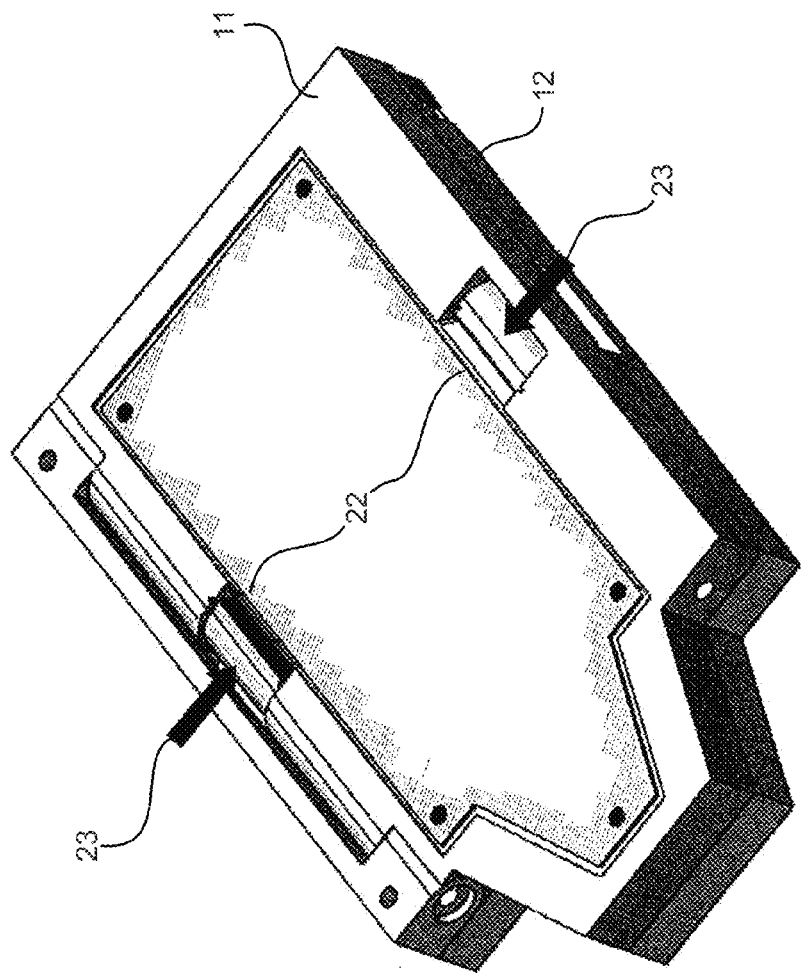
FIG. 4 is a top perspective view of an example carrier in a closed position, which shows latches for opening and closing the carrier.

Described herein are example systems for testing devices in parallel, including, but not limited to, electronic assemblies (EAs) such as printed circuit boards (PCB). Although the example systems described herein focus on testing PCBs, the systems may be used in testing any type of device or assembly.

Example systems for testing devices, such as PCBs, include multiple slots arranged, e.g., in a rack of slots. Each slot is configured to test a corresponding PCB in parallel with PCBs being tested in other slots. For example, each slot may include electrical connections, circuitry, processing devices, communication mechanisms, and the like, which may be used to perform one or more tests on a PCB contained therein. As noted, testing of PCBs in some slots may be performed in parallel with testing of other PCBs in other slots. Furthermore, the testing may be asynchronous. For example, testing in one slot need not be synchronized with testing in any other slot. Rather, testing in each slot may proceed according to its own schedule. Furthermore, the testing performed in different slots of the same system may include the same tests or different tests.

In some implementations, PCBs may be inserted into, and removed from, the slots using automated mechanisms, examples of which are described below. In some implementations, PCBs may be inserted into, and removed from, the slots manually. In some implementations, PCBs may be inserted into, and removed from, the slots using a combination of automated mechanisms and manual labor. The example systems described herein are not limited to use with the automated and/or manual processes of PCB insertion and removal that are described herein. Rather, any appropriate insertion and removal processes may be used.

In some implementations, each PCB is resident in a carrier. The carrier includes a physical and electrical interface to a corresponding slot. For example, the carrier may include one or more electrical connectors that mate to one or more corresponding electrical connectors in a slot. Test signals to/from the PCB in the carrier are transmitted through such electrical connector(s). The slot may be sized and shaped to accommodate the size and shape of a carrier.

FIGS. 1 to 3 shows an example of a carrier 10 that may be used in the example test systems described herein. In FIG. 1, carrier 10 is open. As shown, carrier 10 includes a first part 11 and a second part 12. The first part may be, e.g., a top part and the second part may be, e.g., a base part. First part 11 opens to expose an area 13 for receiving a PCB. In some implementations, first part 11 includes a frame 14 and a hinge 15. Hinge 15 may be, e.g., a spring hinge, a friction hinge, or any other appropriate type of hinge. Referring also to FIGS. 2 and 3, frame 14 is attached to hinge 15 to allow frame 14 to pivot angularly relative to second part 12, as shown in FIG. 1. This angular motion opens carrier 10, thereby exposing area 13 for inserting, or removing, a PCB in carrier 10. Angular motion is one example of the type of motion that may be used at this point; other types of vertical or non-vertical motion may be used as well, examples of which include, but are not limited to, linear motion, rotational motion, extra-dimensional motion, and so forth.

First part 11 also includes a lock 16, which mates to a corresponding mechanism 17 on second part 12, to prevent carrier 10 from opening during testing or other operations. In order to reduce friction on electrical connections (described below) on the PCB and on the first part and/or the second part, carrier 10 is configured so that, during closing, different sides of the perimeter of the first part contact corresponding sides of the perimeter of the second part at approximately the same time. To this end, first part 11 includes guides to control separation of the top and second parts. In the example implementations described herein the guides are posts; however, other types of guides may be used. Posts 19a to 19c control separation of first part 11 from second part 12 during angular motion of frame 14 (FIG. 1), and control closing of the carrier. Posts 19a to 19c may be any type of structure (e.g., screws) that can be used to hold first part 11 above, and separated from second part 12, and that can be moved within corresponding holes to bring the top and second parts together in a compressive motion and thereby close the carrier.

In the example of FIGS. 1 to 3, posts 19a and 19b are located on first part 11 and corresponding holes 20a and 20b are located on second part 12. Posts 19c are located on hinge 15, and fit into corresponding holes on second part 12. In some implementations, the posts and holes may be positioned differently on the top and second parts than what is shown in the figures. In some implementations, there may be more or less posts than those shown in the figures.

To load an untested PCB into carrier 10 (or to remove a tested PCB from carrier 10), carrier 10 is opened from a closed position (FIG. 3). To open carrier 10, first part 11 is moved vertically (in the direction of arrow 21). In other words, a direction of motion of first part 11 is substantially perpendicular to a surface of a plate or PCB in the carrier. The vertical movement may be implemented manually or automatically. For example, an automated mechanism (not shown) may force separation of first part 11 and second part 12. In another example, first part 11 and second part 12 may be forced apart by a technician or test engineer. FIG. 4 shows an example implementation in which latches 22 may be squeezed in the direction of arrows 23 to open carrier 10, and pushed in the opposite direction to close (and lock) carrier 10. In some implementations, there may be limitations on the amount that the first part and the second part can be separated (e.g., so as not to permit complete separation of the top and second parts). In other implementations, the top and second parts may be completely separated.

As shown in FIG. 2, when separated, first part 11 and second part 12 remain substantially in parallel to each other, and separated at a distance 24. Such separation may be maintained through appropriate friction in the posts or through the use of one or more screws and/or other mechanisms that enable movement yet permit separation, once achieved, to be maintained. When separated, as shown in FIG. 1, frame 14 may pivot/move angularly about hinge 15 to open carrier 10 and thereby expose an area 13 for holding a PCB during test. For example, as shown in FIG. 1, frame 14 pivots (e.g., swings angularly) while first part 11 and second part 12 maintain separation. This pivot exposes area 13, as noted. A tested PCB may be removed from a structure (described below) at area 13, and an untested PCB may be placed into a structure at area 13, as described below. In this example implementation (described below), the structure is a plate; however, in other example implementations other types of structures may be used.

To close carrier 10, frame 14 may be pivoted downwards, in the direction of arrow 25, to the position shown in FIG. 2. From there, first part 11 may be moved downward, in the direction of arrow 26, to the position shown in FIG. 3. The downward motion is vertical (e.g., normal to the PCB) so that electrical circuits created between the PCB and the top and/or second part are achieved through compression connection of electrical contacts on the PCB and the top and second parts, thereby reducing the amount of frictional force to which those contacts are exposed.

In some implementations, a support structure (e.g., a support plate) may be included on the first part or second part only. In such implementations, the electrical connections are implemented only via the part containing the support structure and associated circuitry.

FIG. 5 is a perspective view of an implementation of second part 12. As shown in FIG. 5, second part includes a support plate 27. A PCB to test is placed on support plate 27 when first part 11 is opened. Support plate 27 is typically customized to include holes at locations that correspond to electrical contacts of a PCB under test. In other implementations, the holes may be replaced by conductive traces or other electrical connectors that can form a conductive pathway upon contact between the PCB and pins (described below).

The PCB may include electrical contacts on both sides, e.g., its top and bottom. Support plate 27 may therefore include holes having a pattern that corresponds to a pattern of electrical contacts on the bottom of the PCB under test. Referring to FIGS. 6 and 7, support plate 27 floats vertically such that its holes are above corresponding electrical contacts 29. In this example, electrical contacts 29 are POGO pins; however, other types of contacts and/or pins may be used. The pins are held in a structure, such as a substrate 30. The substrate and support plate may have a footprint that matches the footprints of the PCB. In operation, a PCB on support plate 27 is forced downwards when the carrier is closed so that the pins pass through the holes in the support plate and contact corresponding electrical contacts on the PCB. For example, FIG. 7 shows support plate forced downward, with the pins mating to corresponding holes.

Figure 8:
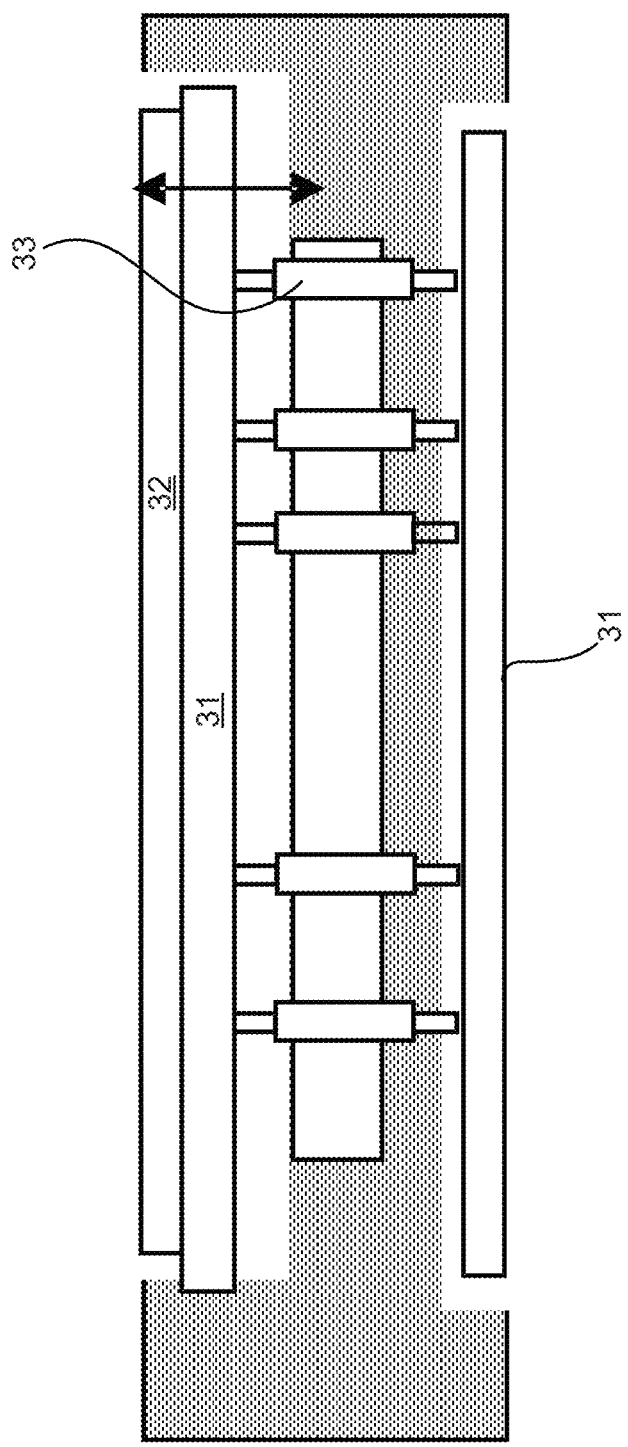
FIG. 8 is a side, cut-away view of an example second part of a carrier.

Below substrate 30, and not shown in FIGS. 5 to 7, is another structure, e.g., a plate, that contains circuit traces to an input/output connector for the carrier (not shown). FIG. 8 shows this plate 31, along with a PCB 32, pins 33, a substrate 30, and the second part's frame. The circuit traces on plate 31, when connected by the pins through compressive force, complete a circuit between the electrical contacts on the PCB, the pins, the traces and the electrical connecter, over which electrical signals are communicated to/from the PCB during and after test. The signals may be sent to/from the PCB from a controller in a test slot and/or from a test engineer operating at a remote or local test station (e.g., a computer). Use of circuit traces can be advantageous in that it reduces the need for wires. However, in other implementations, wires and/or other conductive media may be used instead of, or in addition to, circuit traces to provide electrical connections.

Figure 9:
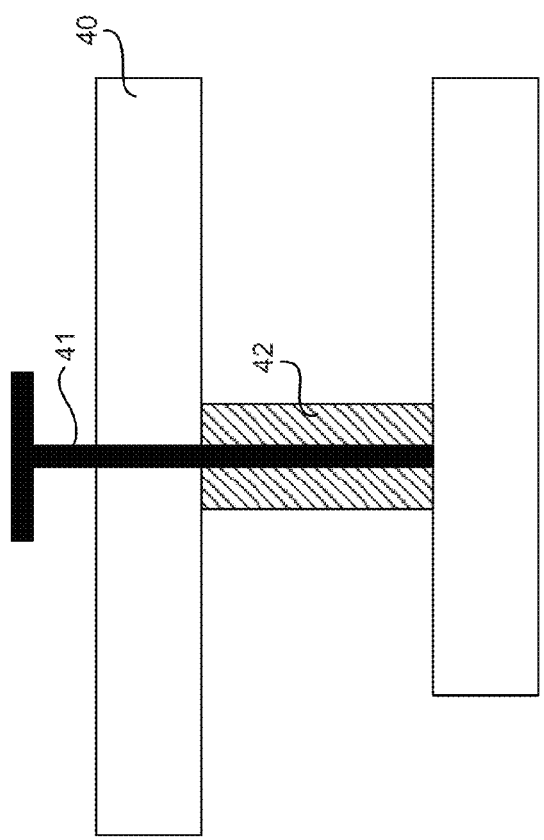
FIG. 9 is a side, cut-away view of an example second part of a carrier, which shows a mechanism for elevating a PCB above the support plate.

In the example of FIGS. 5 to 7, a support frame 35 is used to enable the vertical motion of the support plate and PCB. In another implementation, such as that shown in FIG. 9, a support plate 40 floats vertically on capacitive hardware, and the PCB rests on spring-loaded supports 41. As the PCB is pushed downward, the spring 42 compresses, thereby enabling the electrical circuit described above.

FIGS. 5 to 9 show example second parts. An example first part may be substantially similar to the example second parts. That is, an example first part may also include a plate containing traces, a substrate having electrically conductive pins therethrough, a support plate with holes, and a support frame to enable vertical motion of the support plate and PCB. In the first part, the support plate holes and the pins may be arranged to match the configuration of electrical contacts on the top of the PCB. The electrical circuit that results from compressive connection of the PCB, the support plate, the pins, and the traces may be to the same electrical connector that connects to the second part, or to a different electrical connector.

Figure 10:
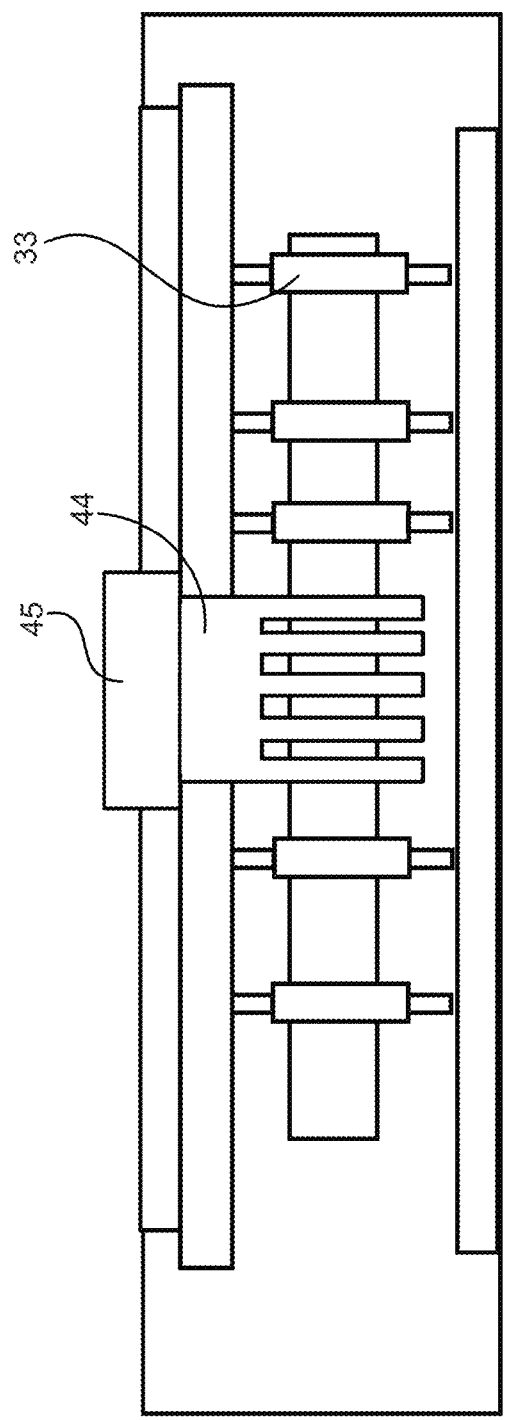
FIG. 10 is a side, cut-away view of an example second part of a carrier, which shows an example heat sink.

In some implementations, chips and other circuitry on the PCB act as localized heat sources. This heat can build and can have various adverse effects. To address this, the carrier may include thermally-conductive objects, examples of which include, but are not limited to, heat sinks at locations corresponding to the local heat sources. The heat sinks draw heat from the local heat sources, and dissipate the heat. In this context, drawing the heat may include conducting, convecting, and/or radiating heat away. In some implementations, the heat sinks are structures that are connected to the support plate at locations corresponding to locations on the PCB that have more than a predefined amount of heating. For example, the heat sinks may be placed proximate (e.g., below or above) the locations of chips on the PCB. For example, FIG. 10 shows a heat sink 44 that is placed below a corresponding chip 45 on a PCB. The heat sinks may extend through the support plate, may have a high thermal conductivity and a high electrical resistance in order to reduce the chances that electrical circuits will be created through the heat sinks.

In some implementations, the heat sinks may include multiple pins or posts in order to increase the surface area over which heat is dissipated. In some implementations, the heat sinks may include fins or the like, which also increases surface area dissipation. The heat sink can be any appropriate thermal conductor.

Figure 11:
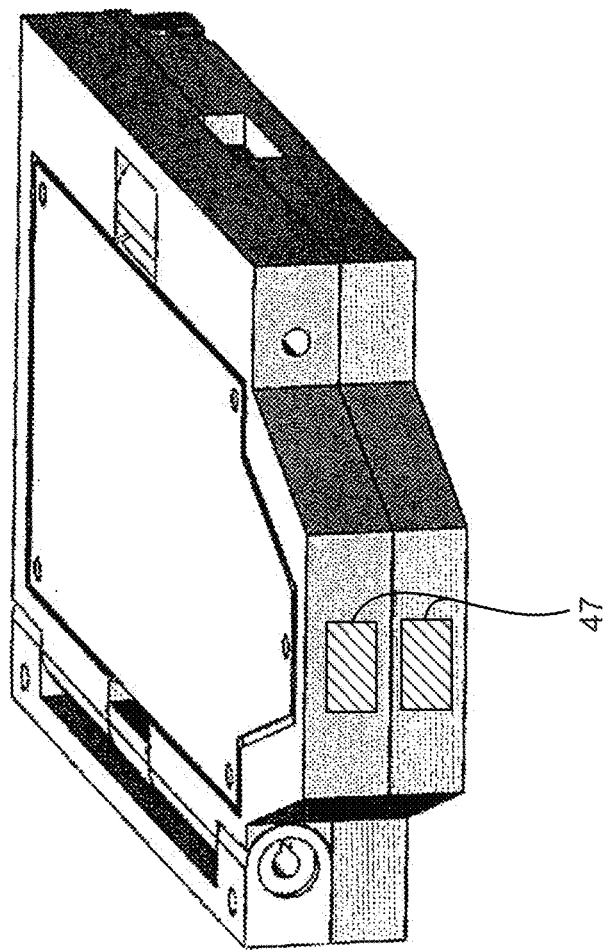
FIG. 11 is a perspective view of an example carrier in a closed position, which shows air pathways, e.g., vents, through which air may pass.

Heat may dissipate from the heat sinks by air flow passing through the slot. To facilitate this dissipation, in some implementations, a carrier may include one or more air pathways or access ports, through which the air may pass. In some implementations, the air pathways or access ports may be vents 47 (FIG. 11). One or more air movers may be included in each slot to bring air into the slot from, e.g., a cool atrium, and to move heated, or warmer, air out of the slot into a warm atrium.

In some implementations, the carrier may include one or more heat sources. The one or more heat sources may be computer-controlled, and used for temperature control inside the carrier. The heat sources may be located along the sides 49, 50 (FIG. 1) of the top and/or second part of the carrier. The heat sources may be run at the same time as the heat sinks dissipate localized heating in order to maintain substantially uniform temperature across the PCB, or to otherwise affect the temperature at one or more locations on the PCB. In other implementations, the heat source(s) may be external to the carrier, and heat therefrom may be provided through one or more air or thermally-conductive pathways into the carrier.

In some implementations, each carrier may have Radio Frequency (RF) shielding so as to reduce the effects of RF cross-talk among PCBs in a rack, or to comply with regulations concerning RF emissions. The RF shielding may enclose all of, or part of, the carrier. The RF shielding may be sheet metal, metal screen, metal foam, metal mesh or any other appropriate material, with openings in the shielding, if any, being smaller than the wavelength of the radiation that is of concern.

In some implementations, the connector may include coaxial cable or other appropriately shielded wire or other environment so as to enable, and test, RF communications to and from the PCB through wired or wireless connection to external RF instrumentation. The RF cable and/or other RF circuitry may be communicatively coupled to the PCB via the test connections described herein to enable wired and/or wireless RF testing. In an example system for wirelessly testing an RF signal transceiver device, a structure, such as the carrier, defines a shield enclosure or a controlled electromagnetic environment which includes interior and exterior regions, with the interior region substantially isolated from electromagnetic radiation in the exterior region. The interior region includes a first interior region that holds the PCB and a second interior region that is around the first interior region. RF-absorbent material(s) may be incorporated into a volume between the first and second interior regions. An electrically conductive signal path is coupled to the PCB and conveys one or more electrical signals between the interior and exterior regions. One or more antennas are disposed at the second interior region to radiate phase-controlled RF test signals. RF signal control circuitry is coupled to the electrically-conductive signal path and to the antennas. The RF signal control circuitry is responsive to a plurality of data signals from the PCT related to the phase-controlled RF signals and conveyed via one or more electrical signals and to an RF test signal by: replicating the RF test signal to provide replica RF test signals, and controlling, in accordance with the data signals, respective phases of at least a portion of the replica RF test signals to provide the phase-controlled RF test signals. An example system for testing an RF system wirelessly is described in U.S. patent application Ser. No. 13/839,583, titled "System and Method for Testing Radio Frequency Wireless Signals Transceivers Using Wireless Test Signals", the contents of which are incorporated herein by reference as if set forth in full.

In some implementations, the carrier includes circuitry configured to emulate a power source, such as a battery, that is usable in a product for which the PCB is intended. For example, if the PCB is intended to be part of a smartphone, the emulation circuitry will emulate the battery of that smartphone, and power the PCB. Including emulation circuitry in the carrier can enable testing of the PCB under conditions that more accurately simulate actual operating conditions.

The carrier described above may be used in any appropriate testing system, examples of which are provided below. In this regard, the systems described below are described with respect to testing PCBs. However, they may be used to test any EA, device, or system massively and in parallel.

Figure 12B:
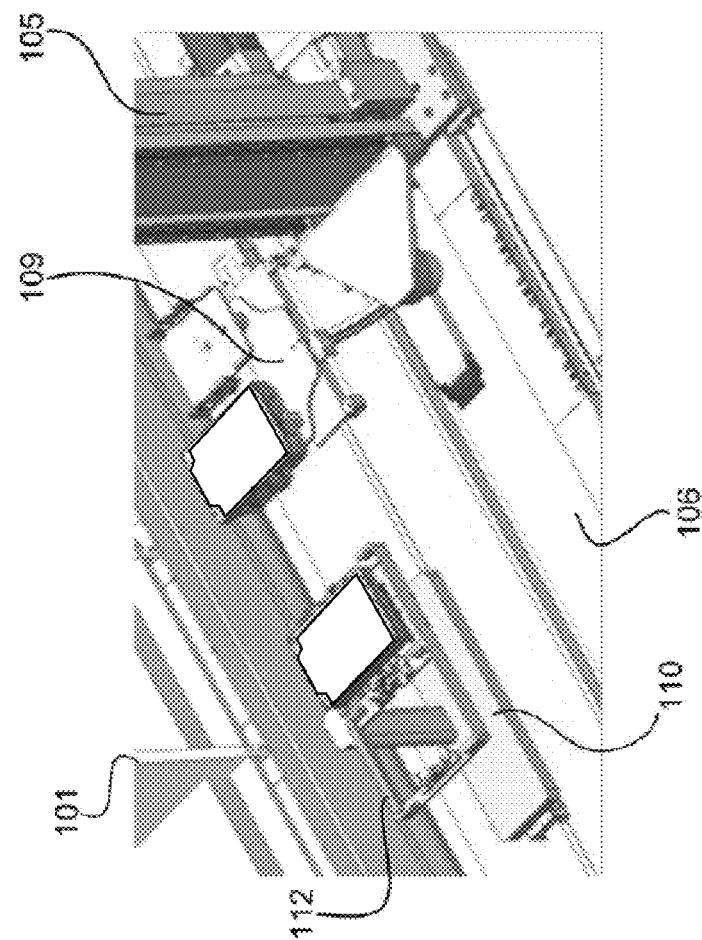
FIG. 12B is a perspective close-up view of a shuttle and an elevator shown in the example system of FIG. 12A.
Figure 12A:
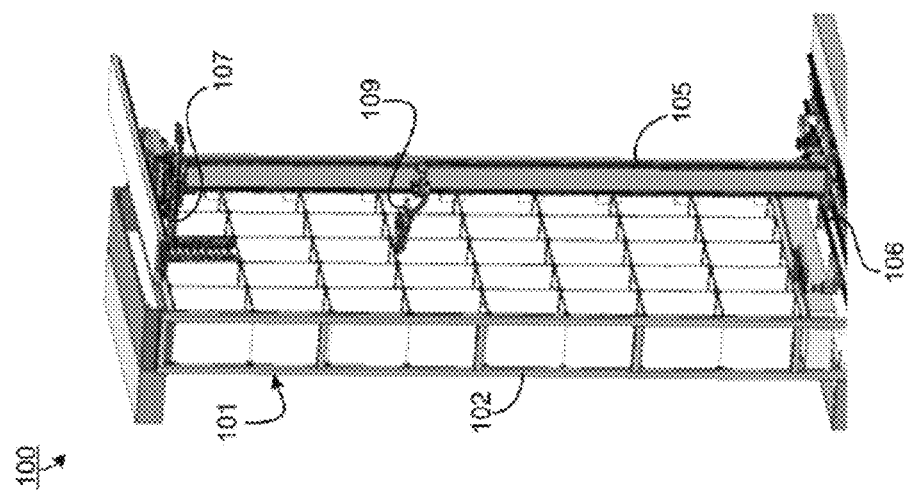
FIG. 12A is a perspective view of a front of an example test system, in which the carrier may be used in testing multiple PCBs in parallel.

Referring FIG. 12A, an example PCB testing system 100 may include multiple test racks 101 (only one depicted) and automated elements to move PCBs housed in carriers, such as those described above, between a feeder and the test racks. The test racks may be arranged in horizontal rows and vertical columns, and mounted in one or more chassis. As shown in FIG. 12A, each test rack 101 generally includes a chassis 102. Chassis 102 can be constructed from a plurality of structural members (e.g., formed sheet metal, extruded aluminum, steel tubing, and/or composite members) that are fastened together and that together define receptacles for corresponding test slots or packs of test slots. Each rack houses multiple test slots. Different ones of the test slots may be used for performing the same or different types of tests and/or for testing the same or different types of PCBs.

In an example implementation, a rack 101 is served by a mast 105. In this example, "servicing" includes moving untested PCBs (in carriers) into test slots in the rack, and moving tested PCBs (in carriers) out of test slots in the rack. An example of a mast 105 used to service test rack 101 is shown in FIG. 12A.

In the example of FIG. 12A, mast 105 includes magnets (not shown) and a linear motor (not shown) that enable mast 105 to move horizontally along a track 106. The combination of a linear motor and magnets may eliminate the need for belts or other mechanics that can complicate the construction of the system. However, in other implementations, belts or other mechanics may be used, at least in part, to move the mast along the track.

In some implementations, track 106 may run substantially parallel to the front (see, e.g., FIGS. 12A and 12B) of rack 101. In this context, the "front" of a rack is the side of the rack from which carriers can be loaded into, and removed from, slots in the rack. In other implementations, carriers can be loaded into, and removed from, both sides (back and front) of a rack. In such implementations, as described below, there may be a track on each side (e.g., front and back) of the rack, with each such track serviced by a separate mast.

In some implementations, mast 105 includes an automation arm 107 for removing carriers from, and inserting carriers into, corresponding test slots in the rack. In an example implementation, automation arm 107 is a structure that supports a carrier, and that projects from the mast to a slot during engagement with a slot, and that retracts towards the mast when disengaging from the slot. Automation arm 107 is movable vertically along mast 105 to align to a slot to be serviced. In this regard, as noted above, mast 105 moves horizontally along track 106. The combination of the mast's horizontal motion and the automation arm's vertical motion enables servicing of any slot in a test rack. At least part of the horizontal and vertical motions may be concurrent.

Figure 13:
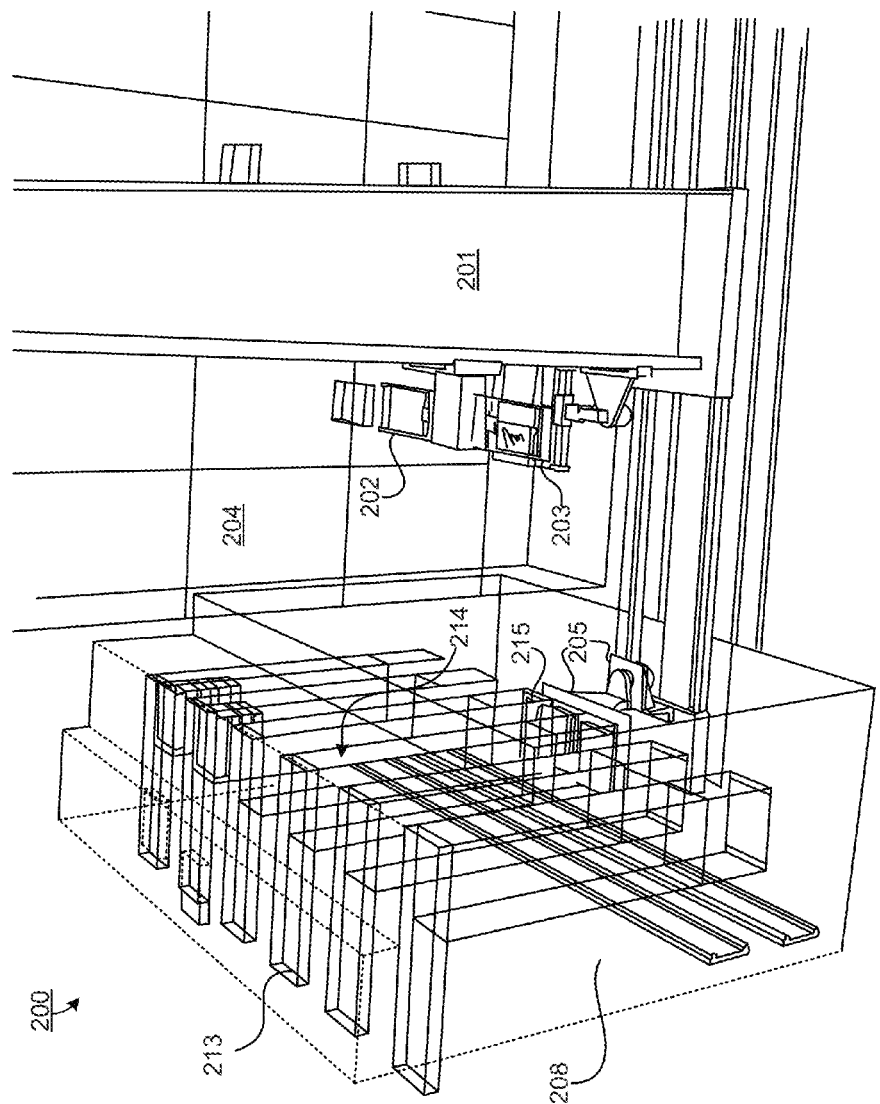
FIGS. 13 to 26 are perspective views that depict an example operation of an example test system of the type shown in FIGS. 12A and 12B.

Referring to FIG. 13, in some implementations, a mast 201 contains two automation arms 202, 203, with one on each side of the mast. Each automation arm is configured to service a corresponding rack. So, for example, automation arm 202 services rack 204. Automation arm 203 services another rack (not shown) facing rack 204. In the examples of FIGS. 12A and 13, the automation arm is not rotatable relative to the mast. This is why there are two automation arms—one for each side of the mast. In other implementations, a single automation arm may be used, and that automation arm may be rotatable to service racks on each side of the mast. In some implementations, the automation arm can have multiple degrees of movement. In some implementations, the automation arm can be fixed to the mast to serve two sides of the mast or pivotal to serve the two sides.

Referring to FIG. 12B, elevator 109 is movable vertically along mast 105 between the location of a shuttle 110

(described below) and the location of the automation arms. Elevator 109 is configured to receive a carrier containing a PCB to be tested from the shuttle, to move that carrier containing the PCB vertically upwards along the mast to reach an automation arm, to receive a carrier containing a tested PCB from the automation arm, and to move the carrier containing the tested PCB vertically downwards to reach the shuttle. Mechanisms (described below) at each automation arm and at the shuttle are configured to move a carrier to/from corresponding mechanisms on elevator 109. In the implementation of FIG. 12A, elevator 109 is rotatable relative to mast 105 to service both of its automation arms. For example, referring to FIG. 13, the elevator may or may not rotate in one direction to service automation arm 202, and in the opposite direction to service automation arm 203. In this context, servicing includes, but is not limited to, exchanging carriers containing tested and untested PCBs with an automation arm.

Shuttle 110 is an automated device that is movable horizontally along a track between a feeder and mast 105. Shuttle 110 is configured to move carriers containing untested PCBs from the feeder to elevator 109, and to move carriers containing tested PCBs from elevator 109 to the feeder. Advantageously, shuttle 110 is operable so that a carrier containing an untested PCB is carried from the feeder to the elevator, and then a carrier containing a tested PCB is carried from the elevator on the shuttle's return trip back to the feeder. This can increase testing throughput, since no shuttle trip is wasted.

Shuttle 110 includes an automation arm 112 for holding carriers containing tested and untested PCBs, and for interacting with elevator 109. As described below, automation arm 112 is controllable to retrieve a carrier containing an untested PCB from the feeder, to transfer the carrier containing the untested PCB to elevator 109, to receive a carrier containing a tested PCB from elevator 109, and to transfer the carrier containing the tested PCB to the feeder. In the implementation of FIG. 13, the shuttle automation arm is rotatable relative to the mast. As such, shuttle 205 is rotatable so that it faces either mast 201 or feeder 208 (see FIGS. 14 and 15). In some implementations, as described in an example below, the shuttle's automation arm need not rotate in this manner.

Referring to FIG. 13, an example feeder 208 is configured to move carriers containing untested PCBs to the shuttle, and to accept carriers containing tested PCBs from the shuttle. Carriers containing untested PCBs may be loaded manually or automatically into feeder 208, and carriers containing tested PCBs may be unloaded manually or automatically from feeder 208. For example, carriers may pass through conduits 213 and down/up towers 214 to a loading/unloading area 215. In some implementations, the shuttle may move left to right along another track (not shown) that is parallel to the feeders so as to align with different towers. In other implementations, as described below, there may be multiple shuttles, along multiple tracks, which access different loading/unloading areas of different towers of feeder 208.

Figure 14:
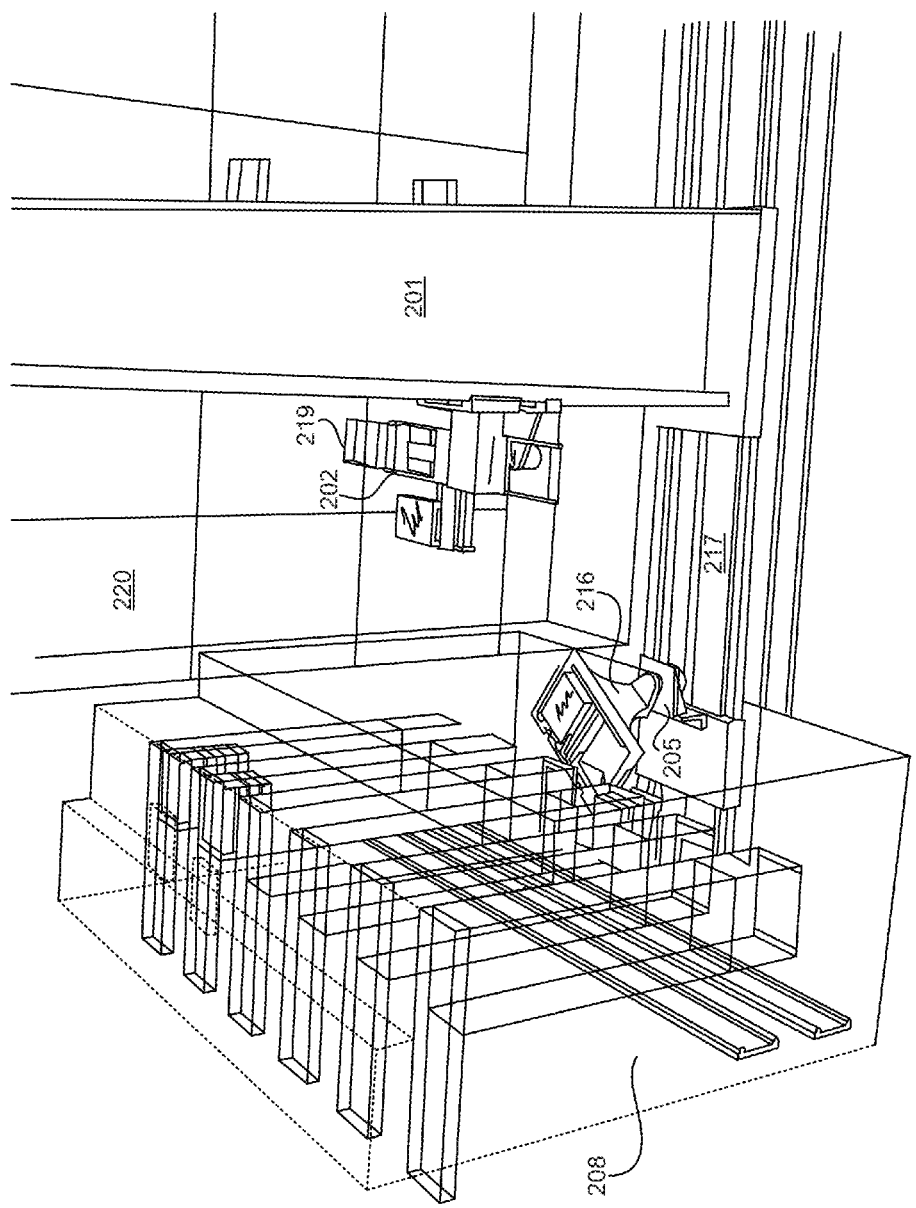

FIGS. 13 to 26 show an example operation of example a test system 200 that includes features of the type described above with respect to FIGS. 12A and 12B. In FIG. 2, shuttle 205 is at a loading/unloading area of feeder 208. There, shuttle 205 receives a carrier containing an untested PCB. As shown in FIG. 14, automation arm 216 rotates from the loading/unloading area toward mast 201. This may be done as shuttle 205 moves along track 217 towards mast 201 or it may be done beforehand. Concurrently, in FIG. 14, automation arm 202 of mast 201 engages with a slot 219 in rack 220 containing a carrier with a PCB that has been tested.

Figure 15:
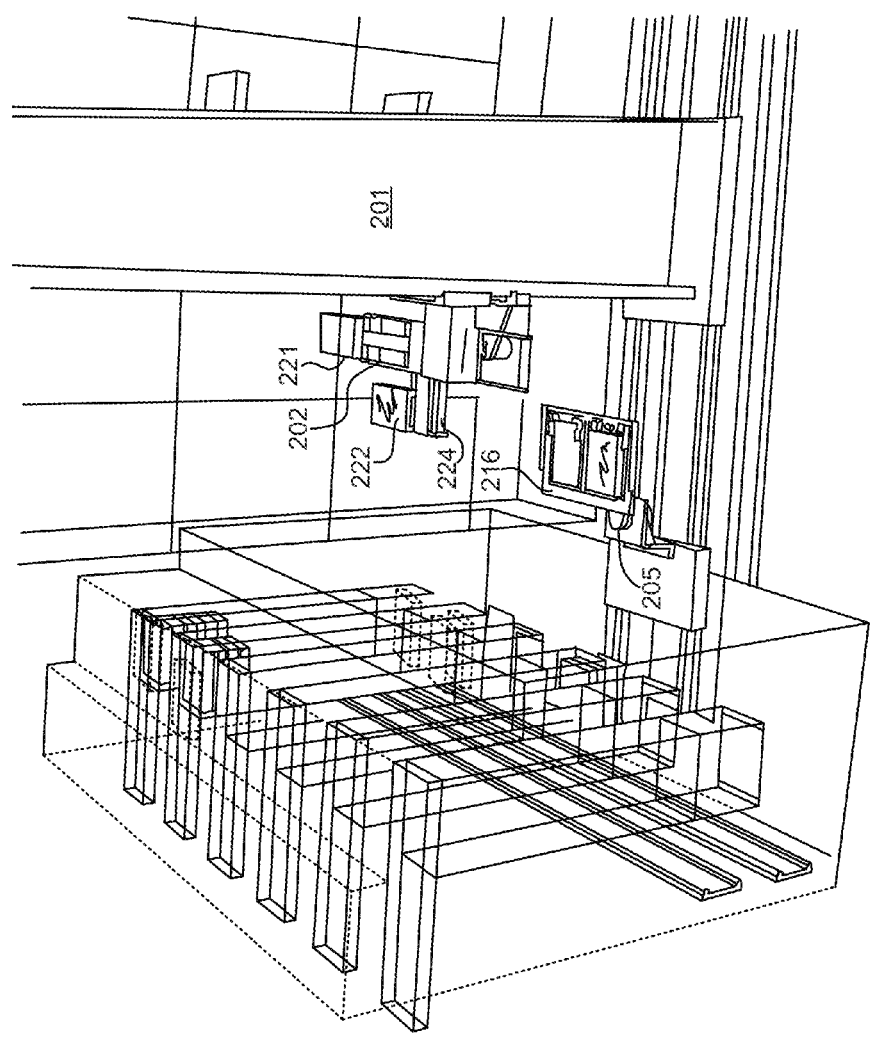
Figure 16:
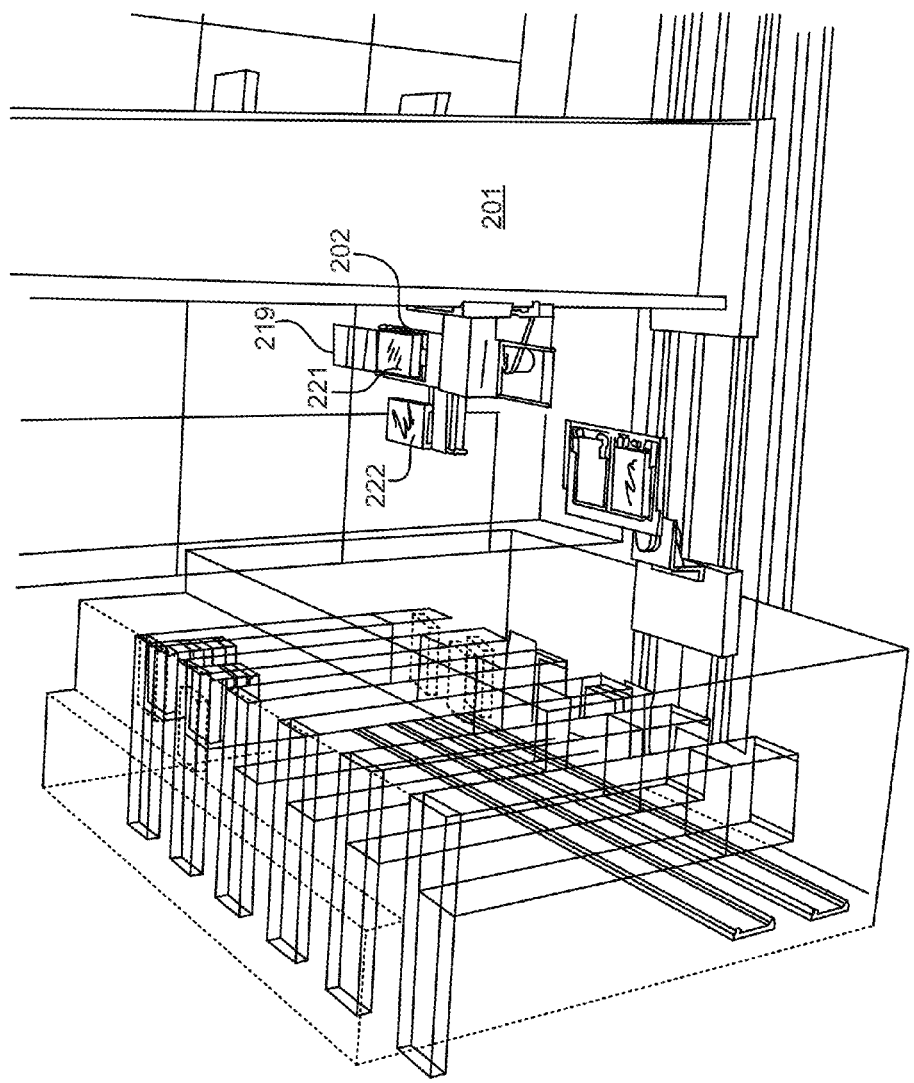

In FIG. 15, a carrier containing tested PCB 221 is output to automation arm 202, while a carrier containing untested PCB 222 remains in elevator 224 ready to be inserted into slot 219. FIG. 15 also shows automation arm 216 of shuttle 205 fully rotated towards mast 201 and traveling towards mast 201. Meanwhile, referring to FIG. 16, a carrier containing a tested PCB 221 continues output into automation arm 202. Eventually, the carrier containing tested PCB 221 is fully output into automation 202, leaving slot 219 empty and ready to receive a carrier containing untested PCB 222.

Figure 17:
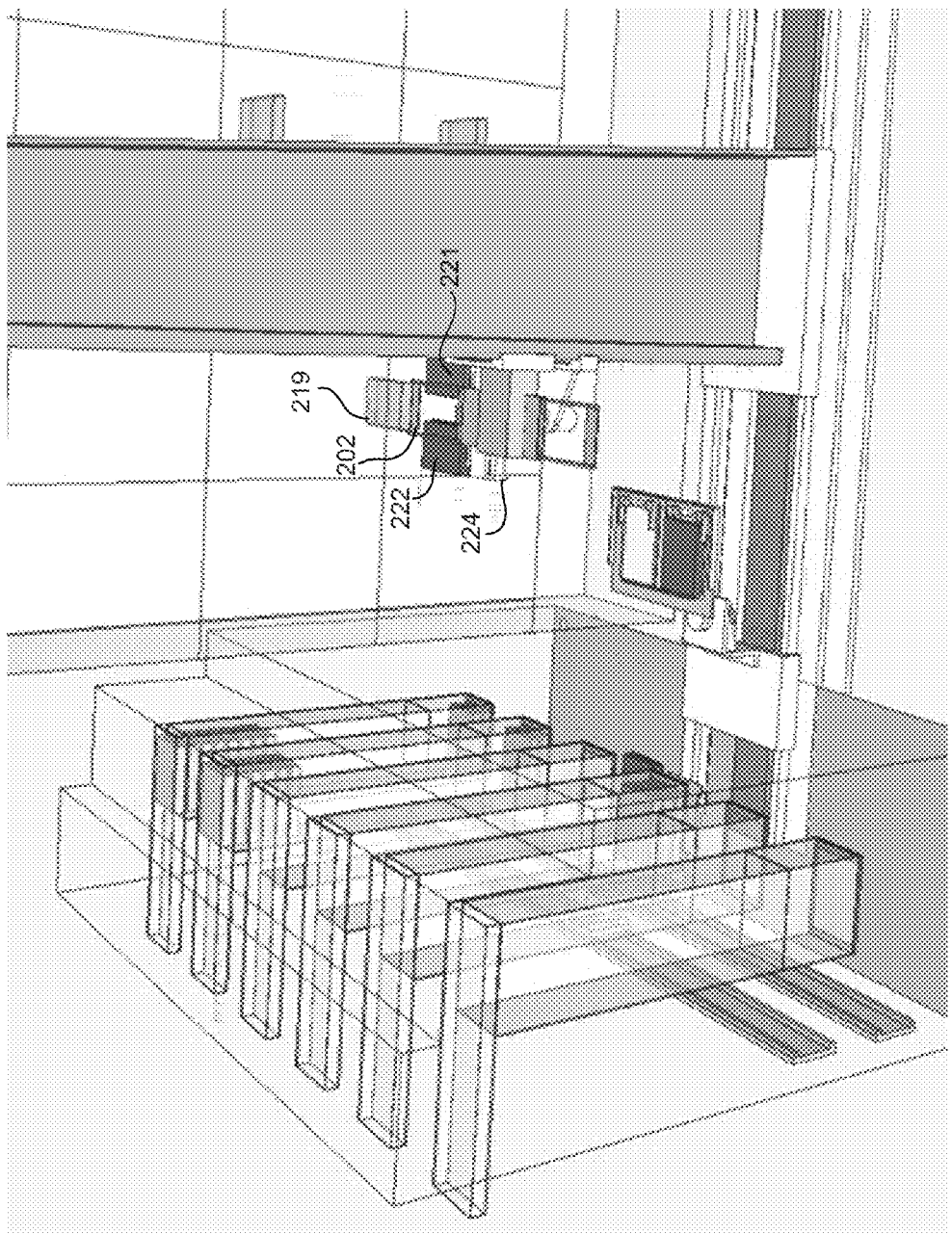
Figure 18:
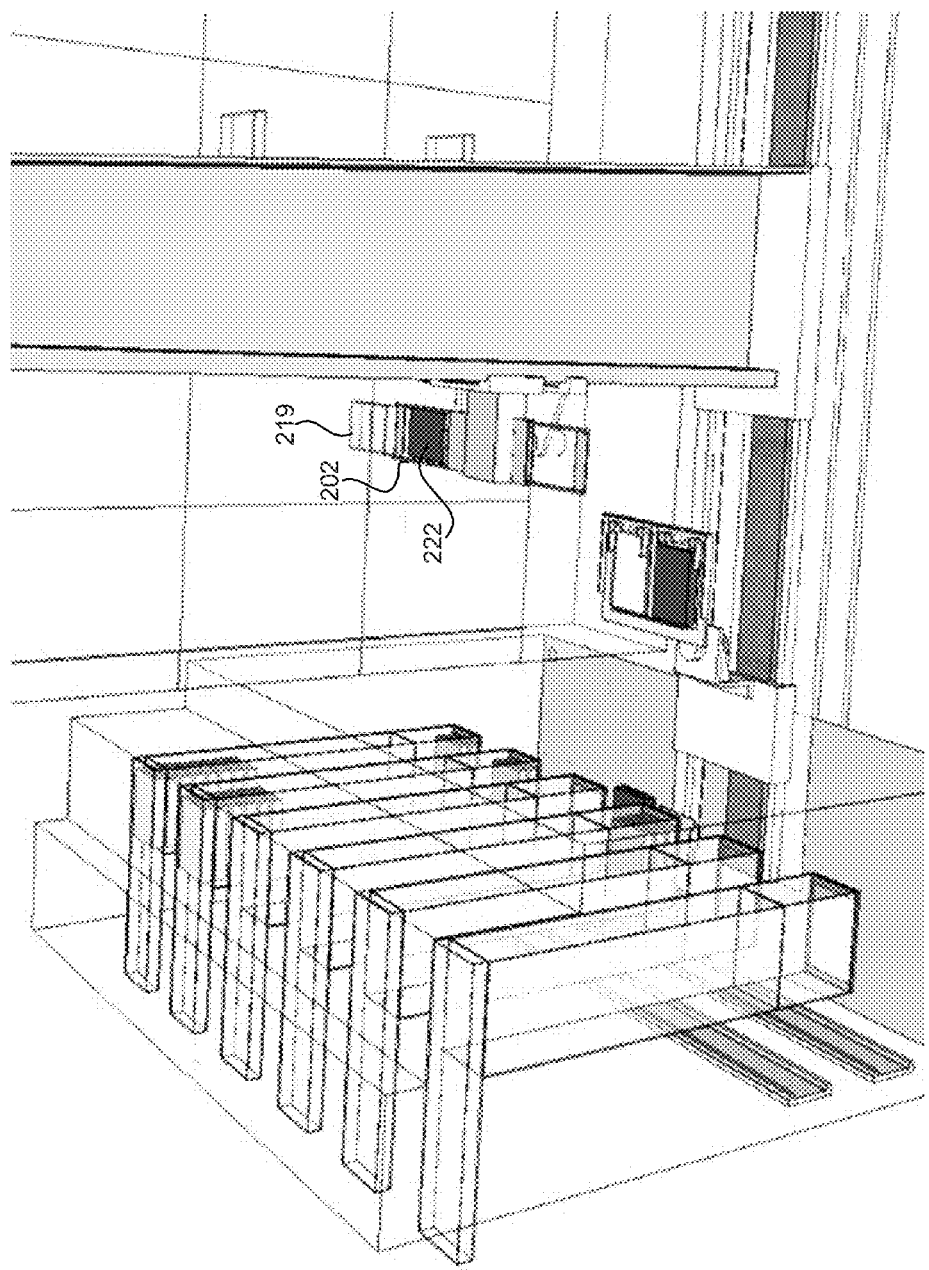
Figure 19:
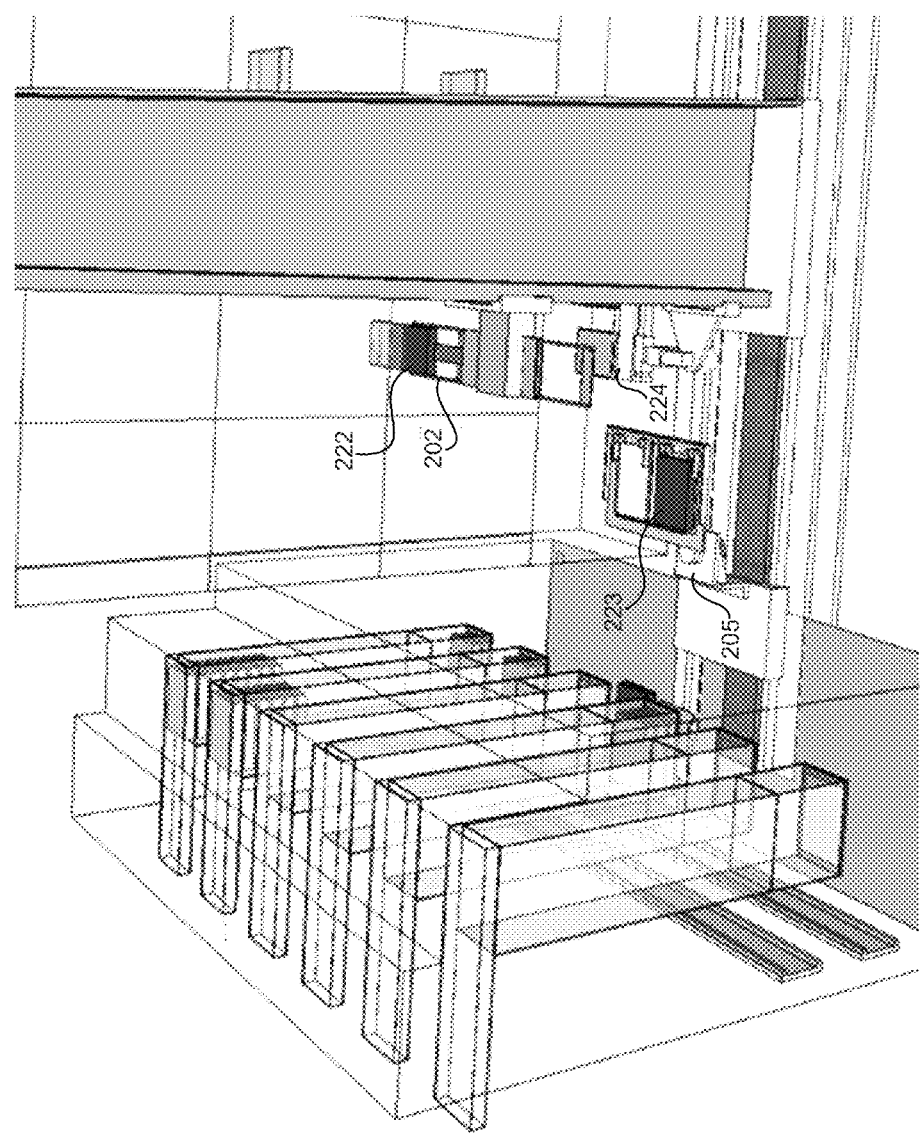

Referring to FIG. 17, elevator 224 shifts sideways to move carrier containing tested PCB 221 out of the insertion path of slot 219 (e.g., out of automation arm 202), and to move carrier containing untested PCB 222 into the insertion path of slot 219 (e.g., into place in automation arm 202). In FIG. 18, carrier containing untested PCB 222 is in automation arm 202, and ready for insertion into slot 219. In FIG. 19, carrier containing untested PCB is inserted (e.g., pushed) by automation arm 202 into slot 219. Meanwhile, elevator 224 moves downward vertically, towards the shuttle 205, which awaits with a carrier containing untested PCB 223 to be loaded into elevator 224. The carrier containing the tested PCB in the elevator may likewise be loaded into the shuttle.

Figure 20:
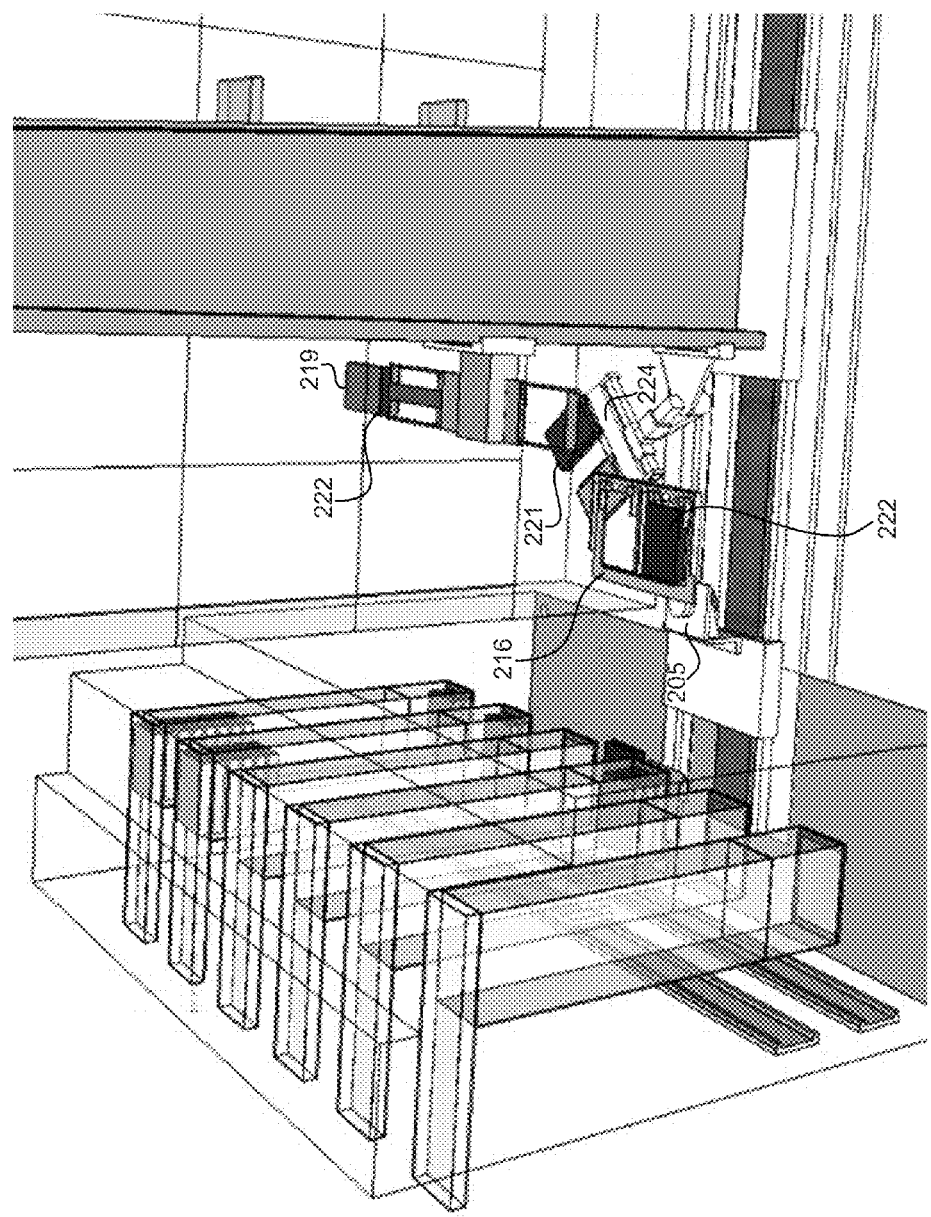
Figure 21:
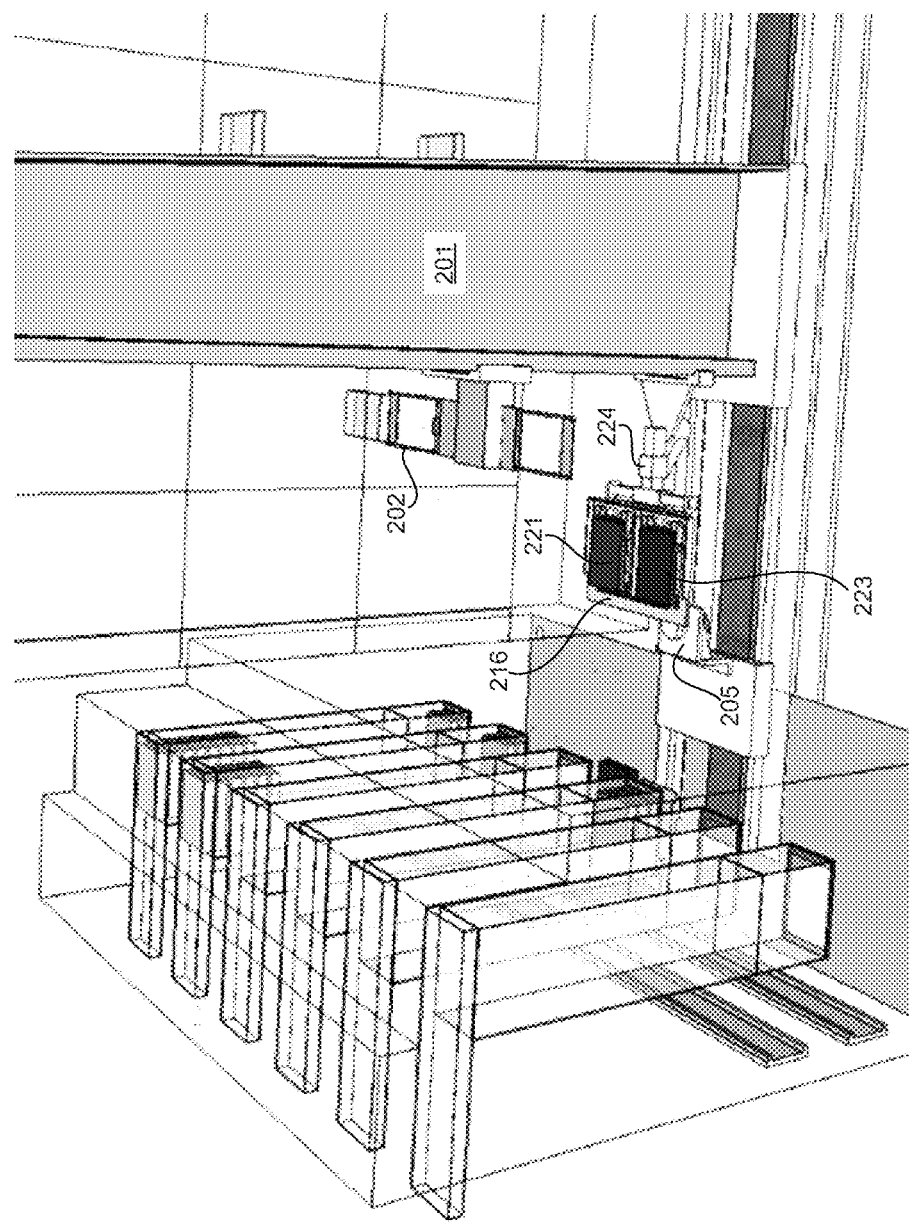

In FIG. 20, carrier containing untested PCB 222 is almost completely inserted into slot 219. Meanwhile, elevator 224, which is holding carrier containing tested PCB 221, rotates towards automation arm 216 of shuttle 205. Elevator 224 hands-off carrier containing tested PCB 221 to automation arm 216 of shuttle 205, as shown in FIG. 21. In some implementations, at about the same time, elevator 224 receives the carrier containing untested PCB 223 from automation arm 216 of shuttle 205. Automation arm 202 of mast 201 disengages from the previously-serviced slot, and moves up or down in a direction of a next slot to be serviced (e.g., towards the slot in which carrier containing untested PCB 222 is to be inserted).

Figure 22:
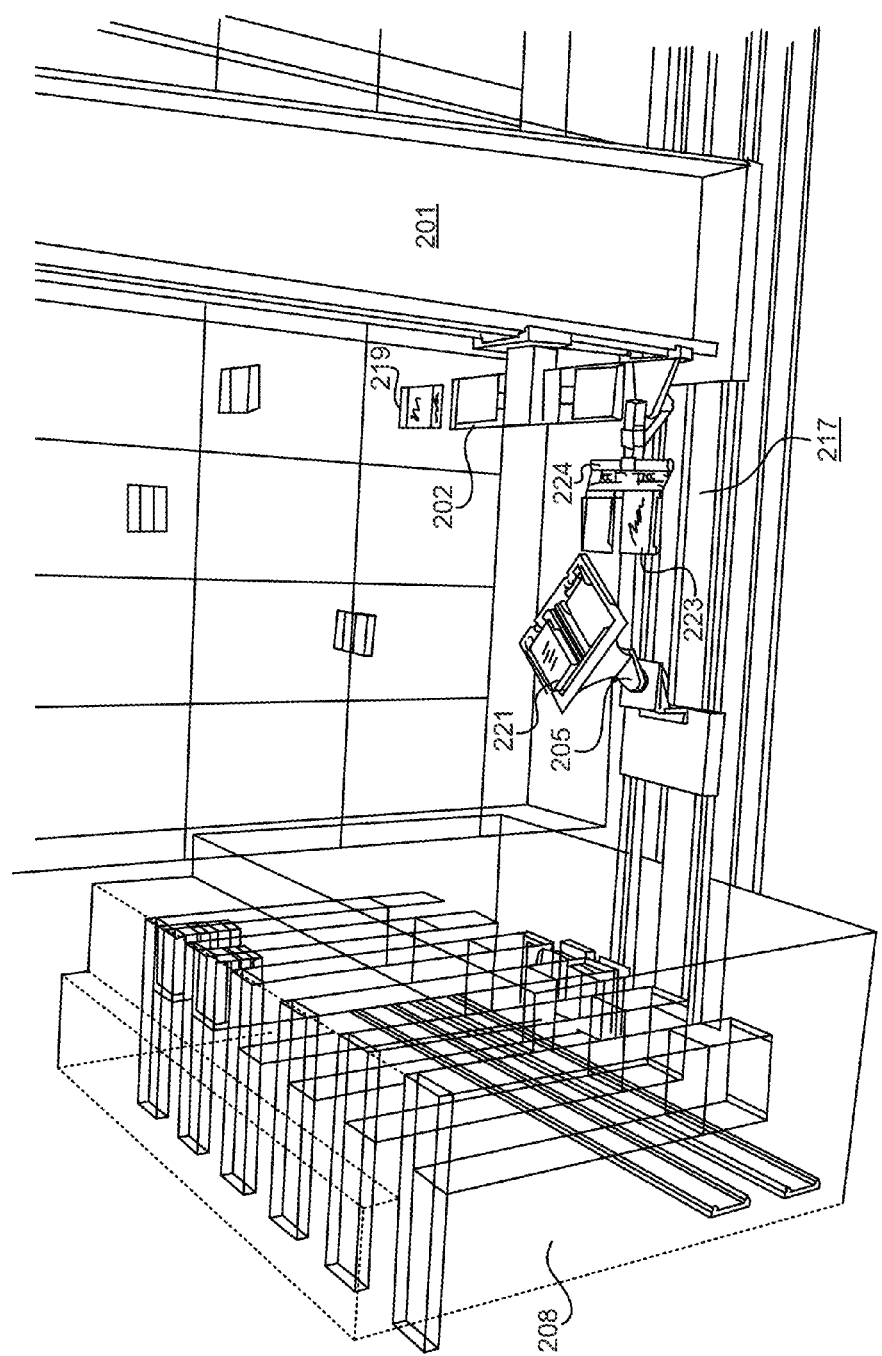
Figure 23:
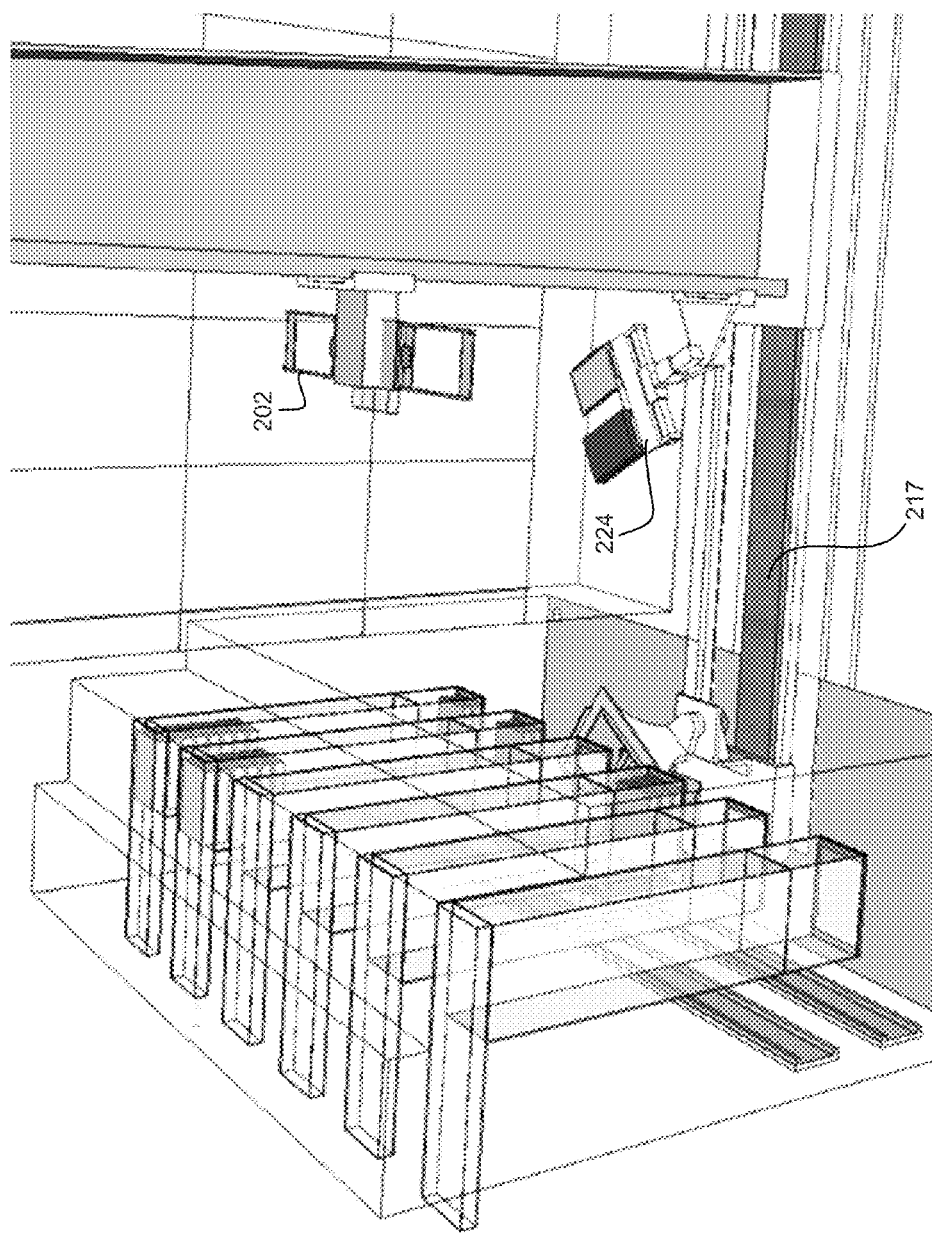
Figure 24:
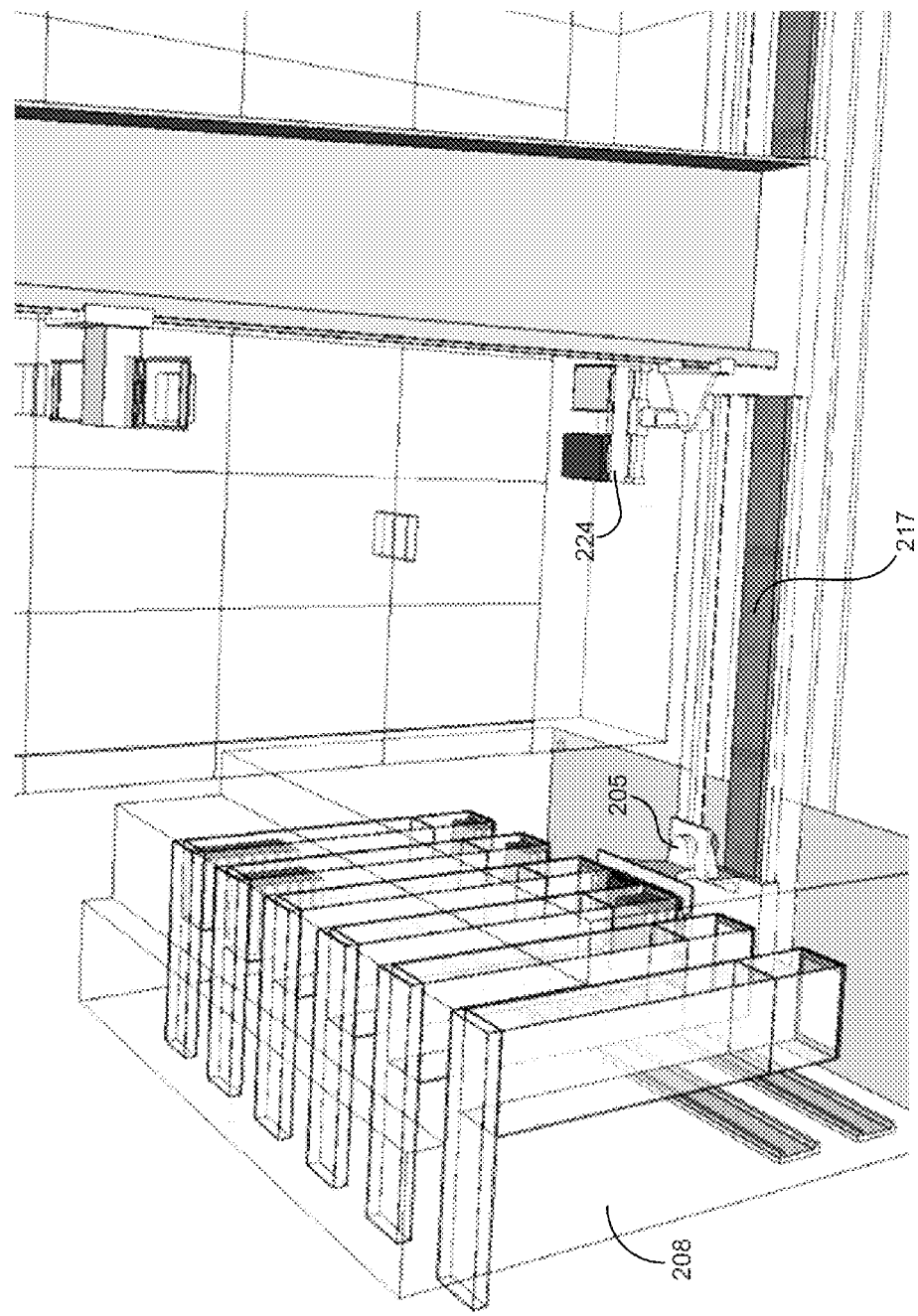
Figure 25:
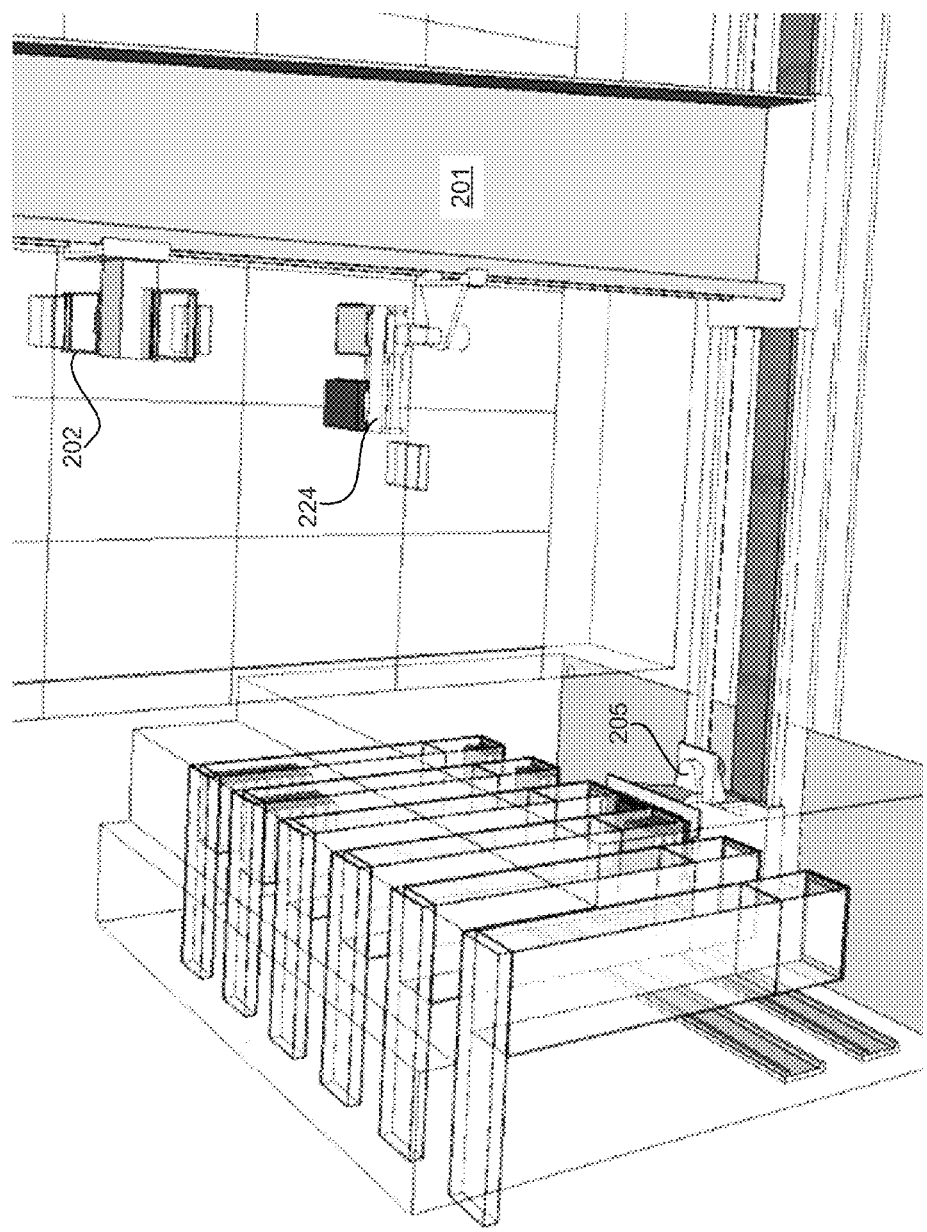
Figure 26:
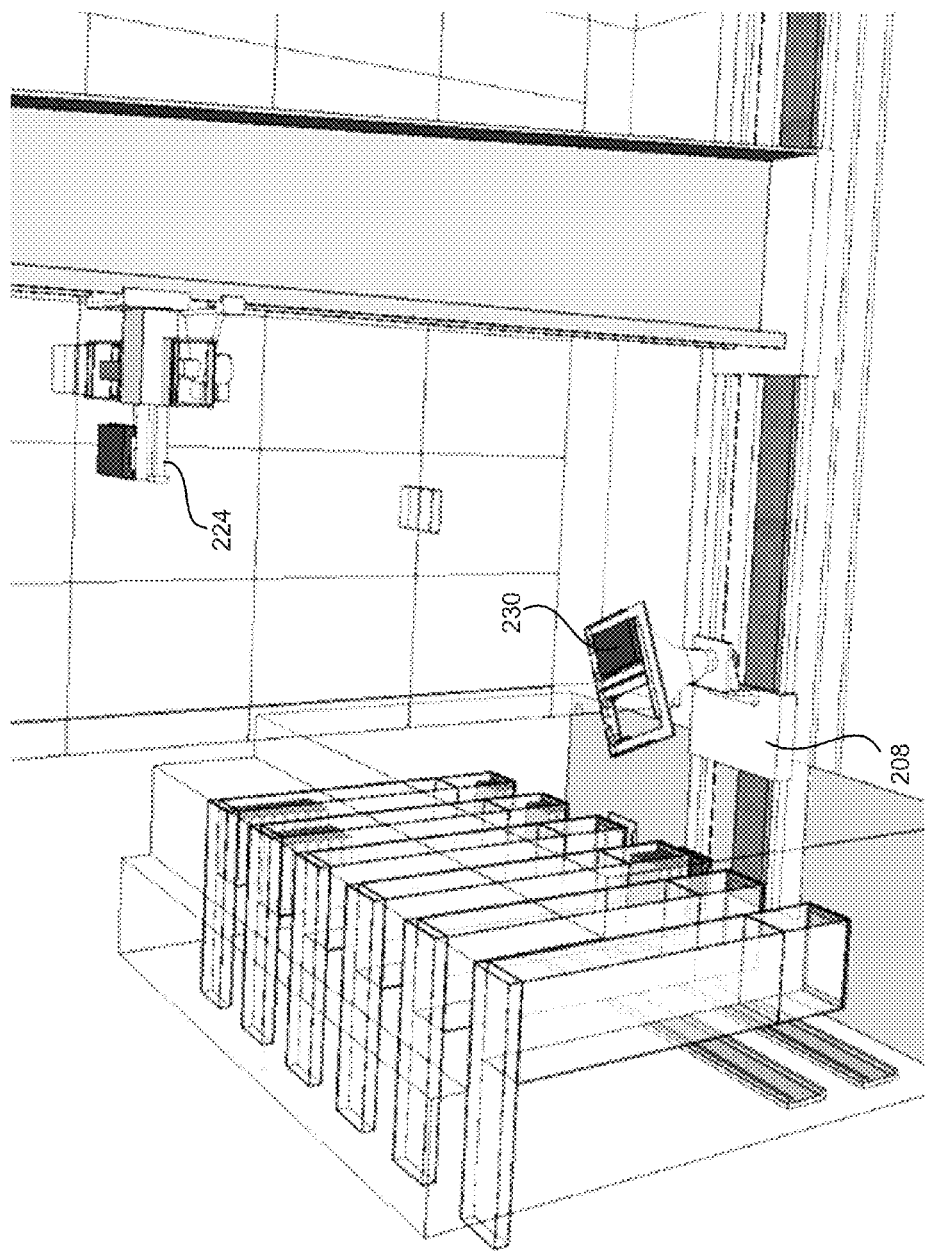

Referring to FIG. 22, automation arm 202 of mast 201 is disengaged from slot 219. Also, elevator 224 has possession of carrier containing untested PCB 223 and shuttle 205 has possession of carrier containing tested PCB 221. In FIG. 22, shuttle 205 is rotating away from mast 201, towards feeder 208, in order to hand-off a carrier containing tested PCB 221 to feeder 208 and pick-up a carrier containing an untested PCB at the loading/unloading station. Meanwhile, referring to FIGS. 22, 23 and 24, mast 201 moves along track 217 towards the next slot to be serviced. This movement may occur at the same time as movement of automation arm 202, 203 vertically along mast 201, until the automation arm reaches the next slot to be serviced. Meanwhile, elevator 224 rotates towards mast 201 to a position so that it can move upwards along mast 201 toward automation arm 202 (or arm 203 if the slot being serviced faces arm 203). The shuttle 205, at this time, deposits the carrier containing tested PCB 221 in feeder 208 and picks-up a carrier containing an untested PCB. FIG. 25 shows further movement of elevator 224 and automation arm 202 along mast 201.

In FIG. 25, elevator 224 moves the carrier containing the untested PCB toward the new slot, e.g., upwards along mast 201. Meanwhile, in FIG. 26, shuttle 205 picks-up a carrier containing an untested PCB to be brought to elevator 224. Thereafter, the process described above is repeated to load/unload PCBs in a test slot.

Figure 27:
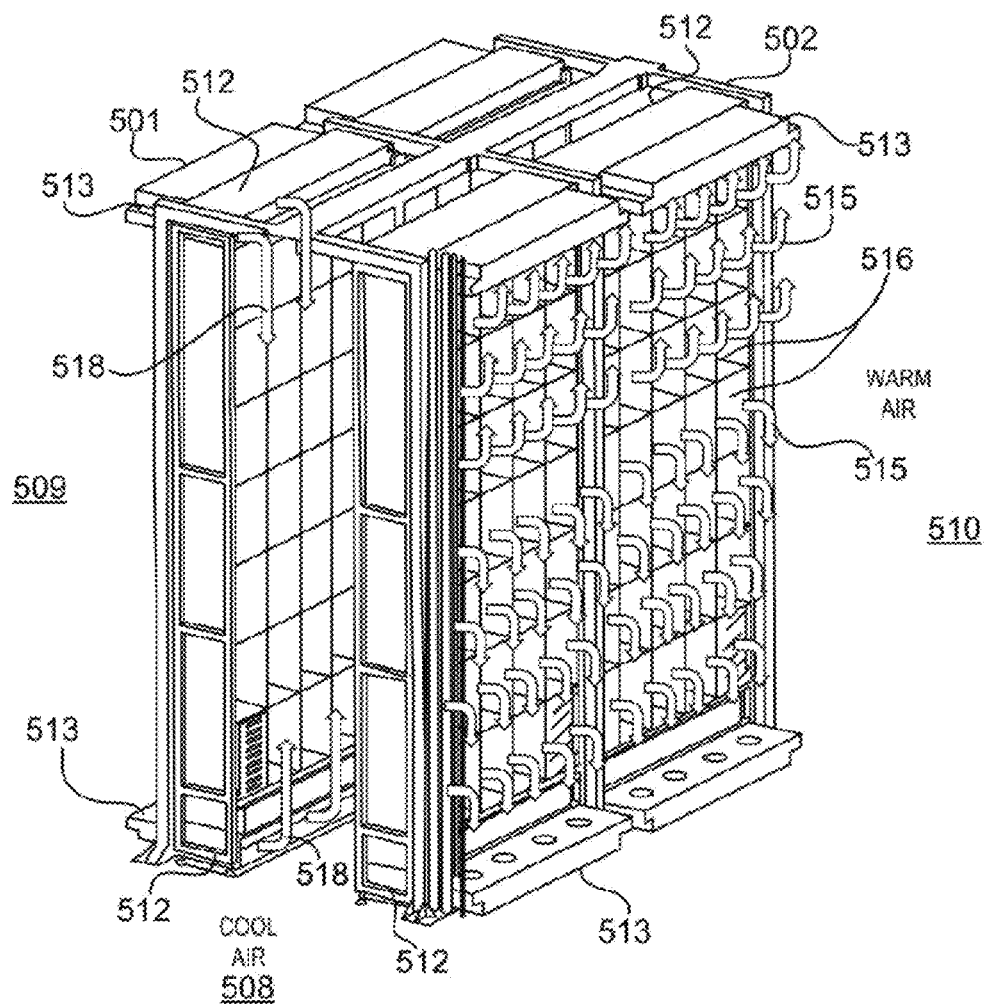
FIGS. 27 and 28 are perspective views of racks in an example test system.
Figure 28:
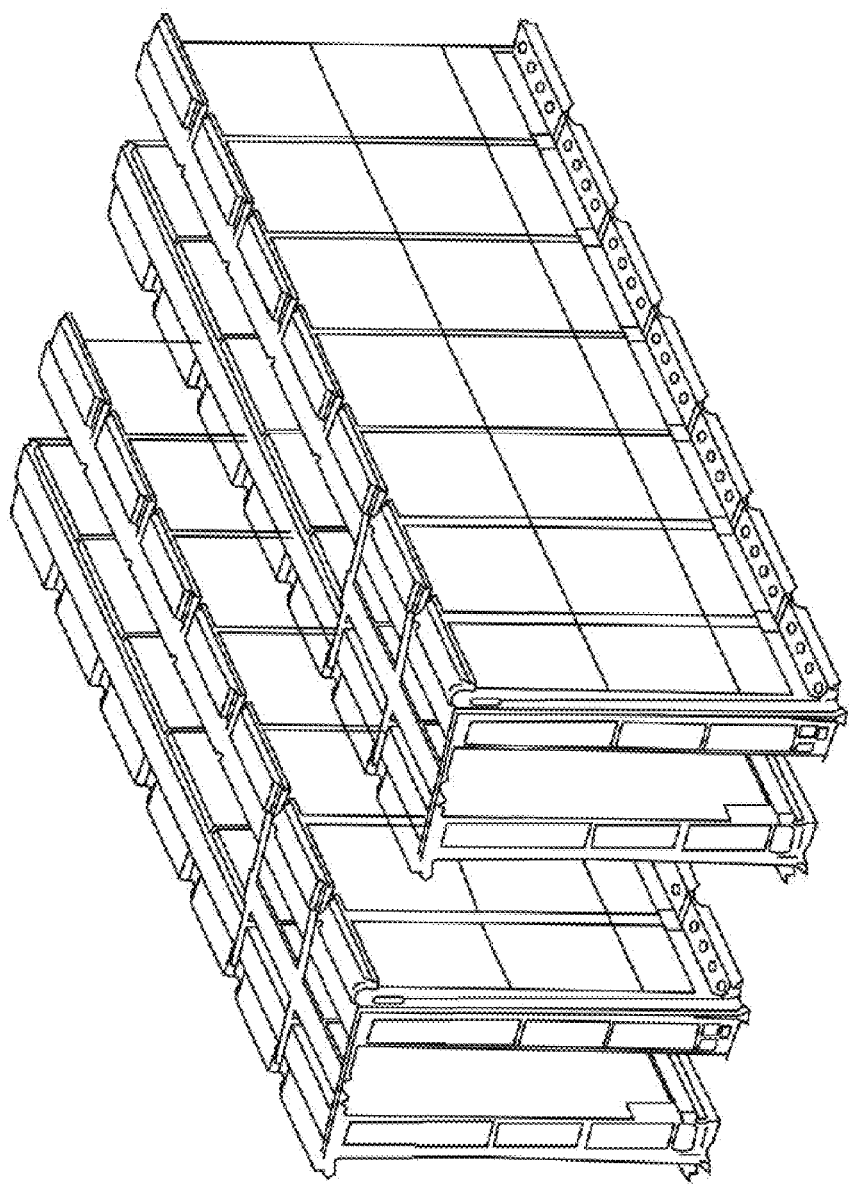
Figure 29:
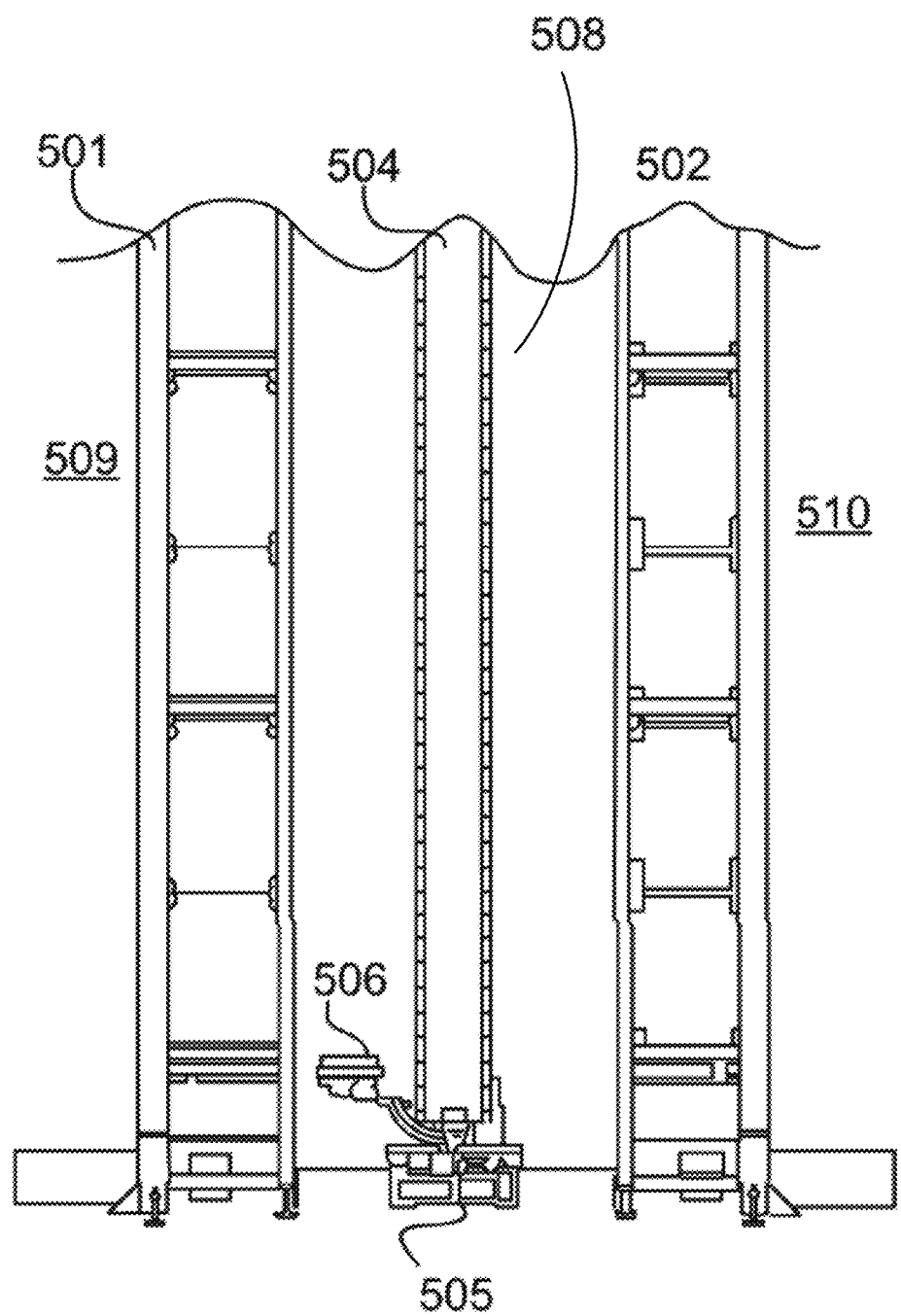
FIG. 29 is a side view of example racks in a test system.

FIG. 27 shows two racks of test slots of the type described above arranged side-by-side. Although only two test racks are shown in FIG. 27, a test system may include any number of test racks arranged side-by-side, as shown in FIG. 28. In the example implementation of FIG. 27, a mast, of the type shown in FIG. 12A, runs along a track between racks 501 and 502 to service slots therein as described herein. The mast and the track are not shown in FIG. 27; however, FIG. 29 is a side view of racks 501, 502, showing mast 504, track 505, and shuttle 506. In some implementations, there may be shuttles on two sides of a mast.

Area 508 between racks 501 and 502 is referred to as a cold atrium. Area 509 outside of rack 501 and area 510 outside of rack 502 are referred to as warm atriums. In implementations like that shown in FIG. 28, there are additional racks adjacent to racks 501 and 502, making at least some of warm atriums semi-enclosed spaces, and at least some of the cold atriums semi-enclosed spaces. In this regard, each atrium may be an open, enclosed, or semi-enclosed space.

Generally, air in a cold atrium is maintained at a lower temperature than air in a warm atrium. For example, in some implementations, air in each cold atrium is below 25° C. and air in each warm atrium is above 25° C. In some implementations, air in each cold atrium is at about 15° C. and air in each warm atrium is at about 40° C. In some implementations, the air temperature in the warm and cold atriums is within prescribed ranges of 40° C. and 15° C., respectively. In some implementations, the air temperatures in the warm and cold atriums may be different than 40° C. and/or 15° C., respectively. The relative air temperatures may vary, e.g., in accordance with system usage and requirements.

During testing, cold air from a cold atrium 508 is drawn through the test slots, and through the carriers in the slots. This is done in order to control the temperature of PCBs during test. Due at least in part to PCB testing and/or operation in the slots, the temperature of the cold air passing over the devices rises. The resulting warm air is then expelled into a warm atrium 510. Air from each warm atrium is then drawn through a corresponding cooling mechanism, and expelled to the cold atrium. From there, the resulting cold air is re-cycled. In the example implementation of FIG. 28, there are one or more cooling mechanisms 512 and corresponding air movers 513 at the top of each rack and at the bottom of each rack. There may be different arrangements and/or mechanisms used in other implementations.

Air flow between the cold and warm atriums is depicted by the arrows shown in FIG. 28. More specifically, warm air 515 exits test slots 516. This warm air 515 is drawn by air movers 513 (e.g., fans) through corresponding cooling mechanisms 512, resulting in cold air 518. Cold air 518 is output towards the center of the rack (either upwards or downwards, as shown). From there, air movers in the slots draw the cold air through the slots, resulting in output warm air. This process/air flow cycle continually repeats to thereby maintain devices under test and/or other electronics a slot within an acceptable temperature range.

Figure 30:
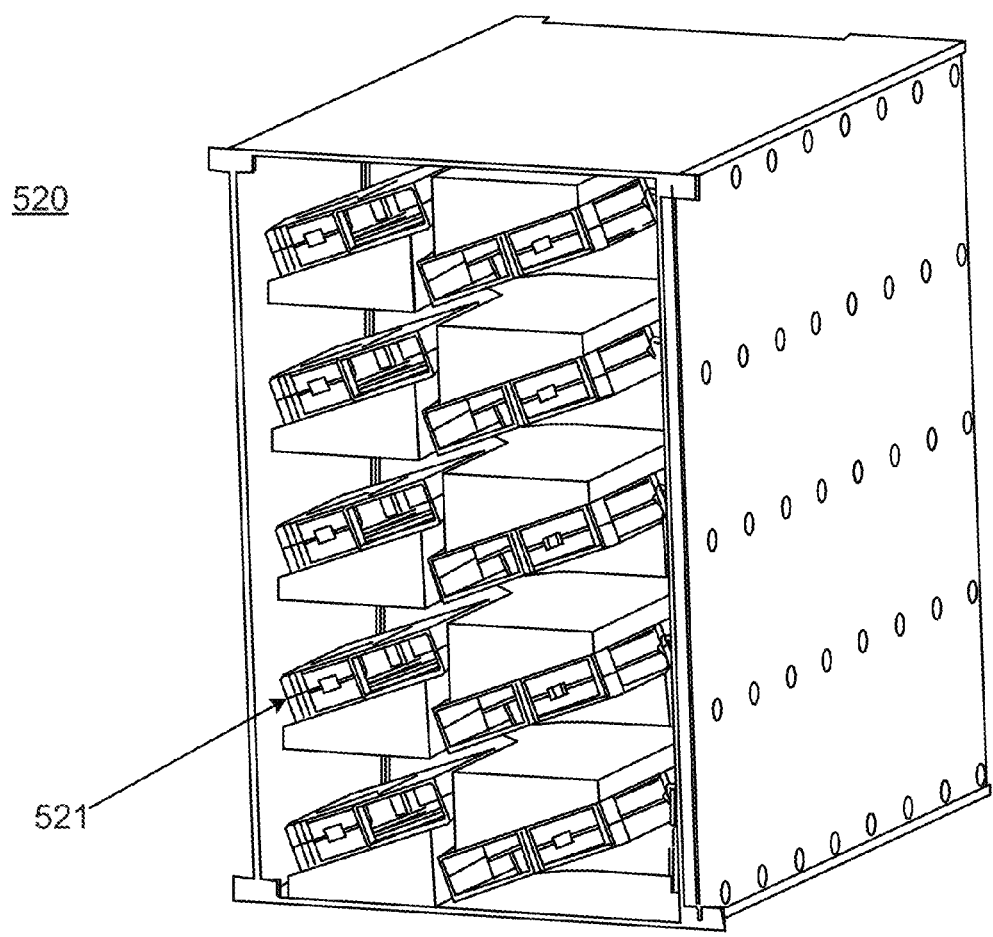
FIG. 30 is a perspective view of example slots in a test system.

In some implementations, slots in a rack are organized as packs. Each pack may hold multiple slots and is mounted in a rack. An example pack 520 is shown in FIG. 30. The example pack 520 includes air movers 521 (e.g., blowers) in each slot, which force air over devices in the slots during testing.

In some implementations, the air blown through a slot is above 25° C., and in some implementations, the air blown through a slot is over 25° C. Accordingly, the air blown through a slot may be either warm or cold.

Referring to FIG. 29, in some implementations, carriers are loaded into slots in the rack only from the cold atrium. In these implementations, the side of the rack from which devices are loaded is referred to as the "front" of the rack. Accordingly, using this convention, the front of the rack faces the cold atrium and the back of the rack faces the warm atrium.

Figure 31:
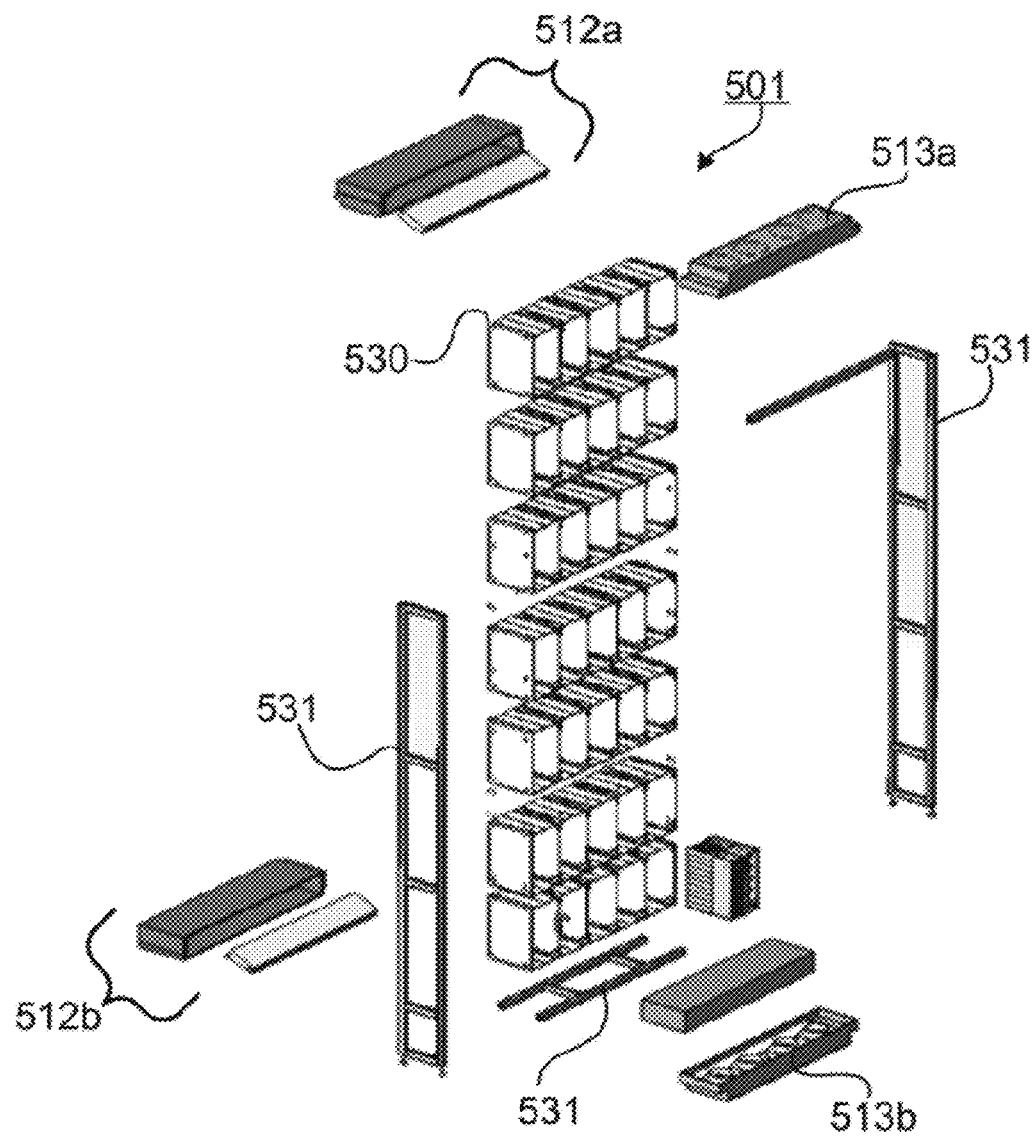
FIG. 31 is an exploded view of components of an example rack in a test system.

FIG. 31 shows an exploded view of components of an example implementation of a rack 501 (or 502) depicted from the front of the rack. Rack 501 includes packs 530 (also referred to as modular bays) containing slots in which devices are inserted for test. The packs are held together by structural members 531, which may be of the type described above. In this example, there are two heat exchanging plenums 512a and 512b, which are examples of the cooling mechanisms described above. One plenum 512a is mounted near or to the base of the rack and another plenum 512b is mounted near or to the top of the rack. As explained above, plenums 512a and 512b receive warm air from the warm atrium, and cool the air (e.g., by removing heat from the warm air using, e.g., a heat exchanger), and expel cold air into the cold atrium.

In some implementations, each air plenum outputs cold air, which moves towards the center of a rack. For example, air may move from the top of a rack towards the center or from the bottom of a rack towards the center. In this regard, air movers create a high pressure area at the plenum exhaust, and the movement of the air through the slots causes a relatively lower air pressure towards the middle of the racks, so the air appropriately diffuses. Air movers in the slots draw this cold air from the cold atrium over devices in the slots.

Figure 32:
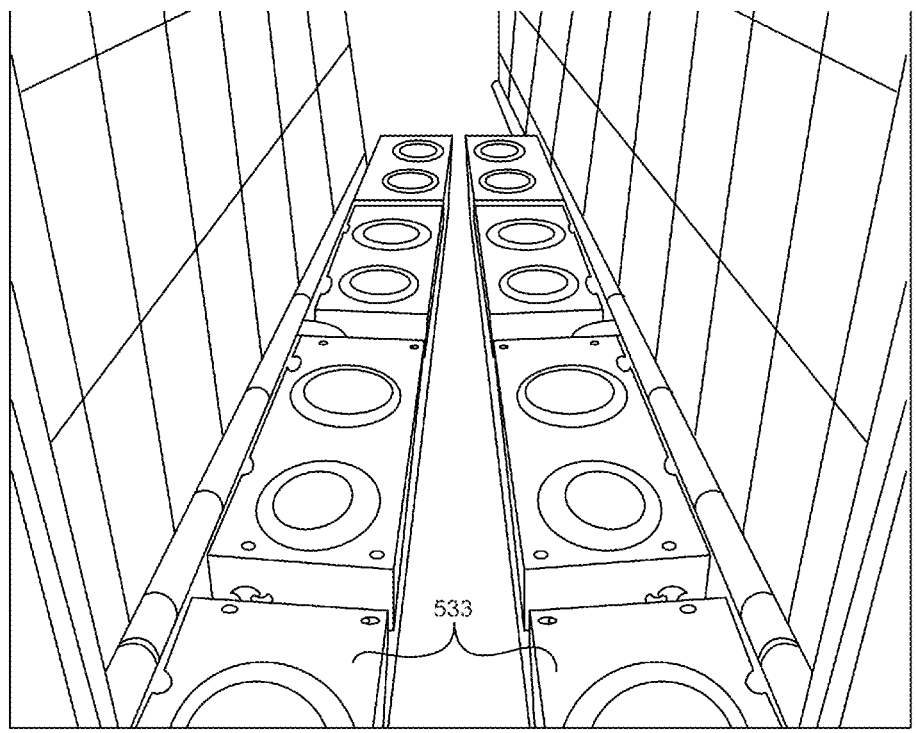
FIG. 32 is a perspective side view of an example warm atrium in a test system.

In some implementations, the warm atrium may include one or more air mover boxes 513a, 513b at the top and/or bottom of the racks. An example interior of a warm atrium is shown in FIG. 32, including air mover boxes 533. Each such air mover box may include one or more fans or other air movement mechanisms. The air movers in the warm atrium draw warm air from the slots towards/into corresponding plenums. The plenums receive this warm air and cool it, as described above. Although only two air mover boxes and corresponding plenums per rack are shown in FIG. 31, there may be different numbers and configurations of air mover boxes and plenums per rack in other implementations.

In some implementations, a grating may be installed over and above air mover boxes at the bottom of the rack, thereby forming a walkway for a technician to access the back of each slot via the warm atrium. Accordingly, the technician may service a slot through the back of a slot, without requiring an interruption in movement of the automated mechanisms (mast, shuttle, etc.) at the front of the rack.

In some implementations, two devices (e.g., PCBs, disposed within corresponding carriers) may be tested in same slot, and those two devices are not physically or electrically connected together in a way that would cause testing, removal or replacement of a PCB in one carrier to have a significant (or any) effect on testing, removal or replacement of a PCB in another carrier that is still in the slot. Also, in some implementations, testing performed on two PCBs in the same slot is not coordinated. Accordingly, the test system may operate asynchronously or mostly asynchronously vis-à-vis the two devices in the same slot.

Implementations that use a two-sided slot will typically employ a mast, shuttle, and other automated mechanisms of the type described herein in both the warm atriums and the cold atriums. Accordingly, in such implementations, there may be less opportunity for a technician to service slots from the warm atrium. However, the increase in throughput resulting from double-sided servicing may make-up for this decrease in serviceability.

Figure 33:
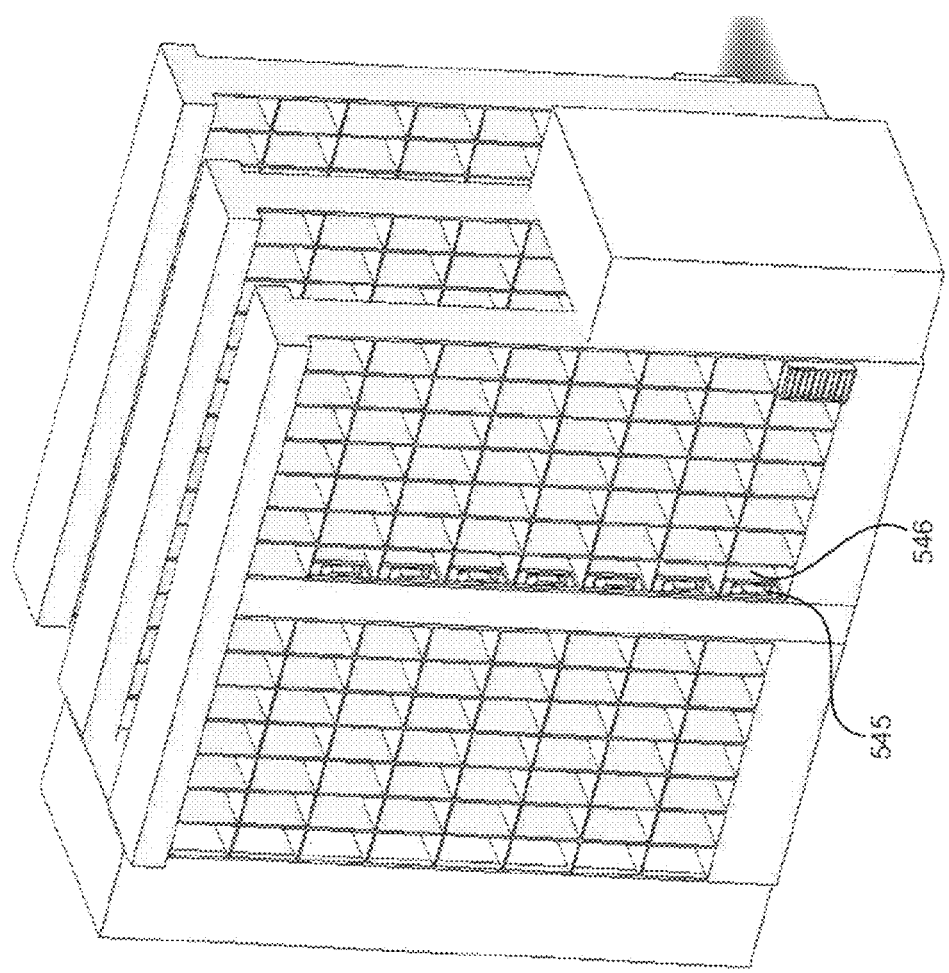
FIG. 33 is a perspective view of an example of a rack containing air movers and heat exchangers mounted in a column of the rack.

In some implementations, the plenums and air movers may be located in a column of each rack instead of at the rack top and bottom. An example implementation in which this is the case is shown in FIG. 33. For example, plenums 545 may be located on the side of the rack facing the warm atrium and air movers 546 may be adjacent to the plenums on the side of the rack facing the cold atrium, or vice versa. A column may service one rack, two racks, or more than two racks. When arranged in this manner, the air movers force the warm air from the warm atrium, through corresponding plenums, resulting in cold air that is expelled into the cold atrium. Because the plenums and air movers are arranged in a column, there is less need to circulate the air from top to bottom of the racks, as in implementations where the plenums and air movers are located at the rack top and bottoms. Furthermore, additional slots can be added at tops and bottoms of the racks to make-up for space taken-up in the columns.

In some implementations, a test system may include a control center, from which one or more test engineers may direct testing of PCBs in the slots. The test system may include or more of the features described herein, either above or below, or it may have different features. In some examples, the test system includes slots for holding devices under test, and automation for moving carriers into, and out of, the slots. In other implementations, the test sites may not be slots, but rather other areas or structures at which a test may be conducted.

Each slot or site of the test system may include one or more processing devices. In some implementations, the processing devices may be in the carriers or there may be different processing devices in the carriers and the slots, which coordinate operation together. In some implementations, a processing device may include, but is not limited to, a microcontroller, a microprocessor, an application-specific integrated circuit (ASIC), a field-programmable gate array (FPGA), a network processor, and/or any other type of logic and/or circuitry capable of receiving commands, processing data, and providing an output. In some implementations, a processing device in each slot is also capable of providing and/or routing power to the slot, including to a device under test in the slot and to other circuit elements in the slot.

Each processing device may be configured (e.g., programmed) to communicate with a device under test (e.g., a PCB) in the slot and with other elements of the slot, such as the slot air mover. For example, each processing device may monitor operations of a device in the slot during testing (including test responses), and report test results or other information back to the control center.

In some implementations, as described above, there may be a single (one) processing device per slot. In other implementations, a single processing device may serve multiple slots. For example, in some implementations, a single processing device may service a pack, a rack, or other grouping of slots.

The communications to/from each processing device may include, but are not limited to, data representing/for testing status, yield, parametrics, test scripts, and device firmware. For example, testing status may indicate whether testing is ongoing or completed, whether the device under test has passed or failed one or more tests and which tests were passed or failed, whether the device under test meets the requirements of particular users (as defined, e.g., by those users), and so forth. Testing yield may indicate a percentage of times a device under test passed a test or failed a test, a percentage of devices under test that passed or failed a test, a bin into which a device under test should be placed following testing (e.g., a highest quality device, an average quality device, a lowest quality device), and so forth. Testing parametrics may identify particular test performance and related data. For example, for a disk drive under test, parametrics may identify a non-repeatable run-out track pitch, a position error signal, and so forth.

In some implementations, test scripts may include instructions and/or machine-executable code for performing one or more test operations on a device held in a slot for test. The test scripts may be executable by a processing device, and may include, among other things, test protocols and information specifying how test data is to be handled or passed to the control center.

A control center for use with the test system may include a computing device. The computing device may include one or more digital computers, examples of which include, but are not limited to, laptops, desktops, workstations, personal digital assistants, servers, blade servers, mainframes, and other appropriate computing devices. The computing device may also include various forms of mobile devices, examples of which include, but are not limited to, personal digital assistants, cellular telephones, smartphones, and other similar computing devices. The components described herein, their connections and relationships, and their functions, are meant to be examples only, and are not meant to limit implementations of the technology described and/or claimed herein.

The computing device includes appropriate features that enable it to communicate with the processing devices in the test system slots in the manner described herein. The computing device (or other devices directed by it) may also control various other features of the example test system described herein, such as the feeder(s), the mast(s), the shuttle(s), and so forth.

Figure 34:
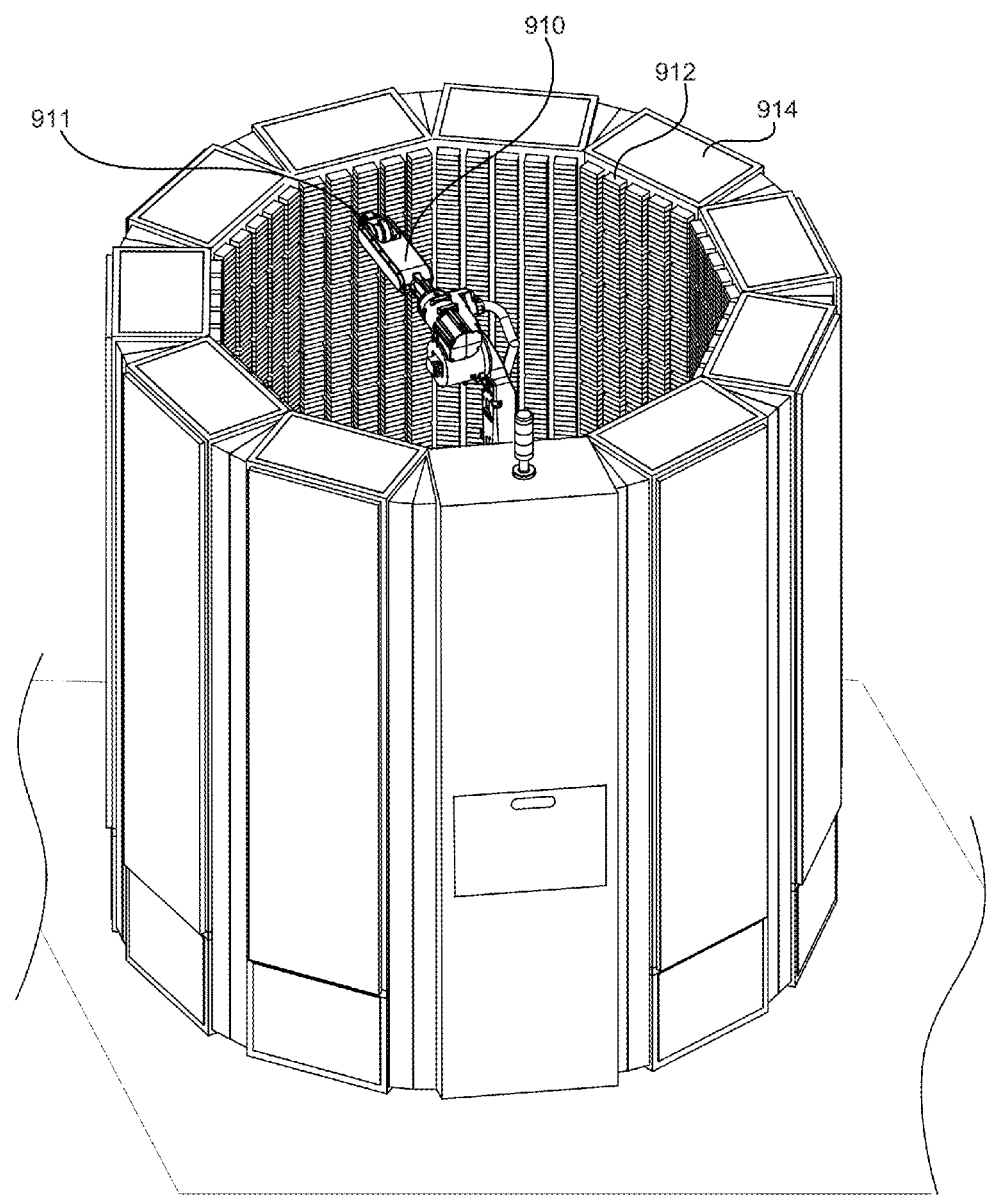
FIGS. 34 and 35 are perspective views of an example test system, in which the carrier may be used in testing multiple PCBs in parallel.
Figure 35:
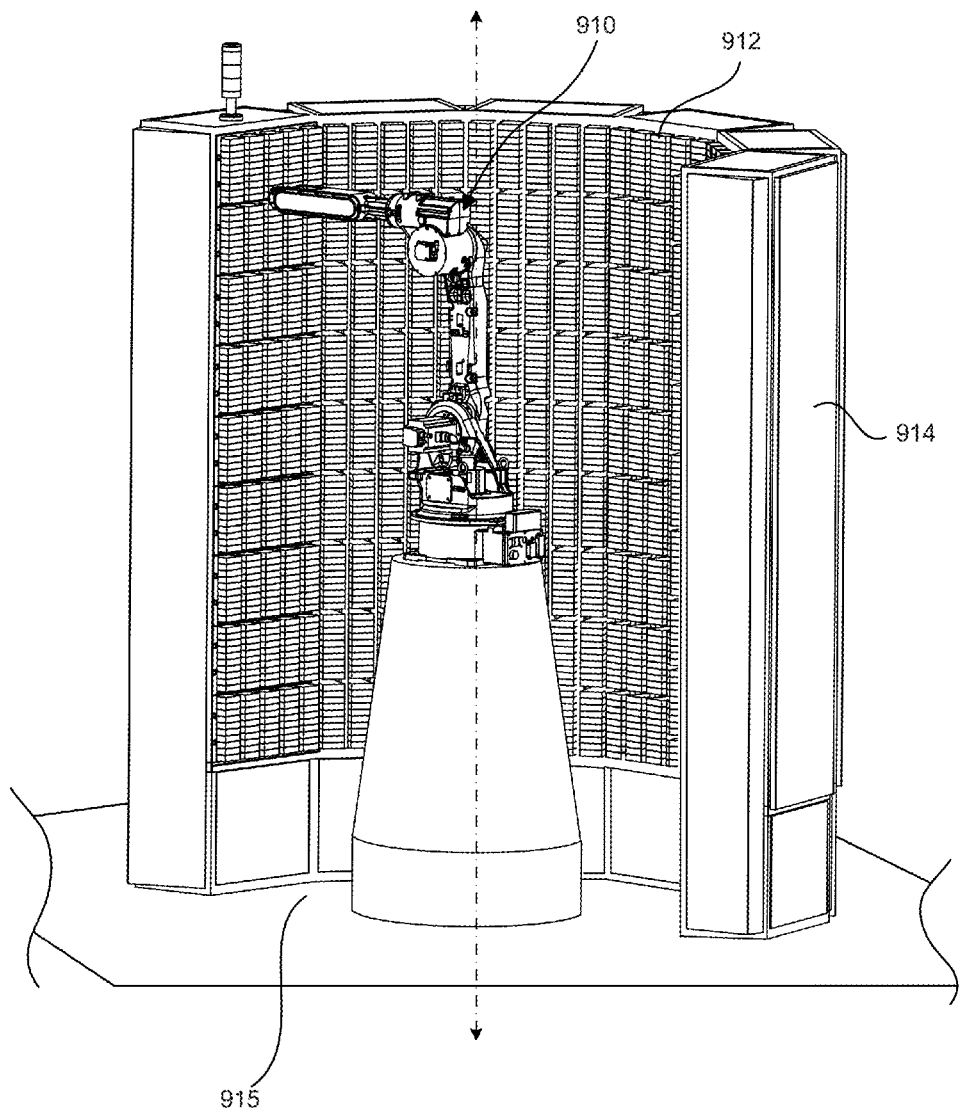

In some implementations, the carriers described herein may be used with a PCB test system having the configuration of FIGS. 34 and 35. As shown in FIG. 34, a PCB test system includes a plurality of racks, a transfer station, and an automated transporter. The automated transporter is located in an atrium, which is a space enclosed by the racks and a canopy. The atrium also serves as a reservoir for chilled air. Referring to FIG. 34, the automated transporter includes a robotic arm 910 and a manipulator 911 (sometimes referred to as an end effector) disposed at a distal end of the robotic arm. The robotic arm defines a first axis normal to a floor surface and is operable to rotate through a predetermined arc about and extends radially from the first axis within an automated transporter operating area. The robotic arm is configured to independently service each test slot 912 in racks 914 by transferring carriers containing tested or untested PCBs between a transfer station and the test racks. In some embodiments, the robotic arm is configured to remove a carrier containing a tested PCB, from a test slot with the manipulator, deposit the carrier at a first location in the transfer station, retrieve a second carrier containing an untested PCB from a second location in the transfer station with the manipulator, and then deposit the second carrier, with the untested PCB contained therein, in the test slot for testing and/or control. After testing or control is complete, the robotic arm retrieves the second carrier, along with the PCB contained there, from the test slot and returns it to the transfer station (or moves it to another one of the test slots) by manipulation of the storage device transporter (i.e., with the manipulator).

FIG. 35 shows a perspective view of a system rack, containing multiple test slot assemblies that can accommodate the carriers described herein. In addition to the test slot assemblies, the rack may contain air movers configured to move air from the cold atrium 915 through the test slots, through a heat exchanger, and back to the cold atrium. The movement of the air from the cold atrium through the test slots and through the heat exchanger serves to control the temperature of the air in the atrium, to be used as a common source of controlled air to provide a temperature control source for the test slots. As described above, additional temperature controls may be provided within the carrier itself.

Any features described herein with respect to FIGS. 1 to 33, and that are appropriate for use with the system of FIGS. 34 and 35, may also be used with the system of FIGS. 34 and 35.

Figure 36:
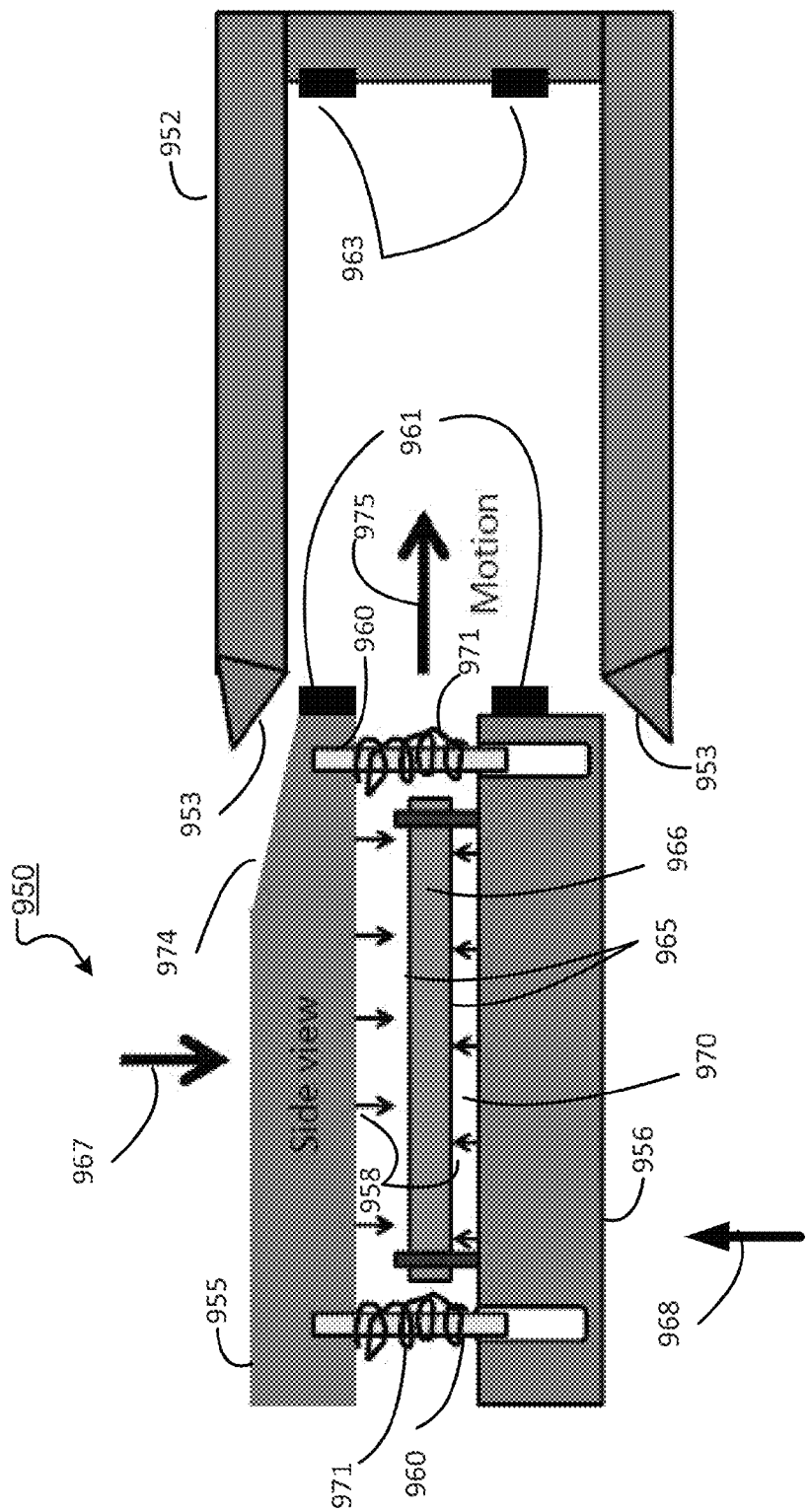
FIG. 36 is a side view of an example carrier in a partially closed position.

FIG. 36 shows another implementation of a carrier 950 that may be used in test systems of the type described herein. In the example implementation of FIG. 36, the test slot includes a pack 952. In this example, there is one carrier per pack and one pack per slot; however, this need not be the case. Rather, in some implementations, there may be multiple carriers per pack and/or multiple packs per slot. Pack 952 has one or more beveled edges 953. These beveled edges assist in closing the carrier, as described in more detail below. In some implementations, the slot need not include a pack, but rather the slot itself may have beveled edges of the type shown in FIG. 36

In the example implementation of FIG. 36, carrier 950 includes, but is not limited to a first part 955 (e.g., a top part), a second part 956 (e.g., a bottom or base part), electrical contacts 958 (depicted as arrows, but not necessarily having that shape), and guides 960. Carrier 950 also includes one or more electrical conduits (e.g., traces, wires, etc.—not shown) to create electrical pathways between the electrical contacts and an electrical interface, e.g., connector 961. Carrier 950 may also include one or more mechanisms for supporting a PCB in the carrier.

In some implementations, the mechanisms may include one or more plates, as described above. In some implementations, the mechanisms may include one or more support pins (also referred to as "tooling pins") that may be supported by second part 956, that do not contact electrical contacts on the PCB, and that hold the PCB. In some implementations, an area of second part 956 (or top part 955) may be routed-out (e.g., hollowed) to match, substantially, the shape of a PCB under test. The PCB may be placed in that area prior to closing the carrier. In other implementations, different types of mechanisms may be used to support the PCB in the carrier prior to closing the carrier and/or while the carrier is closed.

As in the example of FIGS. 1 to 3, the first part may be configured to move towards the second part so as to sandwich a PCB contained in the carrier between the first and second parts, and thereby create an electrical connection between the PCB and one or more external electrical interfaces 963. In some implementations, the electrical connection is created at the time of contact between the first and second parts, and in other implementations, the electrical connection is created without physical contact between the first and second parts (e.g., pins may contact electrical contacts on the PCB without the first and second parts actually coming into physical contact). During final closing or initial opening of the carrier, the direction of motion of the first part and/or the second part, e.g., the direction of arrow 967, is substantially perpendicular to a surface 965 of PCB board 966. In this example, the word "substantially" typically encompasses a less than ten degree variation from perpendicular; however, this variation may differ in other implementations. Perpendicular motion of first (e.g., top) part 955 may be in the direction of arrow 967 (when the top part moves) and perpendicular motion of bottom part 956 may be in the direction of arrow 968 (when the bottom part moves). As noted above, the perpendicular motion to achieve electrical connection reduces the amount of friction on both carrier and PCB electrical contacts relative to non-perpendicular motion.

As in the example of FIGS. 1 to 3, when there is already vertical separation between the first part and the second part, first part 955 may pivot angularly relative to second part 956 in order to enable loading or unloading of carrier 950. For example, as is the case in the example of FIGS. 1 to 3, there may be a hinge (not shown in FIG. 36) connecting first part 955 and second part 956. The angular motion resulting from the hinged connection opens carrier 950 to expose area 970 for loading or unloading a PCB in carrier 950. Angular motion is only one example of the type of motion that may be used to separate the first and second parts and thereby expose area 9700; other types of vertical or non-vertical (e.g., non-perpendicular) motion may be used as well, examples of which include, but are not limited to, linear motion, rotational motion, extra-dimensional motion, and so forth.

In other implementations, first part 955 may be removed completely from second part 956 (e.g., lifted-off) to enable loading or unloading of the PCB in carrier 950. In other implementations, other methods and mechanisms may be used to open carrier 950 and thereby expose area 970 for loading/unloading a PCB.

In the example implementation of FIG. 36, the motion of first part and/or second part 956 is controlled using guides 960. Guides 960 may be posts, screws, or other mechanism that fit, and move, within corresponding holes on the first and/or second parts. The guides enable controlled motion between the first and second parts for proper opening and closing of the carrier. In the example of FIG. 36, guides 960 are fixed to first part 955 and move within a hole in second part 956; however, in other implementations, this need not be the case. For example, the guides may be fixed within the second part and move within the first part, some guides may be fixed in the first part and move in the second part and at the same time other guides may be fixed in the second part and move in the first part, and so forth. In some implementations, as shown in FIG. 36, the guides may be spring-loaded, e.g., each guide may have a corresponding spring 971 that is biased to hold carrier 950 open in the absence of applied vertical pressure, and that compresses in response to vertical pressure in the directions of arrows 967 and/or 968, as described below, in order to enable closing of the carrier.

As shown in FIG. 36, first part 955 has a beveled edge 953 that corresponds to the beveled edge 974 of pack 952. Although second part 956 does not include a beveled edge in the example of FIG. 36, second part 956 may also include a beveled edge (e.g., to correspond to the beveled edge 953 of pack 952). In some implementations, beveled edges of the type shown are not included on either the carrier or the pack/slot. For example, the beveled edges may be replaced by smooth sloping edges or other features that facilitate closing of the carrier during insertion of the carrier. In some implementations, the carrier may be closed prior to insertion into the pack/slot, relieving the carrier of the need for any mechanism to facilitate closing the carrier during insertion into the pack slot.

In operation, carrier 950 is opened, either manually or automatically, and an area for holding a PCB is thereby exposed. The PCB is placed in that area, either manually or automatically. The carrier is then closed, either manually or automatically. For example, initial closure or final opening of the carrier may be performed as described above with respect to FIGS. 1 to 3 or according to any other appropriate method. Final closure of the carrier (e.g., when pins 958, or other electrical contacts on the carrier contact corresponding contacts on the PCB) is achieved by moving first part 955 and/or second part 956 in a direction that is substantially perpendicular to the face (top or bottom) of the PCB. By virtue of this motion, pins 958 on the carrier contact electrical contacts on PCB 966. The pins are connected to electrical pathways (e.g., wires or traces) on or off of the carrier, which terminate at electrical connection (e.g., connector 961). This electrical connection mates to a corresponding electrical connection (e.g., connector 963) in the pack/slot. As above, there may be a single connector for both the first and second parts, or there may be different connectors for the first and second parts.

In some implementations, such as that shown in FIG. 36, the carrier is closed as it is inserted into the pack or slot. In the example of FIG. 36, carrier 950 is inserted in the direction of arrow 975. This motion, coupled with beveled edges 953, result in a downward (direction of arrow 967) force component that pushes first part 955 downwards in the direction of PCB 966. In response to force in the direction of arrow 975, beveled edge 963 of pack 952 slides against beveled edge 974 of carrier 950, forcing first part 955 further towards PCB 966. This eventually results in pins 958 on the top part contacting electrical contacts on PCB 966, thereby creating an electrical circuit that includes the electrical contacts, the pins, an electrical pathway to connector 961, and connector 961. Eventually, connector 961 mates to corresponding connector 963 in pack 952, when carrier 950 is fully inside pack 952.

In some implementations, only the top part and/of the bottom part is movable, with the other part remaining stationary during closing. In other implementations, both the top part and the bottom part are movable during closing. Furthermore, electrical connections may be made via pins and contacts on the top of the PCB and/or via pins and contacts on the bottom of the PCB, as also described above.

In some implementations, the carrier may be hinged, but this movement does not cause electrical connection. For example, the carrier may be vacuum operated, and the connection of pins to electrical contacts on the PCB board may be achieved using vacuum and perpendicular motion. Other, non-vacuum carriers may use a press down unit (PDU) to force the pins to contact the PCB at a normal angle.

In some implementations, there may be no electrical contacts on either the top part or the bottom part, resulting in electrical connections being made solely through the part containing the electrical connections.

The implementations described herein show the carrier inserted horizontally into the slots or packs. That is, in the examples, the carrier is inserted such that the PCB is oriented horizontally in the slot or pack. In other implementations, the carrier may be inserted into the slots such that the PCB (and also the carrier) is oriented vertically in a slot or pack. In some implementations, the slots or packs may be arranged so as to accommodate both horizontal and vertical insertion.

While this specification describes example implementations related to "testing" and a "test system," the systems described herein are equally applicable to implementations directed towards burn-in, manufacturing, incubation, or storage, or any implementation which would benefit from asynchronous processing, temperature control, and the other features described herein.

Testing performed by the example test system described herein, which includes controlling (e.g., coordinating movement of) various automated elements to operate in the manner described herein or otherwise, may be implemented using hardware or a combination of hardware and software. For example, a test system like the ones described herein may include various controllers and/or processing devices located at various points in the system to control operation of the automated elements. A central computer (not shown) may coordinate operation among the various controllers or processing devices. The central computer, controllers, and processing devices may execute various software routines to effect control and coordination of the various automated elements.

In this regard, testing of PCBs and other types of EAs in a system of the type described herein may be controlled by a computer, e.g., by sending signals to and from one or more connections to each test slot. The testing can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing can be performed by one or more programmable processors executing one or more computer programs to perform the functions described herein. All or part of the testing can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass PCBs for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Although the example test systems described herein are used to test PCBs, the example test systems may be used to test any type of device.

Any "electrical connection" as used herein may imply a direct physical connection or a connection that includes intervening components but that nevertheless allows electrical signals to flow between connected components. Any "connection" involving electrical circuitry mentioned herein, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A system for testing electronic assemblies (EAs) comprising:
    carriers for holding EAs; and
    slots for testing at least some of the EAs in parallel, each slot being configured to receive a corresponding carrier containing an EA and to test the EA;
    wherein a carrier comprises a first part and a second part, at least one of the first part or the second part comprising a first structure;
    wherein the first structure is movable to enable electrical connection between the EA and an electrical interface; and
    wherein the first part is configured to move towards the second part to enclose the EA in the carrier and to cause the electrical connection between the EA and the electrical interface through the first structure, wherein motion of the first part towards the second part comprises a first motion in which the first part moves angularly relative to a surface of the EA until the first part is substantially parallel to the second part and separated from the second part, and a second motion in which the first part moves towards the EA in a direction that is substantially perpendicular to a surface of the EA.

2. The system of claim 1, wherein at least one of the first part or the second part comprises a second structure, and
    wherein the second structure is moveable to enable electrical connection between the EA and a second electrical interface.

3. The system of claim 1, wherein the first part comprises a frame that is connected to a hinge, the first motion being a pivot about the hinge.

4. The system of claim 1, further comprising:
    guides between the first part and the second part;
    wherein, in a first position, the guides separate the first part from the second part so that the first part and the second part are substantially parallel to each other; and
    wherein, in a second position, the guides are moved within at least one of the first part or the second part so that the first part and the second part move closer together.

5. The system of claim 1, wherein the EA has localized heat sources; and
    wherein at least one of the first part or the second part comprises:
        thermally-conductive objects at locations corresponding to the localized heat sources, the thermally-conductive objects to conduct, convect, or radiate heat from the localized heat sources.

6. The system of claim 5, wherein the thermally-conductive objects comprise pins that are thermally conductive and that are arranged at a location of the first structure or a second structure that corresponds to a location of the localized heat sources.

7. The system of claim 5, wherein the thermally-conductive objects comprise fins that are thermally conductive and that are arranged at a location of the first structure or a second structure that corresponds to a location of the localized heat sources.

8. The system of claim 1, wherein the carrier comprises circuitry configured to emulate a power source that is usable in a product for which the EA is intended.

9. The system of claim 1, wherein each carrier comprises one or more air pathways, through which air is able to flow through the carrier; and
    wherein each slot comprises an air mover for blowing air through the slot and through air pathways in a carrier in the slot.

10. The system of claim 9, wherein the air is below 25° C.

11. The system of claim 9, wherein the air is above 25° C.

12. The system of claim 1, wherein the first structure comprises:
    first pins that can pass through the first structure; and
    a third structure comprising circuit traces, the first pins for effecting electrical connection between the EA and the circuit traces on the third structure.

13. The system of claim 12, wherein the first part comprises the first structure and the second part comprises a second structure,
    wherein the second structure is moveable to enable electrical connection with an electrical interface; and
    wherein the second part comprises:
        second pins that can pass through the second structure; and
        a fourth structure comprising circuit traces, the second pins for effecting electrical connection between the EA and the circuit traces on the fourth structure.

14. The system of claim 1, wherein the system comprises a heat source for providing heat to an interior of the carrier.

15. The system of claim 1, further comprising:
    radio frequency (RF) shielding for each carrier.

16. The system of claim 1, further comprising:
    automation to move the carriers into, and out of, the slots during a testing process.

17. The system of claim 16, wherein the automation comprises:
    a device transporter to move carriers between a shuttle and slots;
    a feeder to provide carriers containing untested EAs and to receive carriers containing tested EAs; and
    the shuttle to receive a carrier containing an untested EA from the feeder and to provide the carrier containing the untested EA to the device transporter, and to receive a carrier containing a tested EA from the device transporter and to provide the carrier containing the tested EA to the feeder.

18. The system of claim 1, wherein at least some of the slots comprise a pack for receiving corresponding carriers, a carrier and a pack each having beveled edges that are configured to interact to force motion of the first structure.

19. The system of claim 1, wherein the carrier comprises:
a first interior region that includes the EA;
a second interior region;
RF shielding material between the first interior region and the second interior region;
an antenna for communicating with an RF test system; and
RF control circuitry, which is communicatively coupled to the EA and the antenna, to enable wireless RF testing of the EA.

20. The system of claim 1, wherein the carrier comprises a cable having RF shielding that is in electrical communication with the EA for wired RF testing of the EA.

21. A method for use in a system comprising:
carriers for holding EAs; and
slots for testing at least some of the EAs in parallel, each slot being configured to receive a corresponding carrier containing an EA and to test the EA;
wherein a carrier comprises:
    a first part and a second part;
    wherein at least one of the first part or the second part is configured to enable electrical connection between an EA and an electrical interface;
wherein method comprises:
    moving the first part away from the second part, wherein moving the first part away from the second part comprises a first motion in which the first part moves away from the second part in a direction that is substantially perpendicular to a surface of the second part;
    moving the first part to expose an area for receiving an EA, wherein moving the first part to expose the area comprises a second motion in which the first part moves angularly relative to a surface of the second part;
    inserting an EA into the area; and
    moving the first part towards the second part so as to contact the EA and thereby enclose the EA in the carrier and cause an electrical connection between the EA and the electrical interface, wherein motion of the first part towards the second part comprises a third motion in which the first part moves angularly relative to a surface of the EA until the first part is substantially parallel to the second part and separated from the second part, and a fourth motion in which the first part moves towards the EA in a direction that is substantially perpendicular to the surface of the EA.

* * * * *